US010790258B2

(12) United States Patent
Matsubara et al.

(10) Patent No.: US 10,790,258 B2
(45) Date of Patent: Sep. 29, 2020

(54) ELECTRONIC DEVICE AND MOUNTING STRUCTURE OF THE SAME

(71) Applicant: ROHM CO., LTD., Kyoto-shi, Kyoto (JP)

(72) Inventors: Hiroaki Matsubara, Kyoto (JP); Yasumasa Kasuya, Kyoto (JP); Taro Nishioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/217,605

(22) Filed: Dec. 12, 2018

(65) Prior Publication Data

US 2019/0157236 A1    May 23, 2019

Related U.S. Application Data

(63) Continuation of application No. 15/905,324, filed on Feb. 26, 2018, now Pat. No. 10,192,845, which is a
(Continued)

(30) Foreign Application Priority Data

Jul. 7, 2014   (JP) .................................. 2014-139323
Jul. 7, 2014   (JP) .................................. 2014-139324
(Continued)

(51) Int. Cl.
*H01L 23/495*   (2006.01)
*H01L 23/00*    (2006.01)
(Continued)

(52) U.S. Cl.
CPC .......... *H01L 24/32* (2013.01); *H01L 23/3107* (2013.01); *H01L 23/49541* (2013.01);
(Continued)

(58) Field of Classification Search
CPC .......... H01L 23/3107; H01L 23/49548; H01L 24/49
(Continued)

(56) References Cited

U.S. PATENT DOCUMENTS 4,862,246 A * 8/1989 Masuda .............. H01L 21/4828
257/666
5,202,288 A * 4/1993 Doering .............. H01L 21/4875
257/E23.092
(Continued)

FOREIGN PATENT DOCUMENTS

JP   2003-188333 A   7/2003
JP   2004-104046 A   4/2004
(Continued)

OTHER PUBLICATIONS

Office Action received in corresponding Japanese Patent Application, dated Oct. 30, 2018 (5 pages) and machine translation.

*Primary Examiner* — Nitin Parekh
(74) *Attorney, Agent, or Firm* — Hamre, Schumann, Mueller & Larson, P.C.

(57) ABSTRACT

An electronic device includes an electronic element, a plurality of first sub-electrodes arrayed in a first direction, a plurality of second sub-electrodes arrayed in a second direction that is orthogonal to the first direction, a dummy electrode, and a sealing resin. The sealing resin has a resin back surface from which the plurality of first sub-electrodes, the plurality of second sub-electrodes and the dummy electrode are exposed. The plurality of second sub-electrodes are located further in the first direction than any of the plurality of first sub-electrodes. The plurality of first sub-electrodes are located further in the second direction than any of the plurality of second sub-electrodes. The dummy electrode is located further in the first direction than any of the plurality
(Continued)

of first sub-electrodes, and is located further in the second direction than any of the plurality of second sub-electrodes.

40 Claims, 48 Drawing Sheets

Related U.S. Application Data continuation of application No. 14/789,233, filed on Jul. 1, 2015, now Pat. No. 9,941,233.

(30) Foreign Application Priority Data

| Jul. 7, 2014 | (JP) | 2014-139325 |
|---|---|---|
| Mar. 27, 2015 | (JP) | 2015-065999 |

(51) Int. Cl.
*H01L 23/544* (2006.01)
*H01L 23/31* (2006.01)
*H01L 21/48* (2006.01)

(52) U.S. Cl.
CPC ...... *H01L 23/49548* (2013.01); *H01L 23/544* (2013.01); *H01L 23/564* (2013.01); *H01L 24/29* (2013.01); *H01L 24/49* (2013.01); *H01L 21/4828* (2013.01); *H01L 23/49575* (2013.01); *H01L 24/05* (2013.01); *H01L 24/06* (2013.01); *H01L 24/48* (2013.01); *H01L 2223/54486* (2013.01); *H01L 2224/04042* (2013.01); *H01L 2224/05554* (2013.01); *H01L 2224/05639* (2013.01); *H01L 2224/06155* (2013.01); *H01L 2224/2939* (2013.01); *H01L 2224/29139* (2013.01); *H01L 2224/29239* (2013.01); *H01L 2224/29294* (2013.01); *H01L 2224/29339* (2013.01); *H01L 2224/29387* (2013.01); *H01L 2224/29499* (2013.01); *H01L 2224/32013* (2013.01); *H01L 2224/32105* (2013.01); *H01L 2224/32106* (2013.01); *H01L 2224/32245* (2013.01); *H01L 2224/45015* (2013.01); *H01L 2224/48091* (2013.01); *H01L 2224/48137* (2013.01); *H01L 2224/48247* (2013.01); *H01L 2224/49113* (2013.01); *H01L 2224/49171* (2013.01); *H01L 2224/73265* (2013.01); *H01L 2224/83439* (2013.01); *H01L 2224/85439* (2013.01); *H01L 2924/00014* (2013.01); *H01L 2924/01047* (2013.01); *H01L 2924/05442* (2013.01); *H01L 2924/181* (2013.01); *H01L 2924/3512* (2013.01); *H01L 2924/35121* (2013.01)

(58) Field of Classification Search
USPC ........................................... 257/666
See application file for complete search history.

(56) References Cited

U.S. PATENT DOCUMENTS

| 6,025,640 | A | * | 2/2000 | Yagi | H01L 21/4828 |
| | | | | | 257/666 |
| 6,054,337 | A | | 4/2000 | Solberg | |
| 6,225,701 | B1 | | 5/2001 | Hori et al. | |
| 6,340,846 | B1 | | 1/2002 | Lobianco et al. | |
| 6,388,311 | B1 | * | 5/2002 | Nakashima | H01L 23/49503 |
| | | | | | 257/666 |
| 6,400,004 | B1 | * | 6/2002 | Fan | H01L 23/3107 |
| | | | | | 257/666 |
| 6,713,849 | B2 | * | 3/2004 | Hasebe | H01L 23/49 |
| | | | | | 257/667 |
| 6,867,071 | B1 | | 3/2005 | Lee et al. | |
| 7,116,002 | B2 | | 10/2006 | Chao et al. | |
| 8,436,451 | B2 | | 5/2013 | Yamashita | |
| 8,472,196 | B2 | | 6/2013 | Zeng et al. | |
| 8,841,776 | B2 | | 9/2014 | Nishimura et al. | |
| 9,000,570 | B2 | | 4/2015 | Chan et al. | |
| 2004/0124506 | A1 | | 7/2004 | Ito et al. | |
| 2006/0065421 | A1 | | 3/2006 | Arai et al. | |
| 2010/0084756 | A1 | | 4/2010 | Dirks et al. | |
| 2010/0290202 | A1 | | 11/2010 | Sasaki et al. | |
| 2011/0111562 | A1 | * | 5/2011 | San Antonio | H01L 24/12 |
| | | | | | 438/113 |
| 2011/0140250 | A1 | | 6/2011 | Lee | |
| 2012/0007195 | A1 | | 1/2012 | Zhao | |
| 2012/0009737 | A1 | * | 1/2012 | Kuratomi | H01L 21/561 |
| | | | | | 438/112 |
| 2012/0091571 | A1 | | 4/2012 | Koga et al. | |
| 2012/0153444 | A1 | | 6/2012 | Haga et al. | |
| 2013/0256857 | A1 | | 10/2013 | Gruber et al. | |
| 2013/0264710 | A1 | * | 10/2013 | Osugi | H01L 21/565 |
| | | | | | 257/741 |
| 2014/0091571 | A1 | | 4/2014 | Hashimoto et al. | |
| 2014/0124912 | A1 | * | 5/2014 | Kaneda | H01L 24/49 |
| | | | | | 257/676 |
| 2015/0144991 | A1 | | 5/2015 | Ha | |
| 2015/0200181 | A1 | | 7/2015 | Haga et al. | |
| 2015/0371921 | A1 | | 12/2015 | Tanaka | |
| 2016/0254214 | A1 | * | 9/2016 | Makino | H01L 24/97 |
| | | | | | 257/676 |
| 2016/0293561 | A1 | | 10/2016 | Kadoguchi et al. | |
| 2017/0011986 | A1 | | 1/2017 | Mochizuki et al. | |

FOREIGN PATENT DOCUMENTS

| JP | 2006-179760 A | 7/2006 |
| JP | 2007-201324 A | 8/2007 |
| JP | 2008-288304 A | 11/2008 |
| JP | 2012-164799 A | 8/2012 |
| JP | 2013-145825 A | 7/2013 |
| JP | 2013-239740 A | 11/2013 |

* cited by examiner

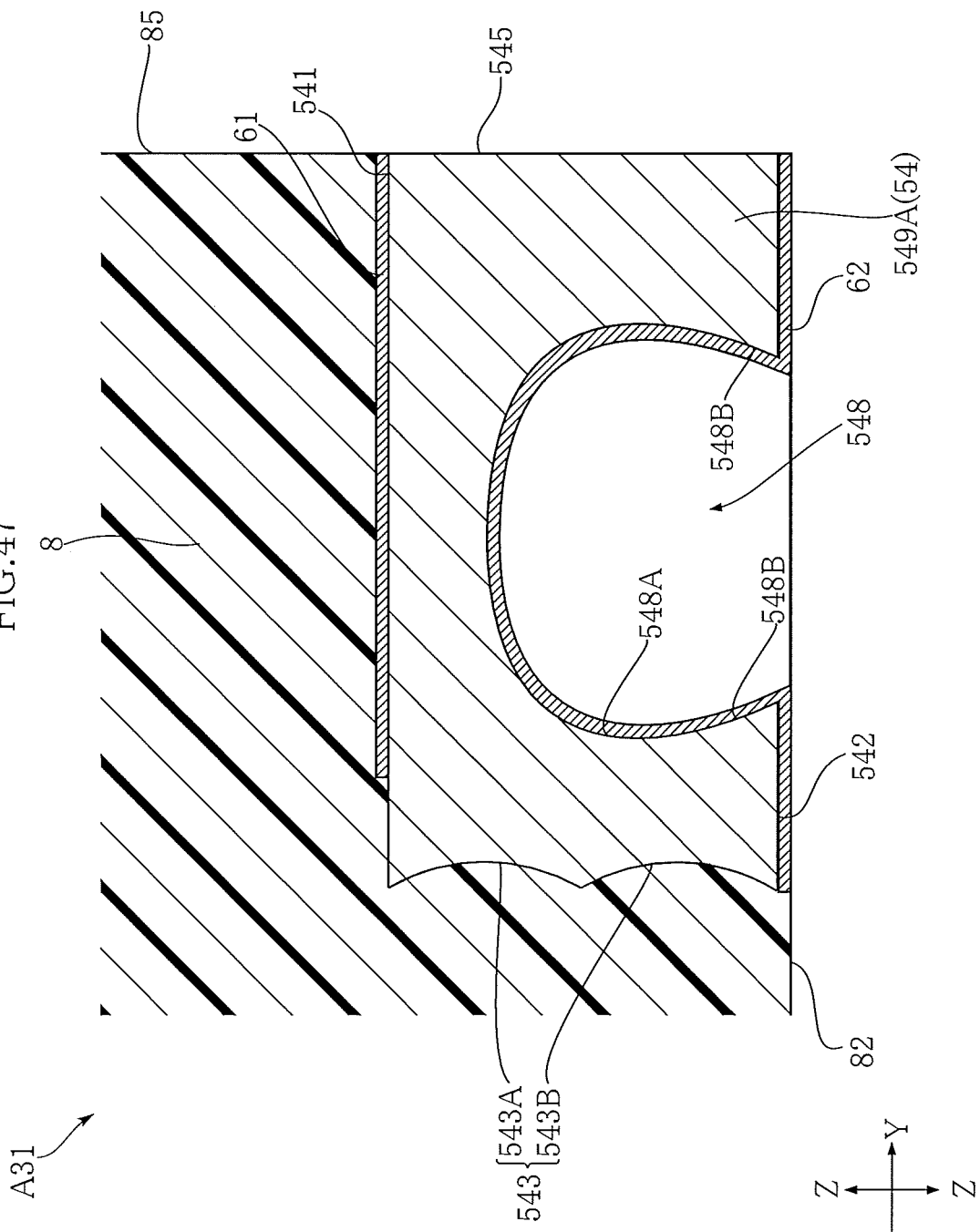

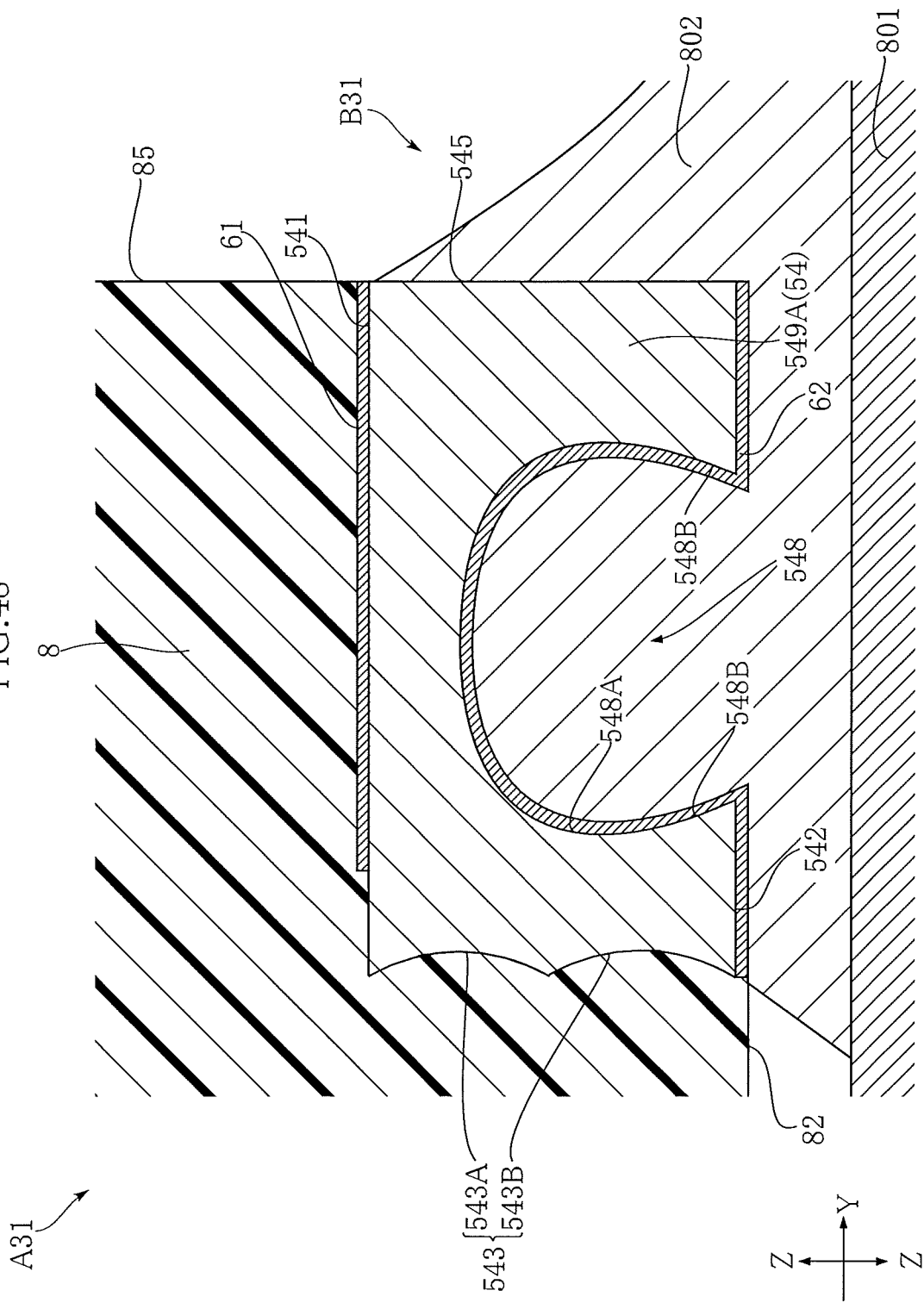

ELECTRONIC DEVICE AND MOUNTING STRUCTURE OF THE SAME

BACKGROUND OF THE INVENTION

1. Field of the Invention

The present invention relates to an electronic device and a mounting structure of the same.

2. Description of Related Art

Conventionally, various semiconductor devices are known. For example, a semiconductor device disclosed in JP-A-2013-239740 is provided with a semiconductor chip, a die pad, a plurality of leads, and a sealing resin. The semiconductor chip is disposed on the die pad. The sealing resin covers the semiconductor chip, the die pad, and the plurality of leads. This semiconductor device is mounted to a circuit board via solder.

When the above conventional semiconductor device is in use, the constituent elements in the semiconductor device expand or contract with heat. Repeating such expansion/contraction gives rise to the possibility of cracks occurring in the solder joining the leads or in the sealing resin.

Another conventional semiconductor device has an insulating joining part interposed between the semiconductor chip and the die pad. When manufacturing such a product, the semiconductor chip inclines unreasonably relative to the die pad, giving rise to the possibility of an electrical connection unintentionally being established between the semiconductor chip and the die pad.

SUMMARY OF THE INVENTION

The present invention has been proposed under the foregoing circumstances, and has an object to provide an electronic device that is able to prevent cracks from occurring in a solder layer.

Also, the present invention has an object to provide an electronic device that, even if a crack does occur in the sealing resin, is able to prevent the crack from being exposed to the outside of the sealing resin.

Also, the present invention has an object to provide an electronic device that is able to prevent an electronic element from becoming electrically connected to a main electrode.

An electronic device that is provided according to a first aspect of the present invention includes an electronic element, a plurality of first sub-electrodes arrayed in a first direction, a plurality of second sub-electrodes arrayed in a second direction that is orthogonal to the first direction, a dummy electrode, and a sealing resin covering the electronic element, the plurality of first sub-electrodes, the plurality of second sub-electrodes and the dummy electrode. The sealing resin has a resin back surface from which the plurality of first sub-electrodes, the plurality of second sub-electrodes and the dummy electrode are exposed. The plurality of second sub-electrodes are located further in the first direction than any of the plurality of first sub-electrodes. The plurality of first sub-electrodes are located further in the second direction than any of the plurality of second sub-electrodes. The dummy electrode is located further in the first direction than any of the plurality of first sub-electrodes, and is located further in the second direction than any of the plurality of second sub-electrodes.

Preferably, the dummy electrode is insulated from all of the plurality of first sub-electrodes and the plurality of second sub-electrodes.

Preferably, the sealing resin has a resin lateral surface that stands erect from the resin back surface, and the dummy electrode, the plurality of first sub-electrodes and the plurality of second sub-electrodes are all exposed from the resin lateral surface.

Preferably, the dummy electrode is exposed from the resin lateral surface and has a dummy electrode first outer surface facing in the second direction, and the dummy electrode first outer surface is flush with a region, of the resin lateral surface, facing in the second direction.

Preferably, the dummy electrode is exposed from the resin lateral surface and has a dummy electrode second outer surface facing in the first direction, and the dummy electrode second outer surface is flush with a region, of the resin lateral surface, facing in the first direction.

Preferably, a linear mark is respectively formed on the dummy electrode first outer surface, the dummy electrode second outer surface, and the resin lateral surface.

Preferably, the dummy electrode has an erect sloping surface, the erect sloping surface stands erect from the dummy electrode back surface and slopes relative to the dummy electrode first outer surface and the dummy electrode second outer surface, the erect sloping surface faces outside the sealing resin as seen in a thickness direction of the electronic element, and the sealing resin has a resin corner part covering the erect sloping surface.

Preferably, the resin corner part constitutes part of the resin back surface, the resin corner part has a first lateral surface that is flush with the dummy electrode first outer surface and a second lateral surface that is flush with the dummy electrode second outer surface, and the first lateral surface and the second lateral surface constitute part of the resin lateral surface.

Preferably, the resin corner part has a corner edge extending in the thickness direction of the electronic element, and the first lateral surface and the second lateral surface are connected to each other via the corner edge and are orthogonal to each other.

Preferably, the dummy electrode has a dummy electrode back surface exposed from the sealing resin.

Preferably, the dummy electrode back surface is flat.

Preferably, the dummy electrode has a dummy electrode lateral surface that stands erect from the dummy electrode back surface, the dummy electrode lateral surface is covered by the sealing resin, and the dummy electrode lateral surface is located on the electronic element side of the dummy electrode.

Preferably, the dummy electrode lateral surface has an upper portion and a lower portion, and the upper portion of the dummy electrode lateral surface and the lower portion of the dummy electrode lateral surface each have a recessed shape that is recessed toward the center of the dummy electrode.

Preferably, the value of surface roughness of the dummy electrode lateral surface is greater than the value of surface roughness on the dummy electrode back surface.

Preferably, the surface area per unit area of the dummy electrode lateral surface is 1.5 to 2.5 times the surface area per unit area of the dummy electrode back surface.

Preferably, the dummy electrode has a dummy electrode front surface facing in the opposite direction to the dummy electrode back surface, and the dummy electrode front surface is entirely covered by the sealing resin.

Preferably, a dummy electrode recessed part that is recessed from the dummy electrode back surface is formed in the dummy electrode.

Preferably, the depth of the dummy electrode recessed part is ⅓ to ⅔ of a size of the dummy electrode in the thickness direction of the electronic element.

Preferably, the area of an opening of the dummy electrode recessed part in the dummy electrode back surface is ⅓ to ¾ of the area of the dummy electrode back surface.

Preferably, the outline of the opening of the dummy electrode recessed part has a shape that fits inside the outer edge of the dummy electrode back surface.

Preferably, the dummy electrode recessed part is open in the first direction and the second direction.

Preferably, the inner surface of the dummy electrode recessed part has a tip region that is connected to the dummy electrode back surface, and the tip region of the inner surface of the dummy electrode recessed part slopes in the thickness direction of the electronic element, such that the area of a cross-section along a plane that is orthogonal to the thickness direction of the electronic element gradually increases as the distance from the dummy electrode back surface increases.

Preferably, the dummy electrode, the plurality of first sub-electrodes and the plurality of second sub-electrodes are all made of the same material.

Preferably, the dummy electrode, the plurality of first sub-electrodes and the plurality of second sub-electrodes are all made of Cu.

Preferably, the electronic device is further provided with a back surface plating layer, and the back surface plating layer has a region formed on the dummy electrode back surface.

Preferably, the back surface plating layer is formed on the inner surface of the dummy electrode recessed part.

Preferably, the back surface plating layer is made of Sn.

Preferably, the electronic device is further provided with a front surface plating layer, and the front surface plating layer has a region formed on the dummy electrode front surface.

Preferably, the front surface plating layer is made of Ag.

Preferably, the plurality of first sub-electrodes are each exposed from the resin lateral surface and have a first sub-electrode outer surface facing in the second direction, and the first sub-electrode outer surface is flush with a region, of the resin lateral surface, facing in the second direction.

Preferably, a linear mark is formed on the first sub-electrode outer surface.

Preferably, the plurality of first sub-electrodes each have a first sub-electrode back surface that is exposed from the sealing resin.

Preferably, the first sub-electrode back surface is flat.

Preferably, the plurality of first sub-electrodes each have a first sub-electrode lateral surface that stands erect from the first sub-electrode back surface, the first sub-electrode lateral surface is covered by the sealing resin, and the first sub-electrode lateral surface connects an end part of the first sub-electrode outer surface in the first direction to an end part of the first sub-electrode outer surface on the opposite side to the first direction.

Preferably, the first sub-electrode lateral surface has a sub-upper portion and a sub-lower portion, and the sub-upper portion of the first sub-electrode lateral surface and the sub-lower portion of the first sub-electrode lateral surface each have a recessed shape that is recessed toward the center of the first sub-electrode.

Preferably, the value of surface roughness of the first sub-electrode lateral surface is greater than the value of surface roughness of the first sub-electrode back surface.

Preferably, the surface area per unit area of the first sub-electrode lateral surface is 1.5 to 2.5 times the surface area per unit area of the first sub-electrode back surface.

Preferably, the plurality of first sub-electrodes each have a first sub-electrode front surface facing in the opposite direction to the first sub-electrode back surface, and the first sub-electrode front surface is covered by the sealing resin.

Preferably, a first sub-electrode recessed part that is recessed from the first sub-electrode back surface is formed in each of the plurality of first sub-electrodes.

Preferably, the outline of the opening of the first sub-electrode recessed part has a shape that fits inside the outer edge of the plurality of first sub-electrode back surfaces.

Preferably, the inner surface of the first sub-electrode recessed part has a tip region that is connected to the first sub-electrode back surface, and the tip region of the inner surface of the first sub-electrode recessed part slopes in the thickness direction of the electronic element, such that the area of a cross-section along a plane that is orthogonal to the thickness direction of the electronic element gradually increases as the distance from the first sub-electrode back surface increases.

Preferably, the electronic device is further provided with a back surface plating layer, and the back surface plating layer has a region formed on the first sub-electrode back surface.

Preferably, the back surface plating layer is formed on the inner surface of the first sub-electrode recessed part.

Preferably, the electronic device is further provided with a front surface plating layer, and the front surface plating layer has a region formed on the first sub-electrode front surface.

Preferably, the electronic device is further provided with a main electrode on which the electronic element is disposed.

Preferably, the electronic device is further provided with an extended part extending outside the main electrode from the main electrode, as seen in the thickness direction, the extended part is coupled to the main electrode and the dummy electrode, and the thickness of the extended part is less than the main electrode and the dummy electrode.

Preferably, when the extended part is viewed from the main electrode, the extended part is entirely surrounded by the sealing resin.

Preferably, the extended part extends toward the dummy electrode from the main electrode, in a direction intersecting both the first direction and the second direction.

Preferably, the dummy electrode has a dummy electrode main back surface and a dummy electrode sub-back surface that are exposed from the sealing resin, and, on the resin back surface, the dummy electrode main back surface and the dummy electrode sub-back surface are exposed in a state of being spaced from each other.

Preferably, the dummy electrode main back surface and the dummy electrode sub-back surface are flat.

Preferably, the dummy electrode has a dummy electrode front surface facing in the opposite direction to the dummy electrode main back surface and the dummy electrode sub-back surface, and the dummy electrode front surface is entirely covered by the sealing resin.

Preferably, the sealing resin has a resin lateral surface that stands erect from the resin back surface, and the dummy electrode is exposed from the resin lateral surface.

Preferably, the dummy electrode has a dummy electrode first outer surface facing in the second direction, a dummy electrode second outer surface facing in the first direction and an erect sloping surface that stands erect from the dummy electrode main back surface, the dummy electrode first outer surface and the dummy electrode second outer surface are both exposed from the resin lateral surface, the erect sloping surface slopes relative to the dummy electrode first outer surface and the dummy electrode second outer surface, and faces outside the sealing resin, as seen in the thickness direction of the electronic element, and the sealing resin has a resin corner part covering the erect sloping surface.

Preferably, the electronic device is further provided with a back surface plating layer, and the back surface plating layer has a region formed on the dummy electrode main back surface and the dummy electrode sub-back surface.

Preferably, the dummy electrode sub-back surface includes a dummy electrode first sub-back surface that is located in the first direction and a dummy electrode second sub-back surface that is located in the second direction.

Preferably, the electronic device is further provided with an independent dummy electrode that has an independent dummy electrode back surface exposed from the resin back surface and is not connected to the dummy electrode, and the independent dummy electrode is insulated from all of the plurality of first sub-electrodes, the plurality of second sub-electrodes and the dummy electrode.

Preferably, the independent dummy electrode back surface is flat.

Preferably, the independent dummy electrode has an independent dummy electrode front surface facing in the opposite direction to the independent dummy electrode back surface, and the independent dummy electrode front surface is entirely covered by the sealing resin.

Preferably, an independent dummy electrode recessed part that is recessed from the independent dummy electrode back surface is formed in the independent dummy electrode.

Preferably, the outline of the opening of the independent dummy electrode recessed part has a shape that fits inside the outer edge of the dummy electrode back surface.

Preferably, the inner surface of the independent dummy electrode recessed part has a tip region that is connected to the independent dummy electrode back surface, and the tip region of the inner surface slopes in the thickness direction of the electronic element, such that the area of a cross-section along a plane that is orthogonal to the thickness direction of the electronic element gradually increases as the distance from the independent dummy electrode back surface increases.

Preferably, the back surface plating layer has a region formed on the independent dummy electrode back surface.

Preferably, the back surface plating layer is formed on the inner surface of the independent dummy electrode recessed part.

Preferably, the independent dummy electrode includes a first independent dummy electrode that is disposed in the first direction and is located between the plurality of first sub-electrodes and the dummy electrode, and a second independent dummy electrode that is disposed in the second direction and is located between the plurality of second sub-electrodes and the dummy electrode.

Preferably, the first independent dummy electrode and the second independent dummy electrode are both exposed from the resin lateral surface.

Preferably, the shape of the first independent dummy electrode and the shape of the first sub-electrodes are respectively the same as the shape of the second independent dummy electrode and the shape of the second sub-electrodes.

Preferably, the main electrode has a main electrode front surface on which the electronic element is disposed and a main electrode back surface facing in the opposite direction to the main electrode front surface, and the main electrode back surface is exposed from the sealing resin.

Preferably, the main electrode back surface is flat.

Preferably, the electronic device is further provided with a plurality of wires, the plurality of wires are each bonded to the electronic element, and the plurality of wires are each bonded to any of the plurality of first sub-electrodes or any of the plurality of second sub-electrodes.

Preferably, the electronic device is further provided with a joining layer interposed between the electronic element and the main electrode.

Preferably, the joining layer is made of a conductive material.

Preferably, the joining layer is made of Ag.

Preferably, the electronic device is further provided with an additional dummy electrode, and the additional dummy electrode is disposed on the opposite side to the dummy electrode with the plurality of first sub-electrodes sandwiched therebetween.

An electronic device that is provided according to a second aspect of the present invention includes an electronic element, a main electrode on which the electronic element is disposed, and a sealing resin covering the electronic element and the main electrode. The main electrode has a main electrode front surface on which the electronic element is disposed and a main electrode back surface facing in the opposite direction to the main electrode front surface. The main electrode back surface is exposed from the sealing resin, and the main electrode back surface has a region that protrudes outside of the main electrode front surface, as seen in the thickness direction of the electronic element.

Preferably, the main electrode back surface protrudes outside of the main electrode front surface, as seen in the thickness direction of the electronic element, around the entire periphery of the main electrode.

Preferably, the main electrode has a main electrode lateral surface connecting the main electrode front surface to the main electrode back surface, and the main electrode lateral surface has a recessed portion that is recessed toward the center of the main electrode.

Preferably, an end part on the main electrode back surface side of the recessed portion is located outside of the main electrode front surface, as seen in the thickness direction of the electronic element.

Preferably, the recessed portion has a region that is located more on the center side of the main electrode than is an end of the main electrode front surface, as seen in the thickness direction.

Preferably, the recessed portion is formed around the entire periphery of the main electrode.

Preferably, the value of surface roughness of the main electrode lateral surface is greater than the value of surface roughness of the main electrode back surface.

Preferably, the surface area per unit area of the main electrode lateral surface is 1.5 to 2.5 times the surface area per unit area of the main electrode back surface.

Preferably, the main electrode lateral surface includes a main upper portion and a main lower portion, and the main upper portion is located more on the main electrode front surface side than the main lower portion in the thickness direction.

Preferably, a crack extending in the thickness direction is formed in the sealing resin, the main electrode lateral surface is located more on the main electrode back surface side than an end of the crack on the main electrode back surface side, and the end of the crack on the main electrode back surface side contacts the main electrode lateral surface.

Preferably, the crack extends starting from the end of the main electrode front surface.

Preferably, the main upper portion has a recessed shape that is recessed toward the center of the main electrode.

Preferably, an end part on the main electrode back surface side of the main upper portion is located outside of the main electrode front surface, as seen in the thickness direction of the electronic element.

Preferably, the main lower portion slopes in the thickness direction, so as to form an acute angle with the main electrode back surface.

Preferably, a size of the main lower portion in the thickness direction is less than a size of the main upper portion in the thickness direction.

Preferably, the main electrode lateral surface includes a main intermediate portion, and the main intermediate portion is located between the main upper portion and the main lower portion, in the thickness direction, and the main intermediate portion has a recessed shape that is recessed toward the center of the main electrode.

Preferably, an end part on the main electrode back surface side of the main intermediate portion is located outside of the main electrode front surface, as seen in the thickness direction of the electronic element.

Preferably, the main upper portion slopes in the thickness direction, so as to form an acute angle with the main electrode front surface, and the main lower portion slopes in the thickness direction, so as to form an acute angle with the main electrode back surface.

Preferably, the main electrode back surface is flat.

Preferably, the area of the electronic element as seen in the thickness direction occupies 80 percent or more of the area of the main electrode surface.

Preferably, the electronic element is further provided with an extended part extending outside the main electrode from the main electrode, and the thickness of the extended part is less than the main electrode, as seen in the thickness direction.

Preferably, the extended part is entirely surrounded by the sealing resin, when the extended part is viewed from the main electrode.

Preferably, the electronic device is further provided with a back surface plating layer, and the back surface plating layer has a region formed on the main electrode back surface.

Preferably, the back surface plating layer is made of Sn.

Preferably, the electronic device is further provided with a front surface plating layer, and the front surface plating layer has a region formed on the main electrode front surface.

Preferably, the front surface plating layer is made of Ag.

Preferably, the electronic device is further provided with a plurality of first sub-electrode arrayed in the first direction and a plurality of second sub-electrodes arrayed in a second direction that is orthogonal to the first direction.

Preferably, the sealing resin has a resin lateral surface, the plurality of first sub-electrodes each have a first sub-electrode outer surface that is exposed from the resin lateral surface and faces in the second direction, and the first sub-electrode outer surface is flush with a region, of the resin lateral surface, facing in the second direction.

Preferably, a linear mark is formed on the first sub-electrode outer surface.

Preferably, the plurality of first sub-electrodes each have a first sub-electrode back surface that is exposed from the sealing resin.

Preferably, the first sub-electrode back surface is flat.

Preferably, the plurality of first sub-electrodes each have a first sub-electrode lateral surface that stands erect from the first sub-electrode back surface, the first sub-electrode lateral surface is covered by the sealing resin, and the first sub-electrode lateral surface connects an end part of the first sub-electrode outer surface in the first direction to an end part of the first sub-electrode outer surface on the opposite side to the first direction.

Preferably, the first sub-electrode lateral surface has a sub-upper portion and a sub-lower portion, and the sub-upper portion of the first sub-electrode lateral surface and the sub-lower portion of the first sub-electrode lateral surface each have a recessed shape that is recessed toward the center of the first sub-electrode.

Preferably, the plurality of first sub-electrodes each have a first sub-electrode front surface facing in the opposite direction to the first sub-electrode back surface, and the first sub-electrode front surface is covered by the sealing resin.

Preferably, the electronic device is further provided with a plurality of wires, the plurality of wires are each bonded to the electronic element, and the plurality of wires are each bonded to any of the plurality of first sub-electrodes or any of the plurality of second sub-electrodes.

Preferably, the electronic device is further provided with a joining layer interposed between the electronic element and the main electrode.

Preferably, the joining layer is made of a conductive material.

Preferably, the joining layer is made of Ag.

Preferably, the joining layer has a region that protrudes outside of the electronic element, as seen in the thickness direction.

An electronic device that is provided according to a third aspect of the present invention includes an electronic element, a main electrode on which the electronic element is disposed, an insulating joining part interposed between the electronic device and the main electrode, a plurality of insulating spacers mixed in the joining part, and a sealing resin covering the electronic element and the main electrode.

Preferably, the plurality of spacers each directly contact the electronic element.

Preferably, the plurality of spacers each directly contact the main electrode.

Preferably, the electronic device is further provided with a front surface plating layer, the front surface plating layer has a region formed on the main electrode, and the plurality of spacers each directly contact the front surface plating layer.

Preferably, the plurality of spacers all have a spherical shape.

Preferably, the diameter of each of the plurality of spacers is 5 to 15 µm.

Preferably, the plurality of spacers are made of a divinylbenzene polymer.

Preferably, the plurality of spacers are dispersed, as seen in the thickness direction of the electronic element.

Preferably, the plurality of spacers number ten or more.

Preferably, the electronic device is further provided with a plurality of insulating fillers that are mixed in the joining part.

Preferably, the volume of each of the plurality of fillers is less than the volume of each of the plurality of spacers.

Preferably, the plurality of fillers all have a spherical shape.

Preferably, the diameter of each of the plurality of fillers is 1 to 3 µm.

Preferably, the plurality of fillers are made of $SiO_2$, an organic material, or a mixed material of an organic material and a non-organic material.

Preferably, the plurality of fillers are dispersed, as seen in the thickness direction of the electronic element.

Preferably, the plurality of fillers number ten or more.

Preferably, a portion of the plurality of fillers are exposed from the joining part and contact the sealing resin.

Preferably, the main electrode has a main electrode front surface on which the electronic element is disposed and a main electrode back surface facing in the opposite direction to the main electrode front surface, and the main electrode back surface is exposed from the sealing resin.

Preferably, the electronic device is further provided with a second electronic element, where the electronic element is taken as a first electronic element, and the second electronic element is disposed on the main electrode.

Preferably, the electronic device is further provided with a joining layer interposed between the second electronic element and the main electrode.

Preferably, the joining layer is made of a conductive material.

Preferably, the joining layer is made of Ag.

Preferably, the electronic device further includes a plurality of first sub-electrodes arrayed in a first direction and a plurality of second sub-electrodes arrayed in a second direction that is orthogonal to the first direction.

Preferably, the sealing resin has a resin lateral surface, the plurality of first sub-electrodes are each exposed from the resin lateral surface and have a first sub-electrode outer surface facing in the second direction, and the first sub-electrode outer surface is flush with a region, of the resin lateral surface, facing in the second direction.

Preferably, a linear mark is formed on the first sub-electrode outer surface.

Preferably, the plurality of first sub-electrodes each have a first sub-electrode back surface that is exposed from the sealing resin.

Preferably, the first sub-electrode back surface is flat.

Preferably, the plurality of first sub-electrodes each have a first sub-electrode lateral surface that stands erect from the first sub-electrode back surface, the first sub-electrode lateral surface is covered by the sealing resin, and the first sub-electrode lateral surface connects an end part of the first sub-electrode outer surface in the first direction to an end part of the first sub-electrode outer surface on the opposite side to the first direction.

Preferably, the first sub-electrode lateral surface has a sub-upper portion and a sub-lower portion, and the sub-upper portion of the first sub-electrode lateral surface and the sub-lower portion of the first sub-electrode lateral surface each have a recessed shape that is recessed toward the center of the first sub-electrode.

Preferably, the plurality of first sub-electrodes each have a first sub-electrode front surface facing in the opposite direction to the first sub-electrode back surface, and the first sub-electrode front surface is covered by the sealing resin.

Preferably, the electronic device is further provided with a plurality of wires, any of the plurality of wires is bonded to the first electronic element or the second electronic element, and any of the plurality of wires is bonded to any of the plurality of first sub-electrodes or any of the plurality of second sub-electrodes.

A mounting structure provided according to a fourth aspect of the present invention includes the electronic device provided according to any of the first aspect to the third aspect of the present invention, a circuit board, and a solder layer interposed between the circuit board and the plurality of first sub-electrodes and between the circuit board and the plurality of second sub-electrodes.

Other features and advantages of the present invention will become apparent from the following detailed description with reference to the accompanying drawings.

BRIEF DESCRIPTION OF THE DRAWINGS

FIG. 47 is a partial cross-sectional view along a line XLVII-XLVII in FIG. 46.

FIG. 48 is a partial cross-sectional view of a mounting structure including the electronic device according to the first modification of the third embodiment (corresponds to FIG. 47).

DESCRIPTION OF THE PREFERRED EMBODIMENTS

Hereinafter, embodiments of the present invention will be specifically described with reference to the drawings.

First, a first embodiment will be described with reference to FIGS. 1 to 26.

Figure 1:
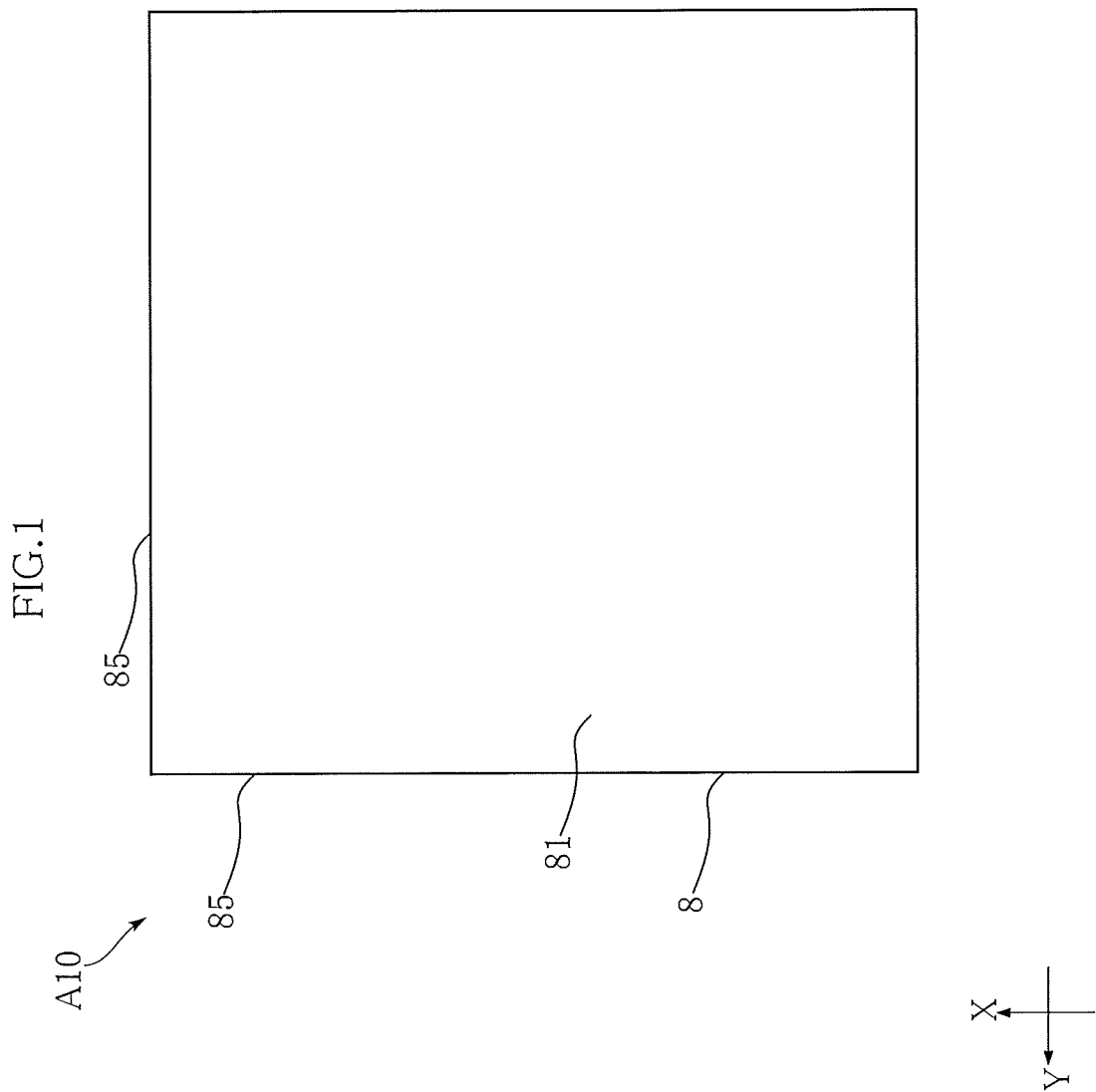
FIG. 1 is a plan view of an electronic device of a first embodiment.
Figure 2:
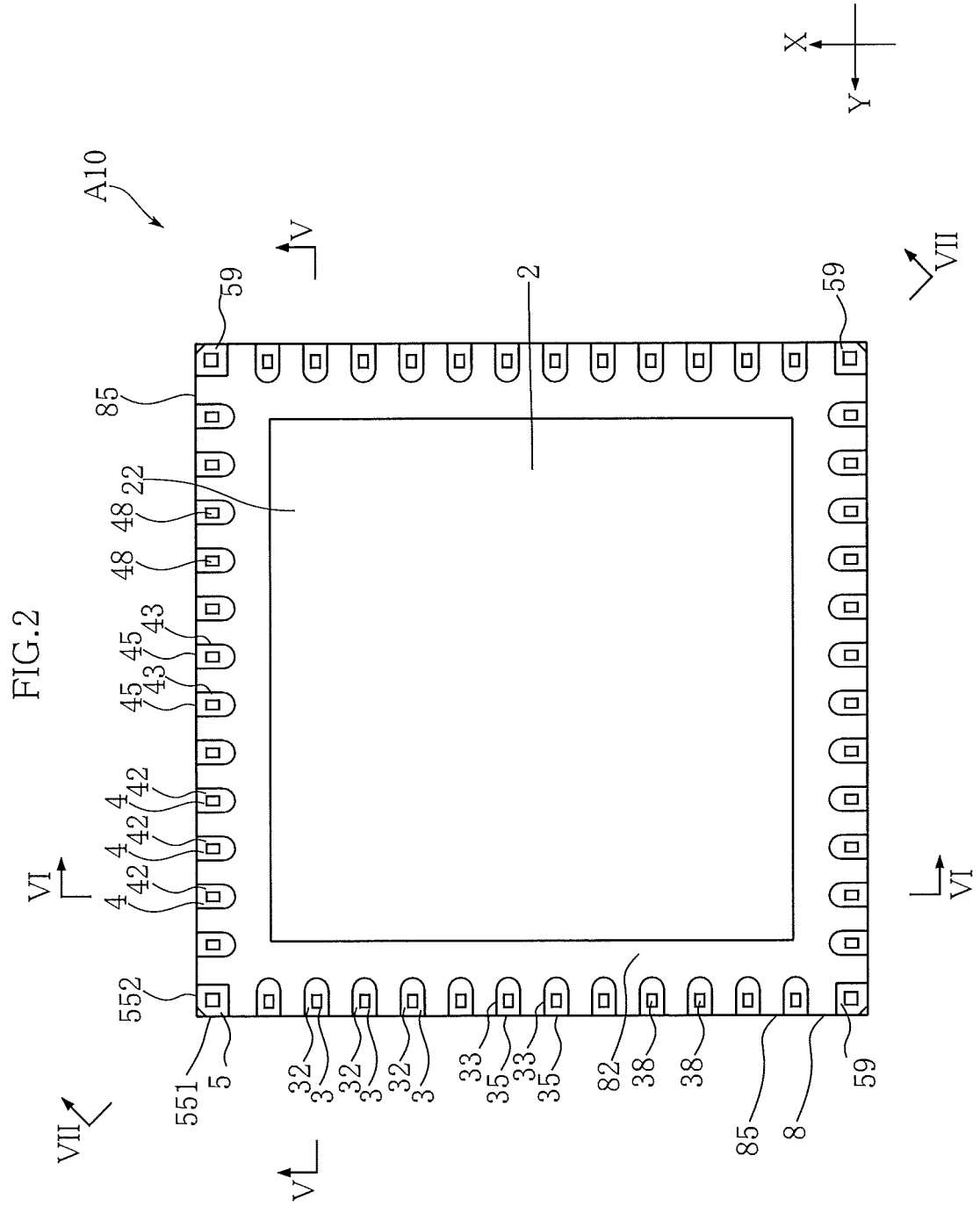
FIG. 2 is a bottom view of the electronic device shown in FIG. 1.
Figure 3:
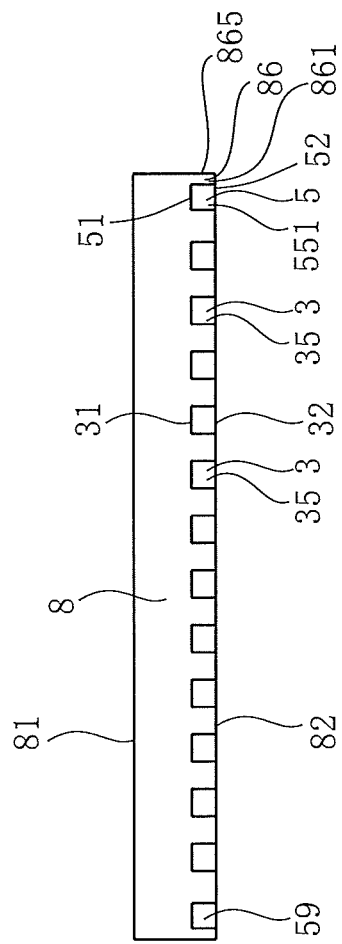
FIG. 3 is a right side view of the electronic device shown in FIG. 1.
Figure 4:
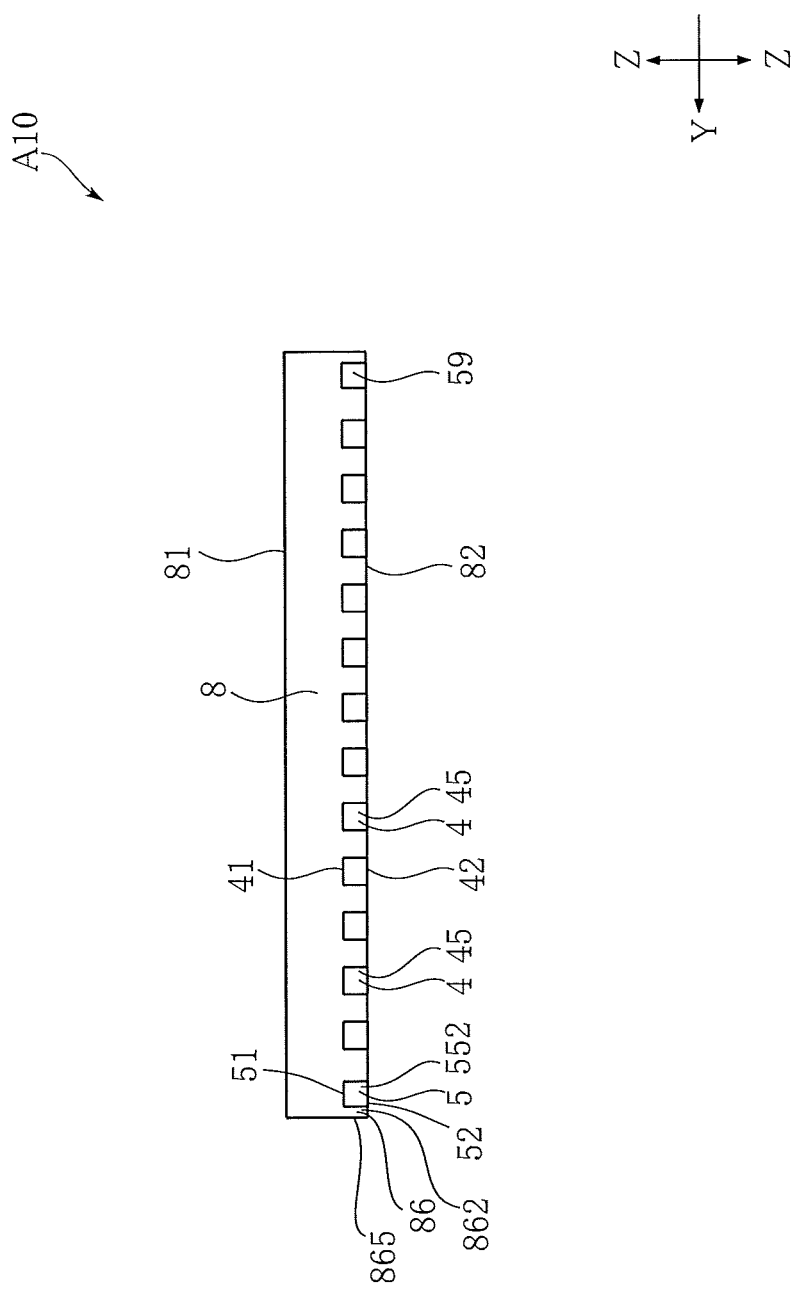
FIG. 4 is a rear view of the electronic device shown in FIG. 1.
Figure 5:
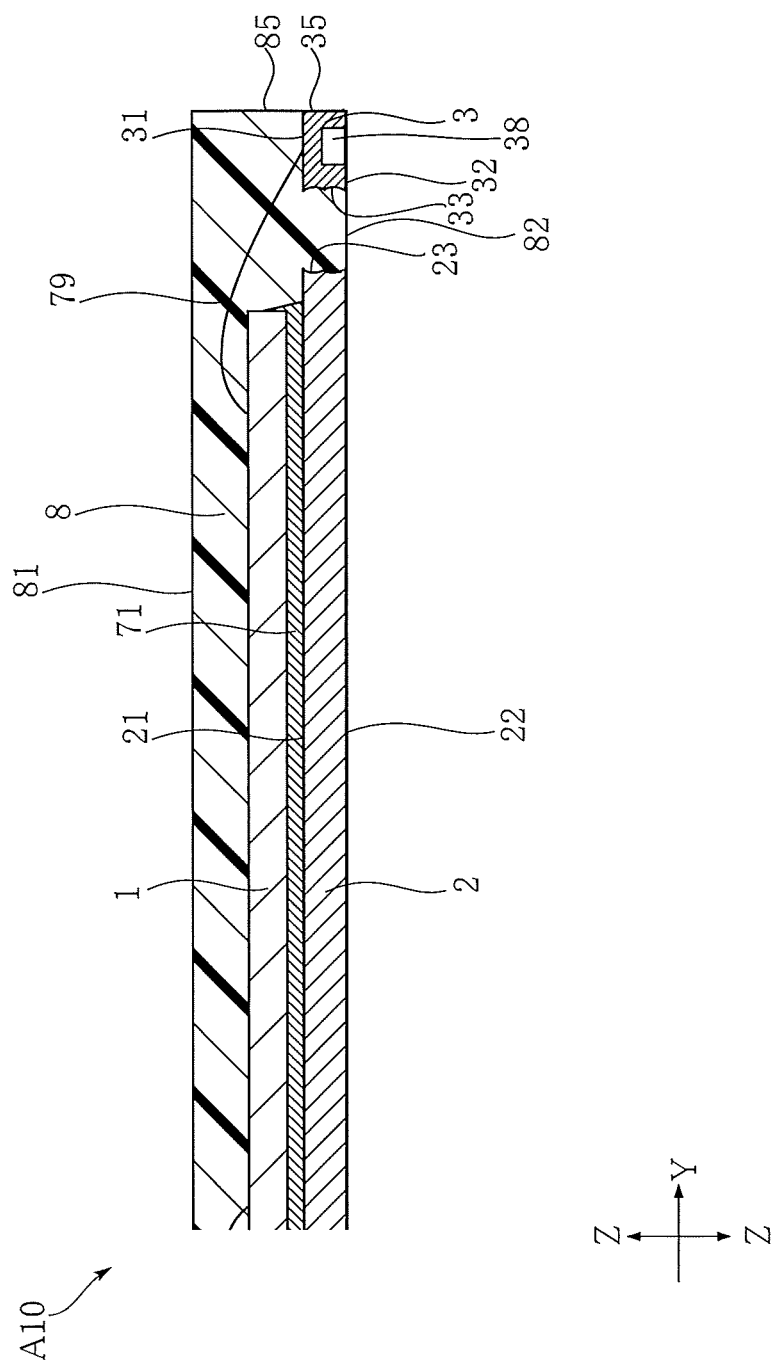
FIG. 5 is a partial cross-sectional view along a line V-V in FIG. 2.
Figure 6:
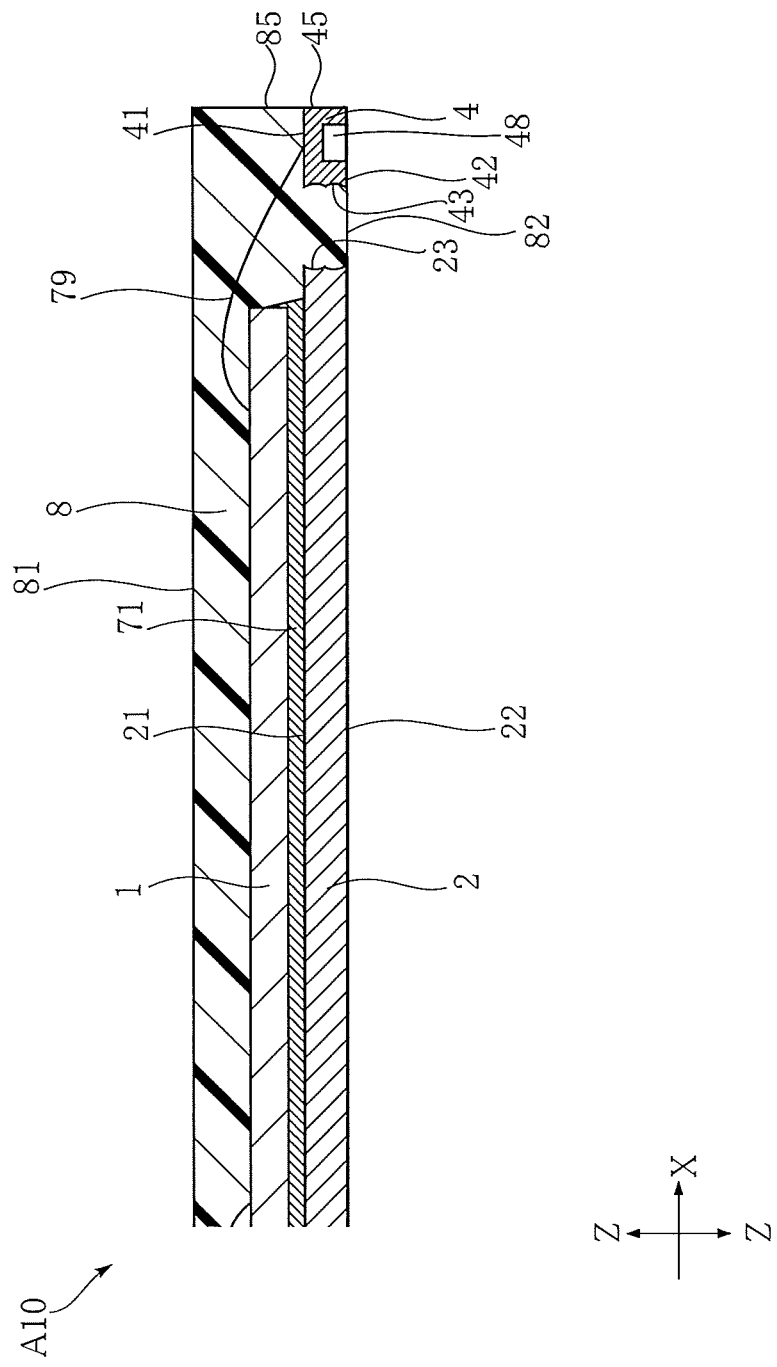
FIG. 6 is a partial cross-sectional view along a line VI-VI in FIG. 2.
Figure 7:
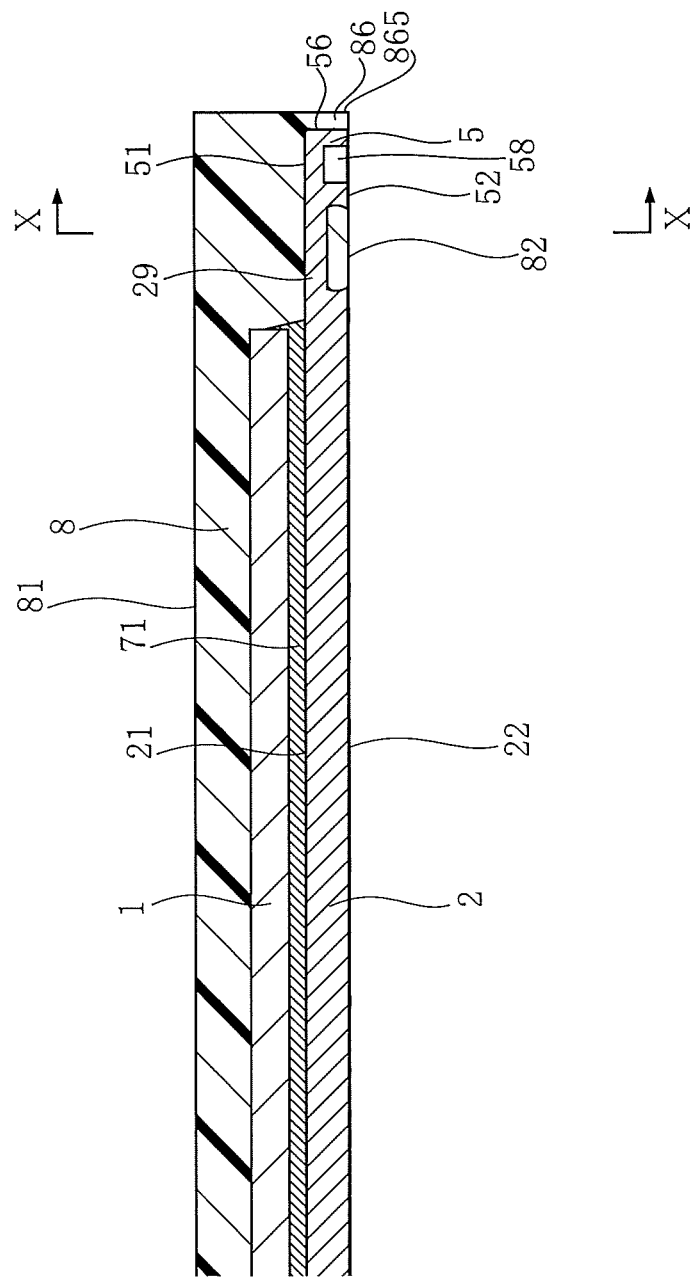
FIG. 7 is a partial cross-sectional view along a line VII-VII in FIG. 2.

FIG. 1 is a plan view of an electronic device A10 of the first embodiment. FIG. 2 is a bottom view of the electronic device A10. FIG. 3 is a right side view of the electronic device A10. FIG. 4 is a rear view of the electronic device A10. FIG. 5 is a partial cross-sectional view along a line V-V in FIG. 2. FIG. 6 is a partial cross-sectional view along a line VI-VI in FIG. 2. FIG. 7 is a partial cross-sectional view along a line VII-VII in FIG. 2.

The electronic device A10 shown in these figures is constituted as a surface-mountable electronic device. In the present embodiment, the electronic device A10 is a QFN (quad flat non-leaded package) type semiconductor device, and is produced by molded array packaging (MAP), for example.

The electronic device A10 is provided with an electronic element 1, a main electrode 2, a plurality of first sub-electrodes 3, a plurality of second sub-electrodes 4, a dummy electrode 5, a front surface plating layer 61, a back surface plating layer 62, a joining layer 71, a plurality of wires 79, and a sealing resin 8.

Figure 8:
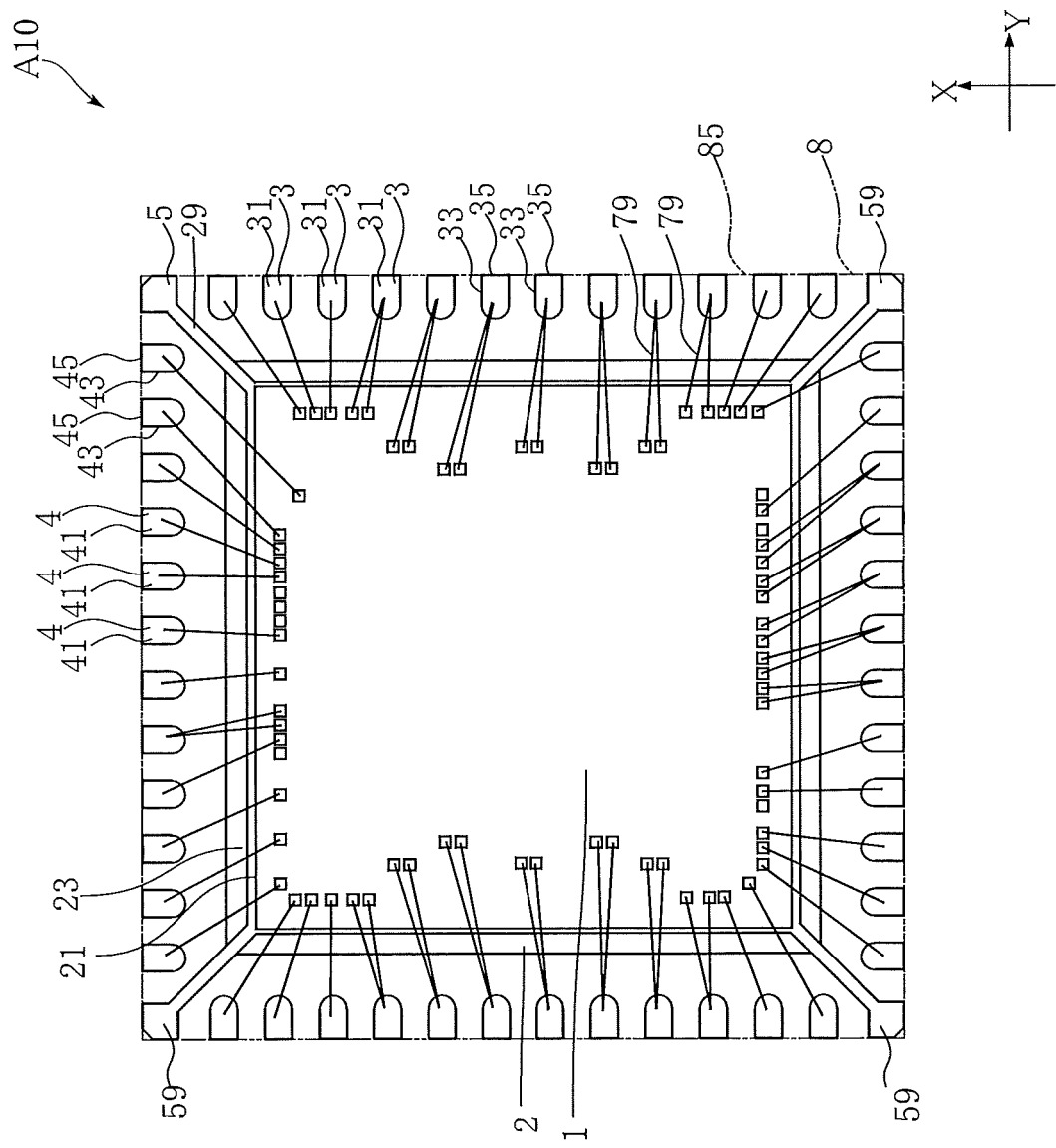
FIG. 8 is a plan view that omits a sealing resin from FIG. 1.
Figure 9:
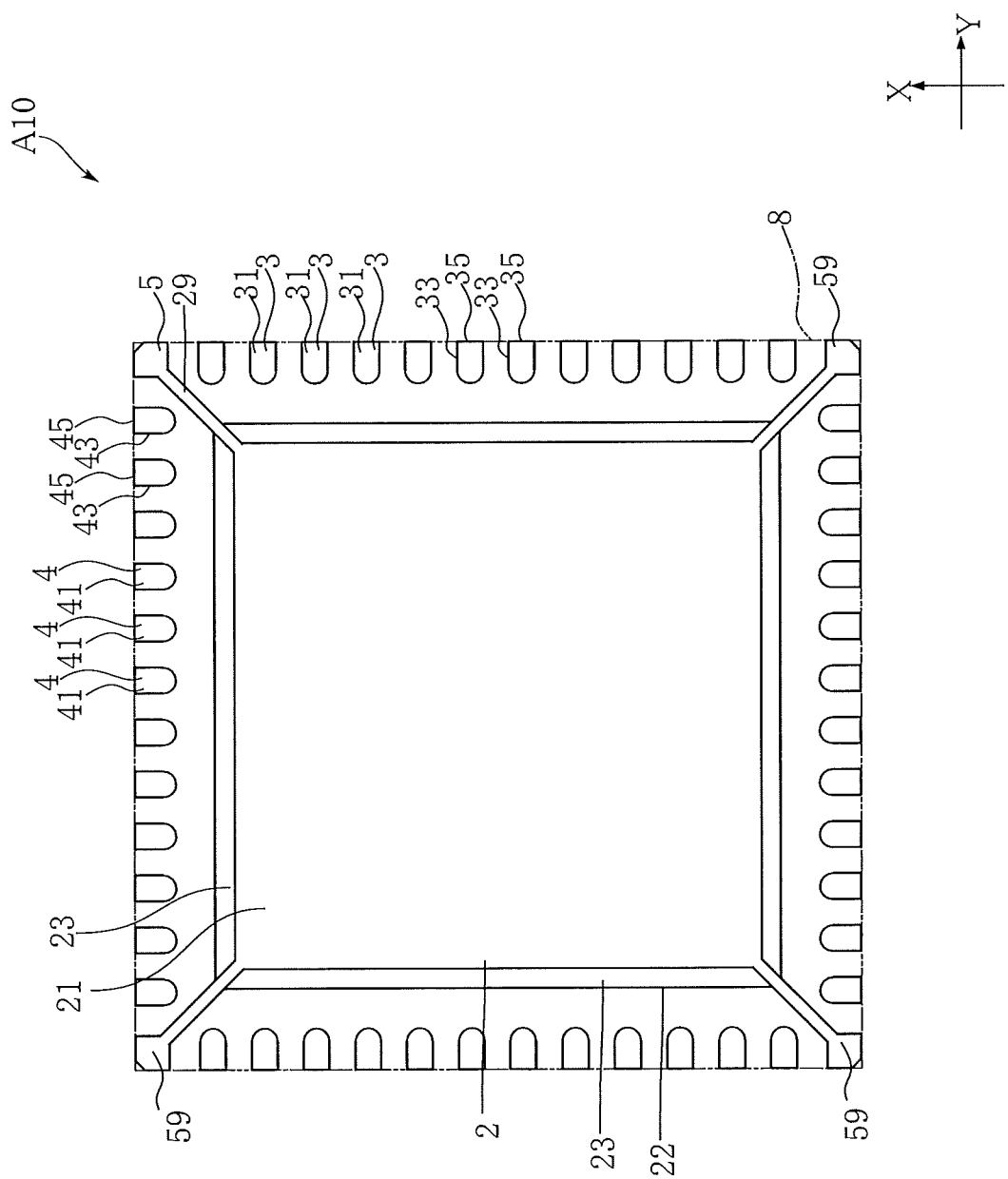
FIG. 9 is a plan view that omits a plurality of wires and an electronic element from FIG. 8.
Figure 10:
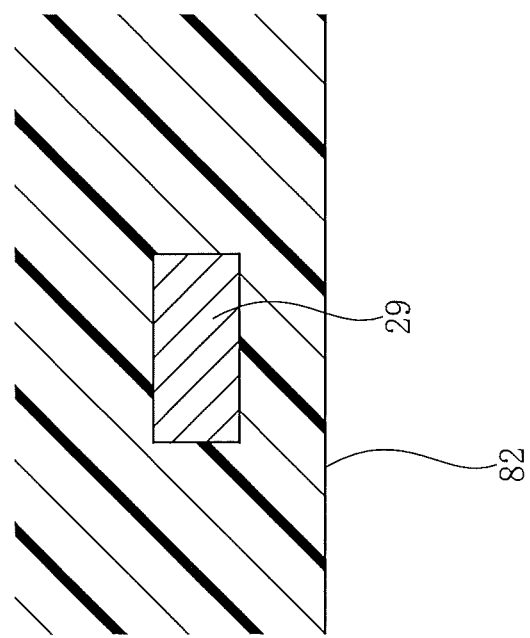
FIG. 10 is a partial cross-sectional view along a line X-X in FIG. 7.
Figure 11:
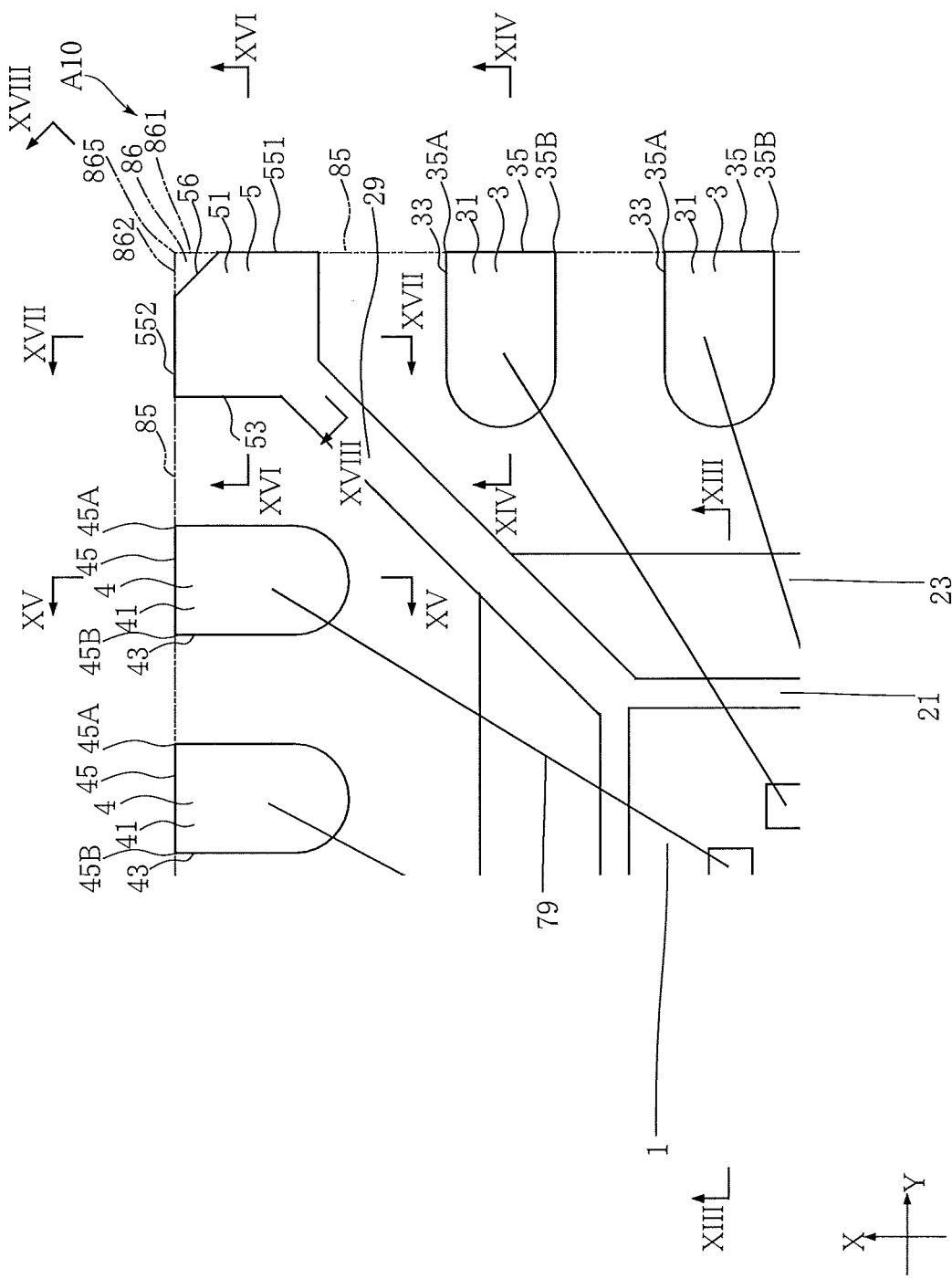
FIG. 11 is an enlarged partial view of an upper right area in FIG. 8.
Figure 12:
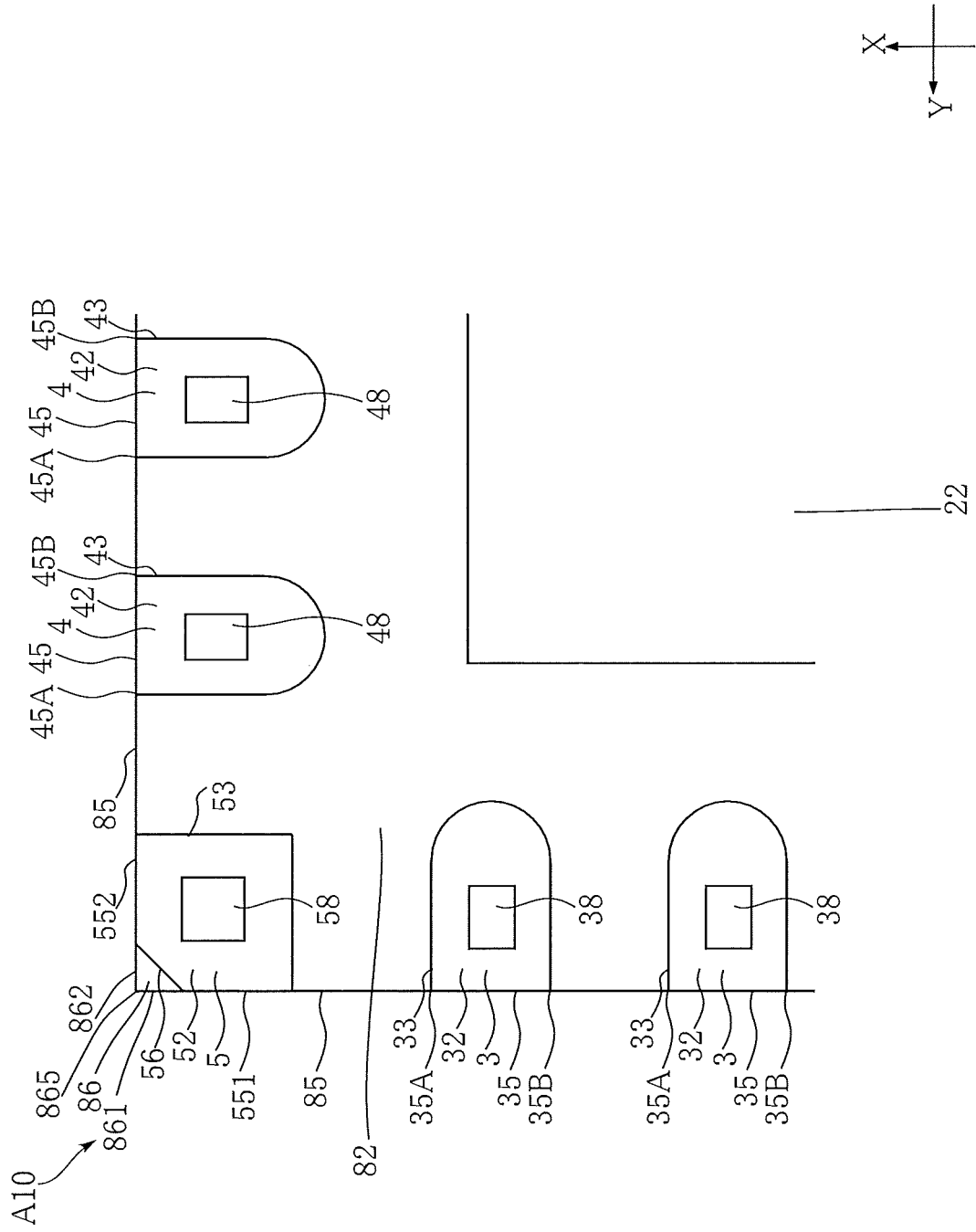
FIG. 12 is an enlarged partial view of an upper left area in FIG. 2.

FIG. 8 is a plan view that omits the sealing resin 8 from FIG. 1. FIG. 9 is a plan view that omits the electronic element 1 and the plurality of wires 79 from FIG. 8. FIG. 10 is a partial cross-sectional view along a line X-X in FIG. 7. FIG. 11 is an enlarged partial view of an upper right area in FIG. 8. FIG. 12 is an enlarged partial view of an upper left area in FIG. 2.

In the present embodiment, the electronic element 1 shown in FIGS. 5 to 8 is a semiconductor element. The electronic element 1 takes on a rectangular shape as seen in a thickness direction Z of the electronic element 1 (as seen in plan view). The size of the electronic element 1 in a first direction X is 4 to 8 mm, for example. The size of the electronic element 1 in a second direction Y is 4 to 8 mm, for example. In the present embodiment, the size of the electronic element 1 in the first direction X and the size of the electronic element 1 in the second direction Y are both 5.1 mm.

Figure 13:
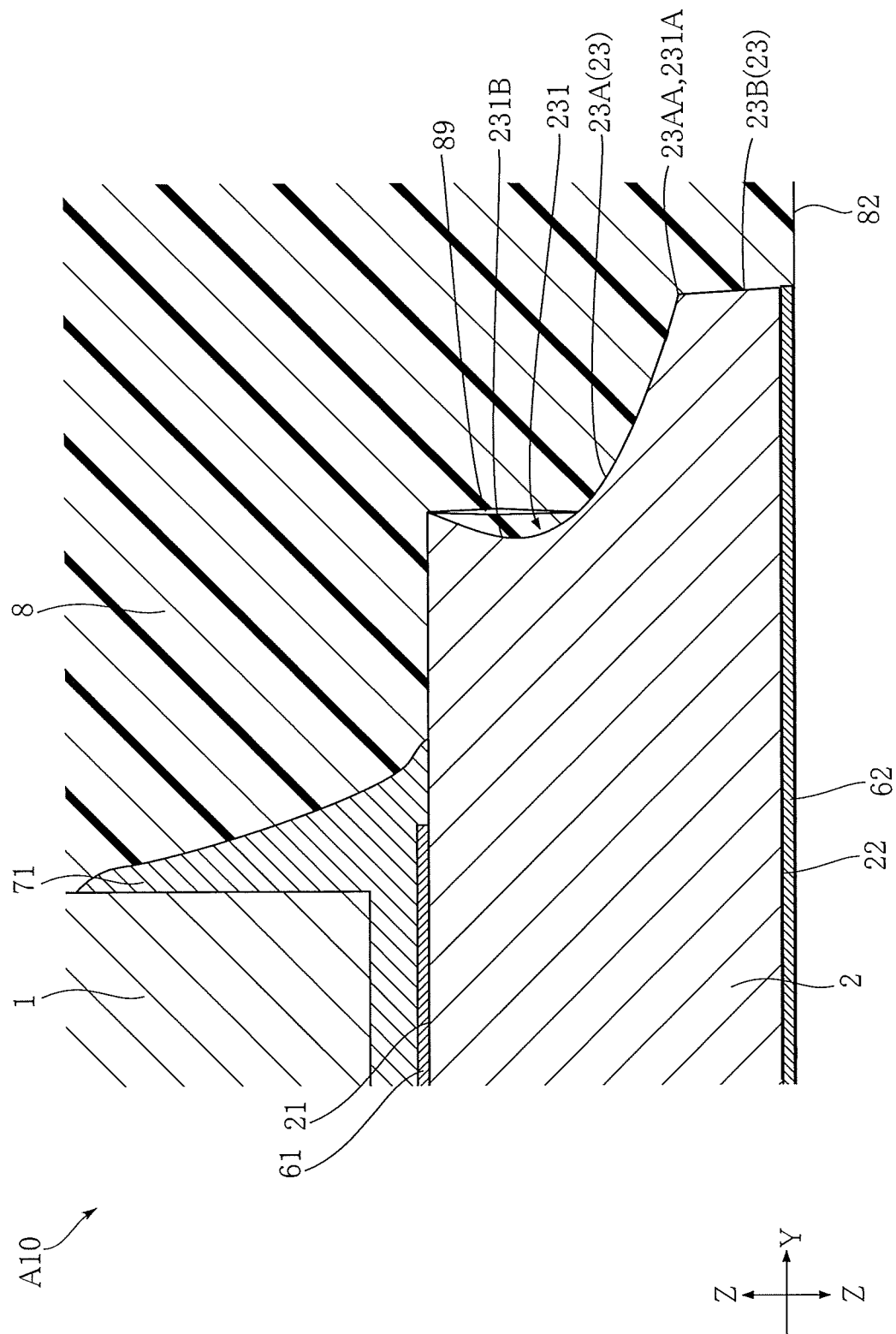
FIG. 13 is a partial cross-sectional view along a line XIII-XIII in FIG. 11.

FIG. 13 is a partial cross-sectional view along a line XIII-XIII in FIG. 11.

The main electrode 2 shown in FIG. 2, FIGS. 5 to 8 and FIG. 13 is made of a conductive material. The main electrode 2 is formed by patterning such as etching or the like being performed on a metal plate that is made of Cu, for example. The electronic element 1 is disposed on the main electrode 2.

As shown in FIG. 13, the main electrode 2 has a main electrode front surface 21, a main electrode back surface 22, and a main electrode lateral surface 23.

The main electrode front surface 21 faces in one thickness direction Z. The main electrode front surface 21 is flat and has a rectangular shape. The electronic element 1 is disposed on the main electrode front surface 21. In the present embodiment, the size of the main electrode surface 21 in the first direction X and the size of the main electrode surface 21 in the second direction Y are both 5.4 mm. Preferably, the area of the electronic element 1 as seen in the thickness direction Z occupies 80 percent or more of the area of the main electrode surface 21.

The main electrode back surface 22 faces in the other thickness direction Z. The main electrode back surface 22 faces in the opposite direction to the main electrode front surface 21. The main electrode back surface 22 is flat and has a rectangular shape. The main electrode back surface 22 is exposed from the sealing resin 8 (i.e., is not covered by the sealing resin 8). The main electrode back surface 22 has a region that protrudes outside of the main electrode surface 21, as seen in the thickness direction Z of the electronic element 1. In the present embodiment, the main electrode back surface 22 protrudes outside of the main electrode surface 21, as seen in the thickness direction Z of the electronic element 1, around the entire periphery of the main electrode 2. Thus, the area of the main electrode back surface 22 is greater than the area of the main electrode surface 21.

The main electrode lateral surface 23 connects the main electrode front surface 21 to the main electrode back surface 22. The main electrode lateral surface 23 is covered by the sealing resin 8. In the present embodiment, the main electrode lateral surface 23 has undergone rough surface machining. The value of surface roughness of the main electrode lateral surface 23 is greater than the value of surface roughness of the main electrode back surface 22. The surface area per unit area (rectangular area defined by unit length×unit length; the same applied below) of the main electrode lateral surface 23 is, for example, 1.5 to 2.5 times the surface area per unit area of the main electrode back surface 22. The rough surface machining of the present embodiment need not be performed on the main electrode lateral surface 23.

The main electrode lateral surface 23 has a recessed portion 231 that is recessed toward the center (or inwardly) of the main electrode 2. An end part 231A on the main electrode back surface 22 side of the recessed portion 231 is located outside of the main electrode surface 21, as seen in the thickness direction Z of the electronic element 1. The recessed portion 231 has a region 231B that is located more on the center side of the main electrode 2 than is the end of the main electrode surface 21, as seen in the thickness direction Z. The recessed portion 231 is formed around the entire periphery of the main electrode 2. In the present embodiment, the recessed portion 231 is formed in the main electrode 2 because the main electrode 2 is formed by etching a lead frame.

The main electrode lateral surface 23 includes a main upper portion 23A and a main lower portion 23B.

The main upper portion 23A is located more on the main electrode front surface 21 side than the main lower portion 23B in the thickness direction Z. In the present embodiment, the main upper portion 23A has a recessed shape that is recessed toward the center of the main electrode 2. That is, in the electronic device A10, the main upper portion 23A constitutes the recessed portion 231. An end part 23AA on the main electrode back surface 22 side of the main upper portion 23A is located outside of the main electrode surface 21, as seen in the thickness direction Z of the electronic element 1. In the present embodiment, the end part 23AA on the main electrode back surface 22 side of the main upper portion 23A is entirely located outside of the main electrode surface 21, as seen in the thickness direction Z of the electronic element 1.

The main lower portion 23B slopes in the thickness direction Z, so as to form an acute angle with the main electrode back surface 22. The size of the main lower portion 23B in the thickness direction Z is less than the size of the main upper portion 23A in the thickness direction Z. One conceivable reason of this is that the mask for etching that covers the main electrode back surface 22 has a comparatively small opening, and thus the amount of etching solution that flows toward the main electrode front surface 21 side from the main electrode back surface 22 side is less than the amount of etching solution that flows toward the main electrode back surface side from the main electrode front surface 21 side. The main lower portion 23B is entirely located outside of the main electrode surface 21, as seen in the thickness direction Z.

Figure 14:
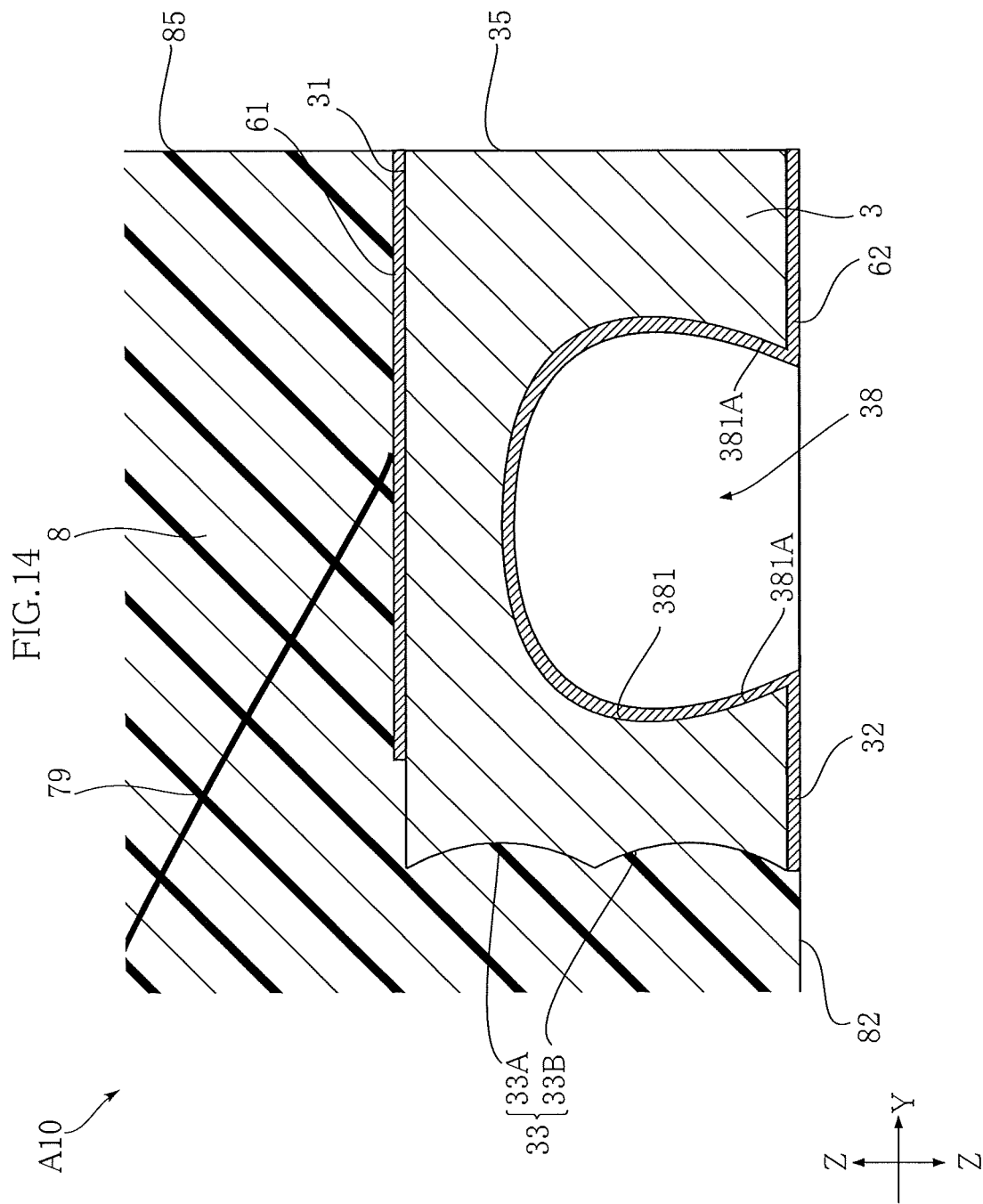
FIG. 14 is a partial cross-sectional view along a line XIV-XIV in FIG. 11.

FIG. 14 is a partial cross-sectional view along a line XIV-XIV in FIG. 11.

The plurality of first sub-electrodes 3 shown in FIGS. 2, 3, 5, 8, 9, 11, 12 and 14 are arrayed in the first direction X. The plurality of first sub-electrodes 3 are located further in the second direction Y than any of the plurality of second sub-electrodes 4. The plurality of first sub-electrodes 3 are made of a conductive material. The plurality of first sub-electrodes 3 are formed by patterning such as etching or the like being performed on a metal plate made of Cu, for example.

As shown in FIG. 14, the plurality of first sub-electrodes 3 each have a first sub-electrode front surface 31, a first sub-electrode back surface 32, a first sub-electrode lateral surface 33, and a first sub-electrode outer surface 35.

The first sub-electrode front surface 31 faces in one thickness direction Z. The first sub-electrode front surface 31 is flat. The first sub-electrode front surface 31 is covered by the sealing resin 8.

The first sub-electrode back surface 32 faces in the other thickness direction Z. The first sub-electrode back surface 32 faces in the opposite direction to the first sub-electrode front surface 31. The first sub-electrode back surface 32 is flat. The first sub-electrode back surface 32 is exposed from the sealing resin 8.

The first sub-electrode outer surface 35 faces in the second direction Y. In the present embodiment, the first sub-electrode outer surface 35 is exposed from the sealing resin 8.

The first sub-electrode lateral surface 33 connects the first sub-electrode front surface 31 to the first sub-electrode back surface 32. The first sub-electrode lateral surface 33 stands erect from (or intersects) the first sub-electrode back surface 32. The first sub-electrode lateral surface 33 is covered by the sealing resin 8. As shown in FIGS. 11 and 12, the first sub-electrode lateral surface 33 connects an end part 35A of the first sub-electrode outer surface 35 in the first direction X to an end part 35B of the first sub-electrode outer surface 35 on the opposite side to the first direction X. In the present embodiment, the first sub-electrode lateral surface 33 has undergone rough surface machining. The value of surface roughness of the first sub-electrode lateral surface 33 is greater than the value of surface roughness of the first sub-electrode back surface 32. The surface area per unit area of the first sub-electrode lateral surface 33 is, for example, 1.5 to 2.5 times the surface area per unit area of the first sub-electrode back surface 32. The rough surface machining of the present embodiment need not be performed on the first sub-electrode lateral surface 33.

The first sub-electrode lateral surface 33 includes a first sub-upper portion 33A and a first sub-lower portion 33B.

The first sub-upper portion 33A is located more on the first sub-electrode front surface 31 side than the first sub-lower portion 33B in the thickness direction Z. In the present embodiment, the first sub-upper portion 33A has a recessed shape that is recessed toward the center of the first sub-electrode 3. The first sub-lower portion 33B has a recessed shape that is recessed toward the center of the first sub-electrode 3. The first sub-upper portion 33A and the first sub-lower portion 33B have a recessed shape because the first sub-electrode 3 is formed by etching a lead frame.

A first sub-electrode recessed part 38 is formed in each of the plurality of first sub-electrodes 3. The first sub-electrode recessed part 38 is recessed from the first sub-electrode back surface 32. The depth of the first sub-electrode recessed part 38 is, for example, $1/3$ to $2/3$ of the size of the first sub-electrode 3 in the thickness direction Z of the electronic element 1. The area of the opening of the first sub-electrode recessed part 38 in the first sub-electrode back surface 32 is, for example, $1/3$ to $3/4$ of the area of the first sub-electrode back surface 32. The outline of the opening of the first sub-electrode recessed part 38 has a shape that fits inside the outer edge of the first sub-electrode back surface 32. In the present embodiment, the outline of the opening of the first sub-electrode recessed part 38 has a rectangular shape. The outline of the opening of the first sub-electrode recessed part 38 may have a different shape from the present embodiment, such as a circular shape or a polygonal shape.

The inner surface 381 of the first sub-electrode recessed part 38 has a tip region 381A that is connected to the first sub-electrode back surface 32. The tip region 381A of the inner surface 381 of the first sub-electrode recessed part 38 slopes in the thickness direction Z of the electronic element 1, such that the area of a cross-section along a plane that is orthogonal to the thickness direction Z of the electronic element 1 gradually increases as the distance from the first sub-electrode back surface 32 increases. The first sub-electrode recessed part 38 thereby has a shape in which the opening narrows. This is because the first sub-electrode recessed part 38 is formed by etching using an etching solution. The same applies to a second sub-electrode recessed part 48, a dummy electrode recessed part 58 and an independent dummy electrode recessed part 548 that will be discussed later.

Figure 15:
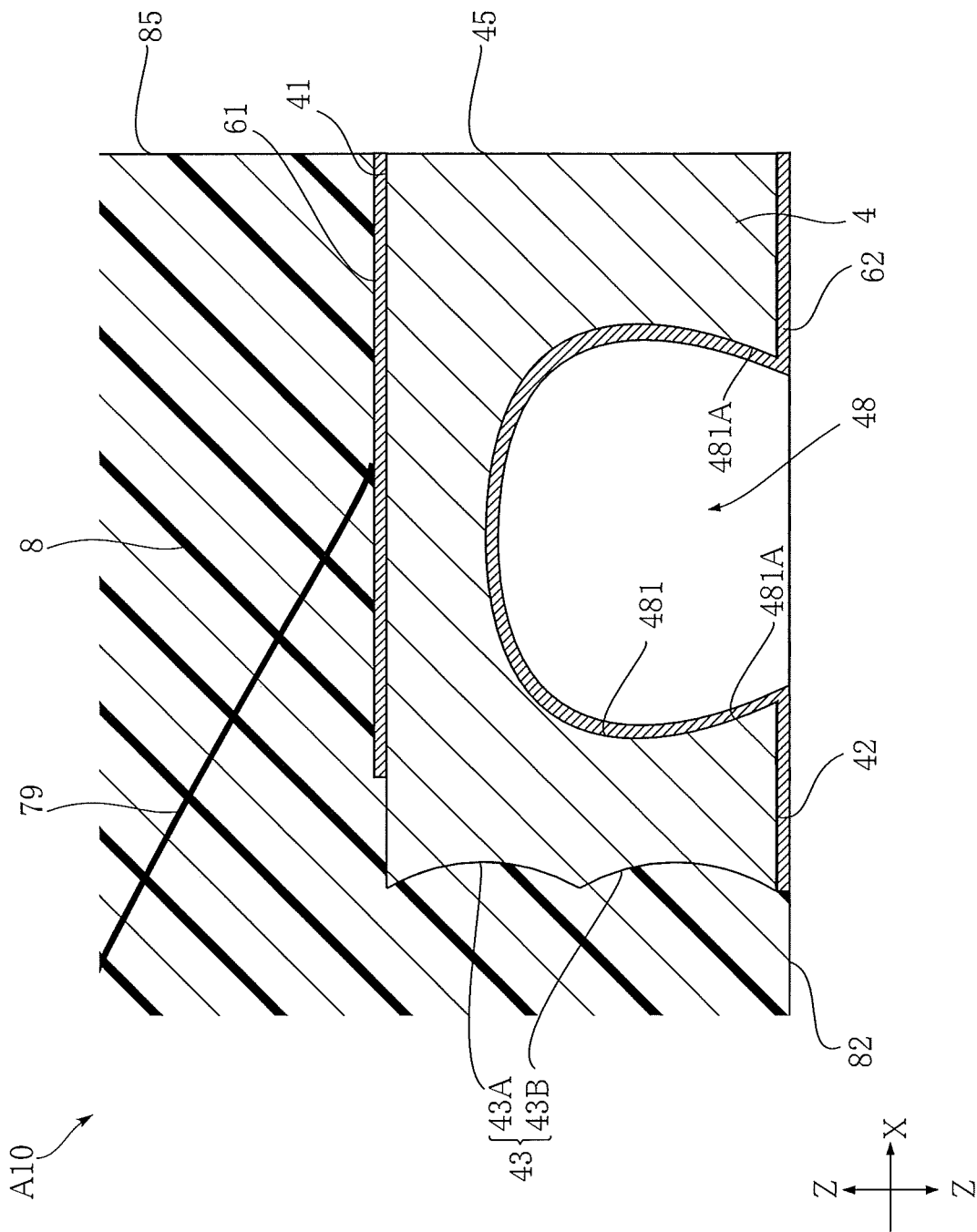
FIG. 15 is a partial cross-sectional view along a line XV-XV in FIG. 11.

FIG. 15 is a partial cross-sectional view along a line XV-XV in FIG. 11.

The plurality of second sub-electrodes 4 shown in FIGS. 2, 4, 6, 8, 9, 11, 12 and 15 are disposed in the second direction Y. The plurality of second sub-electrodes 4 are located further in the first direction X than any of the plurality of first sub-electrodes 3. The plurality of second sub-electrodes 4 are made of a conductive material. The plurality of second sub-electrodes 4 are formed by patterning such as etching or the like being performed on a metal plate made of Cu, for example.

As shown in FIG. 15, the plurality of second sub-electrodes 4 each have a second sub-electrode front surface 41, a second sub-electrode back surface 42, a second sub-electrode lateral surface 43 and a second sub-electrode outer surface 45.

The second sub-electrode front surface 41 faces in one thickness direction Z. The second sub-electrode front surface 41 is flat. The second sub-electrode front surface 41 is covered by the sealing resin 8.

The second sub-electrode back surface 42 faces in the other thickness direction Z. The second sub-electrode back surface 42 faces in the opposite direction to the second sub-electrode front surface 41. The second sub-electrode back surface 42 is flat. The second sub-electrode back surface 42 is exposed from the sealing resin 8.

The second sub-electrode outer surface 45 faces in the first direction X. In the present embodiment, the second sub-electrode outer surface 45 is exposed from the sealing resin 8.

The second sub-electrode lateral surface 43 connects the second sub-electrode front surface 41 to the second sub-electrode back surface 42. The second sub-electrode lateral surface 43 stands erect from the second sub-electrode back surface 42. The second sub-electrode lateral surface 43 is covered by the sealing resin 8. As shown in FIGS. 11 and 12, the second sub-electrode lateral surface 43 connects an end part 45A of the second sub-electrode outer surface 45 in the second direction Y to an end part 45B of the second sub-electrode outer surface 45 on the opposite side to the second direction Y. In the present embodiment, the second sub-electrode lateral surface 43 has undergone rough surface machining. The value of surface roughness of the second sub-electrode lateral surface 43 is greater than the value of surface roughness of the second sub-electrode back surface 42. The surface area per unit area of the second sub-electrode lateral surface 43 is, for example, 1.5 to 2.5 times the surface area per unit area of the second sub-electrode back surface 42. The rough surface machining of the present embodiment need not be performed on the second sub-electrode lateral surface 43.

The second sub-electrode lateral surface 43 includes a second sub-upper portion 43A and a second sub-lower portion 43B.

The second sub-upper portion 43A is located more on the second sub-electrode front surface 41 side than the second sub-lower portion 43B in the thickness direction Z. In the present embodiment, the second sub-upper portion 43A has a recessed shape that is recessed toward the center of the second sub-electrode 4. The second sub-lower portion 43B has a recessed shape that is recessed toward the center of the second sub-electrode 4. The second sub-upper portion 43A and the second sub-lower portion 43B have a recessed shape because the second sub-electrodes 4 are formed by etching a lead frame.

A second sub-electrode recessed part 48 is formed in each of the plurality of second sub-electrodes 4. The second sub-electrode recessed part 48 is recessed from the second sub-electrode back surface 42. The depth of the second sub-electrode recessed part 48 is, for example, ⅓ to ⅔ of the size of the second sub-electrodes 4 in the thickness direction Z of the electronic element 1. The area of the opening of the second sub-electrode recessed part 48 in the second sub-electrode back surface 42 is, for example, ⅓ to ¾ of the area of the second sub-electrode back surface 42. The outline of the opening of the second sub-electrode recessed part 48 has a shape that fits inside the outer edge of the second sub-electrode back surface 42. In the present embodiment, the outline of the opening of the second sub-electrode recessed part 48 has a rectangular shape. The outline of the opening of the second sub-electrode recessed part 48 may have a different shape from the present embodiment, such as a circular shape or a polygonal shape.

An inner surface 481 of the second sub-electrode recessed part 48 has a tip region 481A connected to the second sub-electrode back surface 42. The tip region 481A of the inner surface 481 of the second sub-electrode recessed part 48 slopes in the thickness direction Z of the electronic element 1, such that the area of a cross-section along a plane that is orthogonal to the thickness direction Z of the electronic element 1 gradually increases as the distance from the second sub-electrode back surface 42 increases. The second sub-electrode recessed part 48 thereby has a shape in which the opening narrows.

Figure 16:
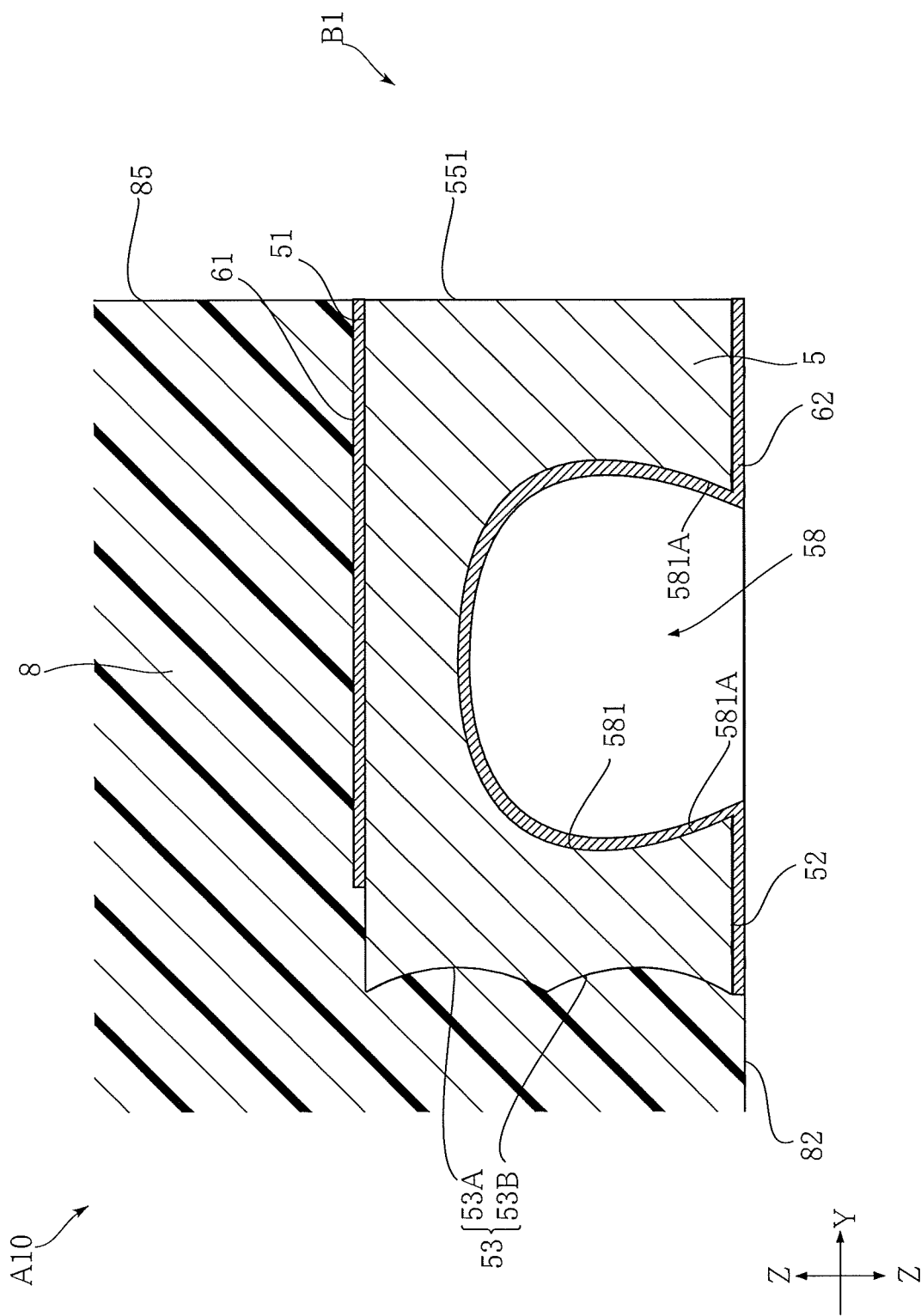
FIG. 16 is a partial cross-sectional view along a line XVI-XVI in FIG. 11.
Figure 17:
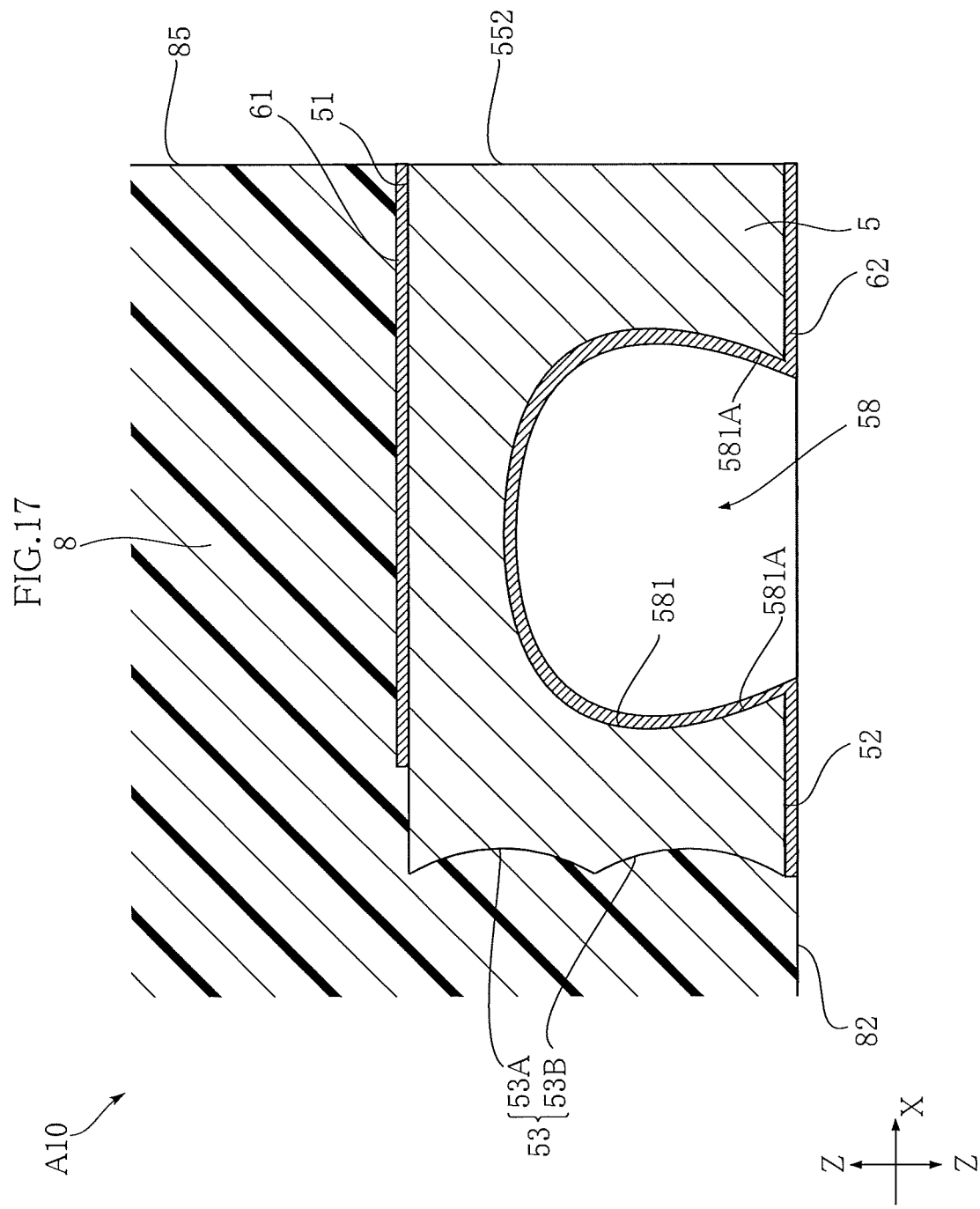
FIG. 17 is a partial cross-sectional view along a line XVII-XVII in FIG. 11.
Figure 18:
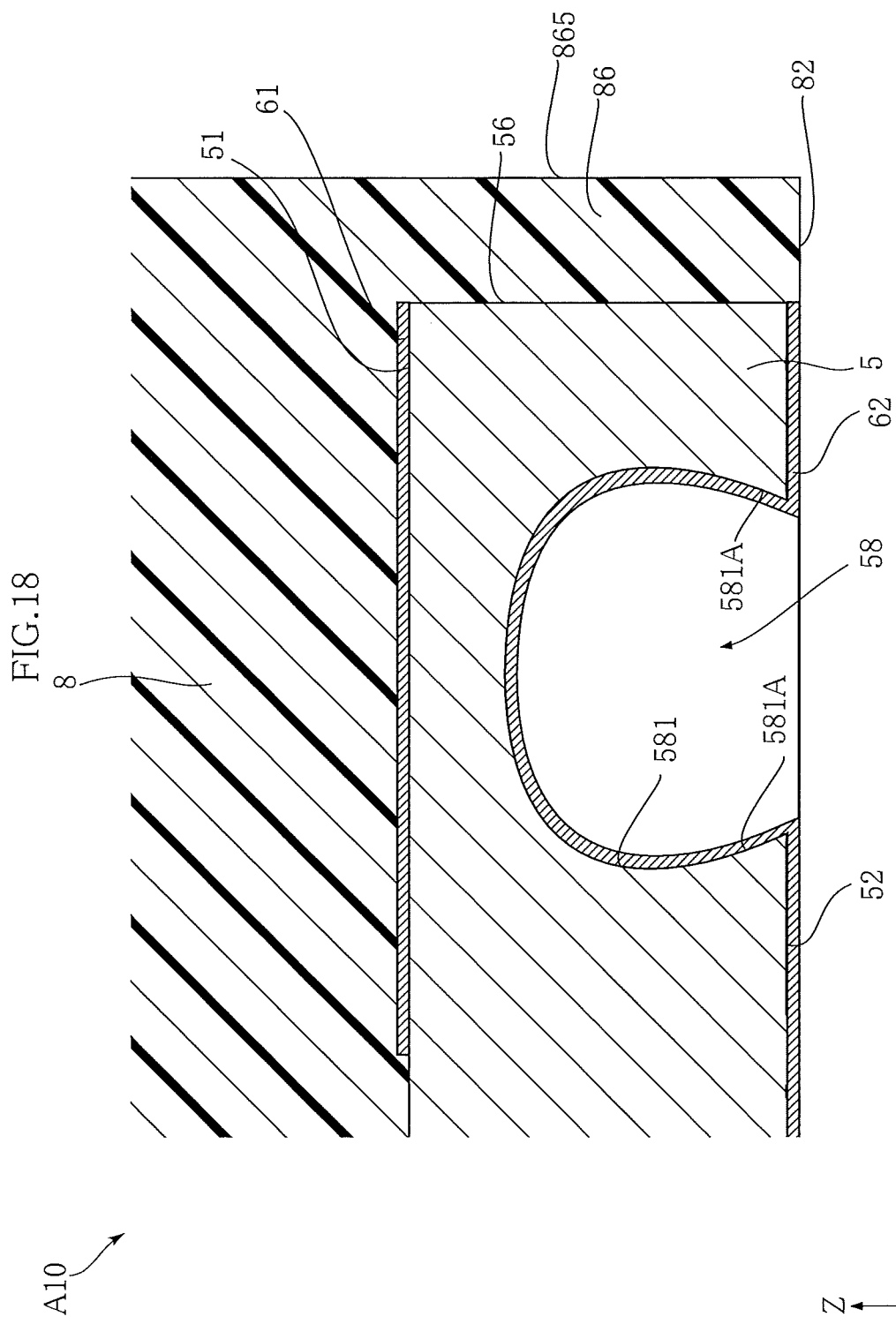
FIG. 18 is a partial cross-sectional view along a line XVIII-XVIII in FIG. 11.

FIG. 16 is a partial cross-sectional view along a line XVI-XVI in FIG. 11. FIG. 17 is a partial cross-sectional view along a line XVII-XVII in FIG. 11. FIG. 18 is a partial cross-sectional view along a line XVIII-XVIII in FIG. 11.

The dummy electrode 5 shown in FIGS. 2, 11, 12, 16, 17 and 18 is located further in the first direction X than any of the plurality of first sub-electrodes 3, and is located further in the second direction Y than any of the plurality of second sub-electrodes 4. The dummy electrode 5 is made of a conductive material. The dummy electrode 5 is formed by patterning such as etching or the like being performed on a metal plate made of Cu, for example. The dummy electrode 5, the main electrode 2, the plurality of first sub-electrodes 3 and the plurality of second sub-electrodes 4 are formed from a single lead frame. Therefore, the dummy electrode 5, the main electrode 2, the plurality of first sub-electrodes 3 and the plurality of second sub-electrodes 4 are all made of the same material. As mentioned previously, in the present embodiment, the dummy electrode 5, the main electrode 2, the plurality of first sub-electrodes 3 and the plurality of second sub-electrodes 4 are all made of Cu. Also, the respective thicknesses (size in the thickness direction Z) of the dummy electrode 5, the main electrode 2, the plurality of first sub-electrodes 3 and the plurality of second sub-electrodes 4 are the same as each other. The dummy electrode 5 is insulated from all of the plurality of first sub-electrodes 3 and the plurality of second sub-electrodes 4.

As shown in FIGS. 16, 17 and 18, the dummy electrode 5 has a dummy electrode front surface 51, a dummy electrode back surface 52, a dummy electrode lateral surface 53, a dummy electrode first outer surface 551, a dummy electrode second outer surface 552, and an erect sloping surface 56.

The dummy electrode front surface 51 faces in one thickness direction Z. The dummy electrode front surface is flat. The dummy electrode front surface 51 is entirely covered by the sealing resin 8.

The dummy electrode back surface 52 faces in the other thickness direction Z. The dummy electrode back surface 52 faces in the opposite direction to the dummy electrode front surface 51. The dummy electrode back surface 52 is flat. The dummy electrode back surface 52 is exposed from the sealing resin 8.

The dummy electrode first outer surface 551 faces in the second direction Y. In the present embodiment, the dummy electrode first outer surface 551 is exposed from the sealing resin 8.

The dummy electrode second outer surface 552 faces in the first direction X. In the present embodiment, the dummy electrode second outer surface 552 is exposed from the sealing resin 8.

The erect sloping surface 56 stands erect from the dummy electrode back surface 52, and slopes relative to the dummy electrode first outer surface 551 and the dummy electrode second outer surface 552. The erect sloping surface 56 is connected to the dummy electrode first outer surface 551 and the dummy electrode second outer surface 552. The erect sloping surface 56 faces outside the sealing resin 8, as seen in the thickness direction Z of the electronic element 1.

The dummy electrode lateral surface 53 connects the dummy electrode front surface 51 to the dummy electrode back surface 52. The dummy electrode lateral surface 53 stands erect from the dummy electrode back surface 52. The dummy electrode lateral surface 53 is covered by the sealing resin 8. The dummy electrode lateral surface 53 is located on the electronic element 1 side in the dummy electrode 5. In the present embodiment, the dummy electrode lateral surface 53 has undergone rough surface machining. The value of surface roughness of the dummy electrode lateral surface 53 is greater than the value of surface roughness of the dummy electrode back surface 52. The surface area per unit area of the dummy electrode lateral surface 53 is, for example, 1.5 to 2.5 times the surface area per unit area of the dummy electrode back surface 52. The rough surface machining of the present embodiment need not be performed on the dummy electrode lateral surface 53.

The dummy electrode lateral surface 53 includes a dummy upper portion 53A and a dummy lower portion 53B.

The dummy upper portion 53A is located more on the dummy electrode front surface 51 side than the dummy lower portion 53B in the thickness direction Z. In the present embodiment, the dummy upper portion 53A has a recessed shape that is recessed toward the center of the dummy electrode 5. The dummy lower portion 53B has a recessed shape that is recessed toward the center of the dummy electrode 5. The dummy upper portion 53A and the dummy lower portion 53B have a recessed shape because the dummy electrode 5 is formed by etching a lead frame.

A dummy electrode recessed part 58 is formed in the dummy electrode 5. The dummy electrode recessed part 58 is recessed from the dummy electrode back surface 52. The depth of the dummy electrode recessed part 58 is, for example, ⅓ to ⅔ of the size of the dummy electrode 5 in the thickness direction Z of the electronic element 1. The area of the opening of the dummy electrode recessed part 58 in the dummy electrode back surface 52 is, for example, ⅓ to ¾ of the area of the dummy electrode back surface 52. The outline of the opening of the dummy electrode recessed part 58 has a shape that fits inside the outer edge of the dummy electrode back surface 52. In the present embodiment, the outline of the opening of the dummy electrode recessed part 58 has a rectangular shape. The outline of the opening of the dummy electrode recessed part 58 may have a different shape from the present embodiment, such as a circular shape or a polygonal shape.

An inner surface 581 of the dummy electrode recessed part 58 has a tip region 581A that is connected to the dummy electrode back surface 52. The tip region 581A of the inner surface 581 of the dummy electrode recessed part 58 slopes in the thickness direction Z of the electronic element 1, such that the area of a cross-section along a plane that is orthogonal to the thickness direction Z of the electronic element 1 gradually increases as the distance from the dummy electrode back surface 52 increases. The dummy electrode recessed part 58 thereby has a shape in which the opening narrows.

The dummy electrode 5 mentioned previously is disposed in one of the four corners of the sealing resin 8. As shown in FIGS. 2 and 8, in the present embodiment, three additional dummy electrodes 59 are disposed in addition to the dummy electrode 5. The three additional dummy electrodes 59 are respectively disposed in the other corners of the sealing resin 8. One of the three additional dummy electrodes 59 is disposed on the opposite side to the dummy electrode 5 with the plurality of first sub-electrodes 3 sandwiched therebetween. One of the three additional dummy electrodes 59 is disposed on the opposite side to the dummy electrode 5 with the plurality of second sub-electrodes 4 sandwiched therebetween. One of the three additional dummy electrodes 59 is disposed on the opposite side to the dummy electrode 5 with the main electrode 2 sandwiched therebetween. The additional dummy electrodes 59 have a similar configuration to the dummy electrode 5, and thus description thereof will be omitted.

An extended part 29 shown in FIGS. 7 to 10 extends outside the main electrode 2 from the main electrode 2, as seen in the thickness direction Z. The extended part 29 is coupled to the main electrode 2 and the dummy electrode 5. The thickness of the extended part 29 is less than the main electrode 2 and the dummy electrode 5. When the extended part 29 is viewed from the main electrode 2, the extended part 29 is entirely peripherally surrounded by the sealing resin 8. In the present embodiment, the extended part 29 is not exposed from the sealing resin 8. The extended part 29 extends toward the dummy electrode 5 from the main electrode 2 in a direction intersecting both the first direction X and the second direction Y. In manufacturing of the electronic device A10, the extended part 29 functions to support the main electrode 2 before the sealing resin 8 is formed.

The front surface plating layer 61 shown in FIGS. 13 to 18 has a region formed on the main electrode front surface 21, a region formed on the first sub-electrode front surface 31, a region formed on the second sub-electrode front surface 41, and a region formed on the dummy electrode front surface 51. The first sub-electrode front surface 31, the second sub-electrode front surface 41 and the dummy electrode front surface 51 are covered by the sealing resin 8 via the front surface plating layer 61. The front surface plating layer 61 consists of Ag, for example. The electronic device A10 does not, however, need to be provided with the front surface plating layer 61. Note that illustration of the front surface plating layer 61 is omitted in figures other than FIGS. 13 to 18.

The back surface plating layer 62 shown in FIGS. 13 to 18 has a region formed on the main electrode back surface 22, a region formed on the first sub-electrode back surface 32, a region formed on the second sub-electrode back surface 42, and a region formed on the dummy electrode back surface 52. The back surface plating layer 62 is made of Sn, for example. Furthermore, in the present embodiment, the back surface plating layer 62 is formed on the inner surface 381 of the first sub-electrode recessed part 38, the inner surface 481 of the second sub-electrode recessed part 48, and the inner surface 581 of the dummy electrode recessed part 58. The back surface plating layer 62 is formed in order to facilitate adhering a solder layer 802 discussed later. Note that illustration of the back surface plating layer 62 is omitted in figures other than FIGS. 13 to 18.

The joining layer 71 shown in FIGS. 5 to 7 and FIG. 13 is interposed between the electronic element 1 and the main electrode 2. The joining layer 71 is for joining the electronic element 1 to the main electrode 2. The joining layer 71 directly contacts the electronic element 1 and the front surface plating layer 61. The joining layer 71 contacts an area, of the main electrode surface 21, on which the front surface plating layer 61 is formed. In the present embodiment, the joining layer 71 is made of a conductive material. The material constituting the joining layer 71 is Ag, for example. The joining layer 71 has a region that protrudes outside of the electronic element 1, as seen in the thickness direction Z.

The plurality of wires 79 shown in FIG. 8 are each bonded to the electronic element 1. The plurality of wires 79 are each bonded to any of the plurality of first sub-electrodes 3 or any of the plurality of second sub-electrodes 4. In the present embodiment, the plurality of wires 79 are each bonded to any of the plurality of first sub-electrodes 3 or any of the plurality of second sub-electrodes 4 via the front surface plating layer 61. Note that the plurality of wires 79 are not bonded to the dummy electrode 5.

The sealing resin 8 consists of an insulating resin, and specifically consists of a black epoxy resin, for example. The sealing resin 8 covers the electronic element 1, the main electrode 2, the plurality of first sub-electrodes 3, the plurality of second sub-electrodes 4, the dummy electrode 5, the front surface plating layer 61, the joining layer 71, and the plurality of wires 79.

The sealing resin 8 has a resin front surface 81, a resin back surface 82, and a resin lateral surface 85. The resin front surface 81 faces in one thickness direction Z. The resin front surface 81 is flat.

The resin back surface 82 faces in the other thickness direction Z. The resin back surface 82 is flat. The main electrode 2, the plurality of first sub-electrodes 3, the plurality of second sub-electrodes 4 and the dummy electrode 5 are respectively exposed from the resin back surface 82. The resin lateral surface 85 stands erect from the resin back surface 82. The dummy electrode 5, the plurality of first sub-electrodes 3 and the plurality of second sub-electrodes 4 are all exposed from the resin lateral surface 85.

Figure 19:
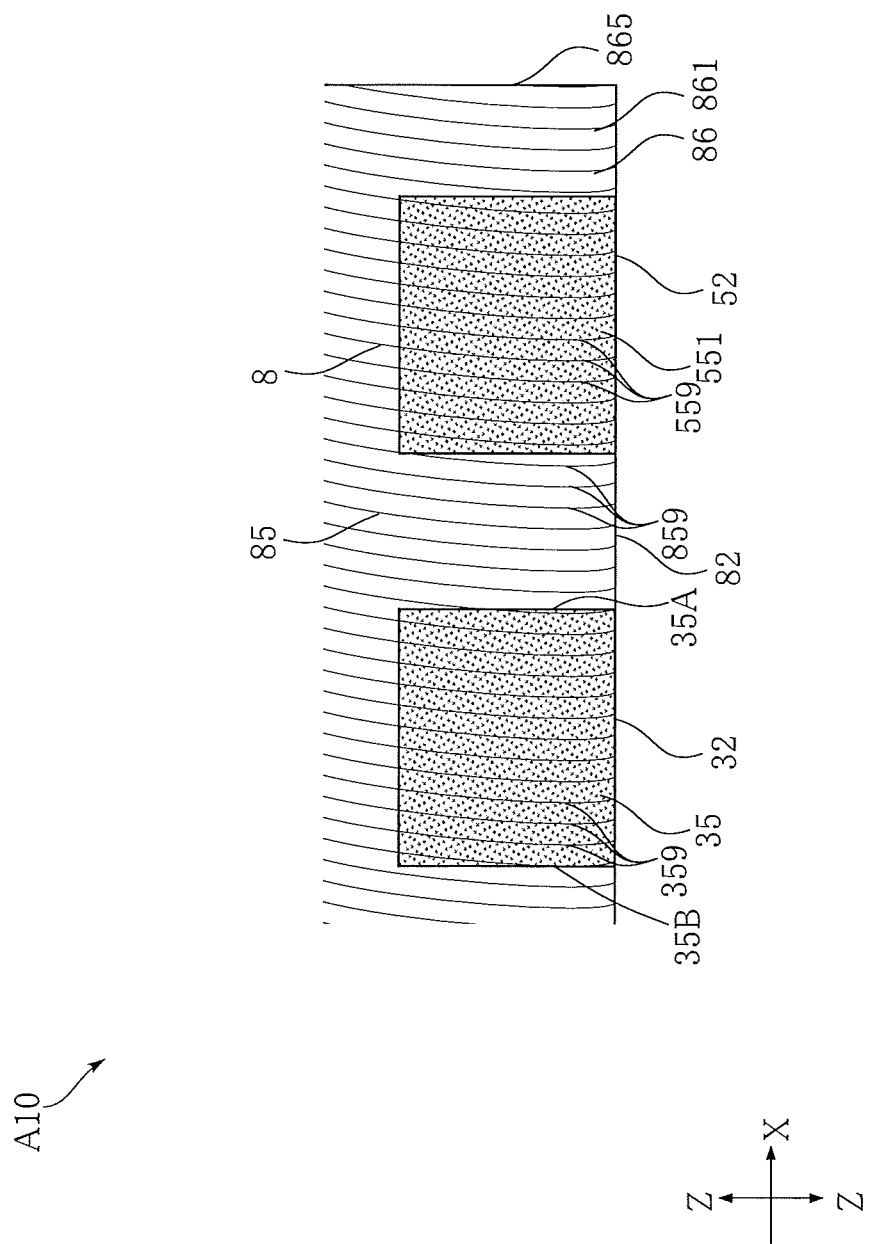
FIG. 19 is an enlarged view of a right side area in FIG. 3 (linear marks are shown in exaggerated form).

The region, of the resin lateral surface 85, facing in the second direction Y is flush with the first sub-electrode outer surface 35 and the dummy electrode first outer surface 551. The region, of the resin lateral surface 85, facing in the second direction Y, the first sub-electrode outer surface 35 and the dummy electrode first outer surface 551 are surfaces cut by a dicing blade (illustration omitted). Thus, as shown in FIG. 19, linear marks are formed on the region, of the resin lateral surface 85, facing in the second direction Y, the first sub-electrode outer surface 35, and the dummy electrode first outer surface 551. The linear marks are formed when dicing is performed with the dicing blade. Specifically, linear marks 859 are formed on the resin lateral surface 85, linear marks 359 are formed on the first sub-electrode outer surface 35, and linear marks 559 are formed on the dummy electrode first outer surface 551.

Figure 20:
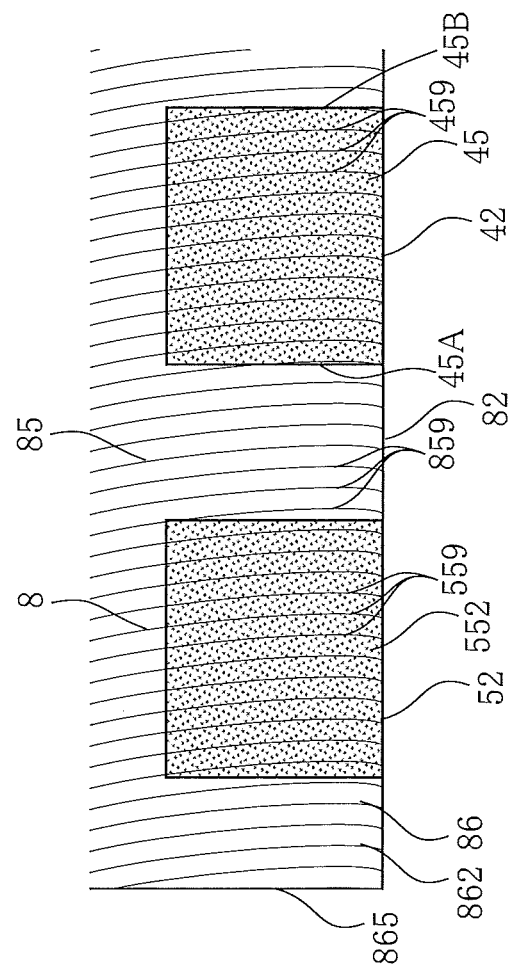
FIG. 20 is an enlarged view of a left side area in FIG. 4 (linear marks are shown in exaggerated form).

The region, of the resin lateral surface 85, facing in the first direction X is flush with the second sub-electrode outer surface 45 and the dummy electrode second outer surface 552. The region, of the resin lateral surface 85, facing in the first direction X, the second sub-electrode outer surface 45 and the dummy electrode second outer surface 552 are surfaces cut by the dicing blade. Thus, as shown in FIG. 20, linear marks are formed on the region, of the resin lateral surface 85, facing in the first direction X, the second sub-electrode outer surface 45, and the dummy electrode second outer surface 552. Specifically, linear marks 859 are formed on the resin lateral surface 85, linear marks 459 are formed on the second sub-electrode outer surface 45, and linear marks 559 are formed on the dummy electrode second outer surface 552.

As shown in FIGS. 11, 12 and 18, the sealing resin 8 has a resin corner part 86 covering the erect sloping surface 56. The resin corner part 86 constitutes part of resin back surface 82. The resin corner part 86 has a first lateral surface 861 that is flush with the dummy electrode first outer surface 551 and a second lateral surface 862 that is flush with the dummy electrode second outer surface 552. The first lateral surface 861 and the second lateral surface 862 constitute part of the resin lateral surface 85. The resin corner part 86 has a corner edge 865 extending in the thickness direction Z of the electronic element 1. The first lateral surface 861 and second lateral surface 862 are connected to each other via the corner edge 865 and are orthogonal to each other.

As shown in FIG. 13, a crack 89 may form in the sealing resin 8. In the present embodiment, the crack 89 extends in the thickness direction Z starting from the end of the main electrode surface 21. The main electrode lateral surface 23 is located more on the main electrode back surface 22 side than the end of the crack 89 on the main electrode back surface 22 side. Also, the end of the crack 89 on the main electrode back surface 22 side contacts the main electrode lateral surface 23. Thus, the crack 89 is not exposed to the outside of the sealing resin 8. That is, the crack 89 is entirely located inside the sealing resin 8.

Figure 21:
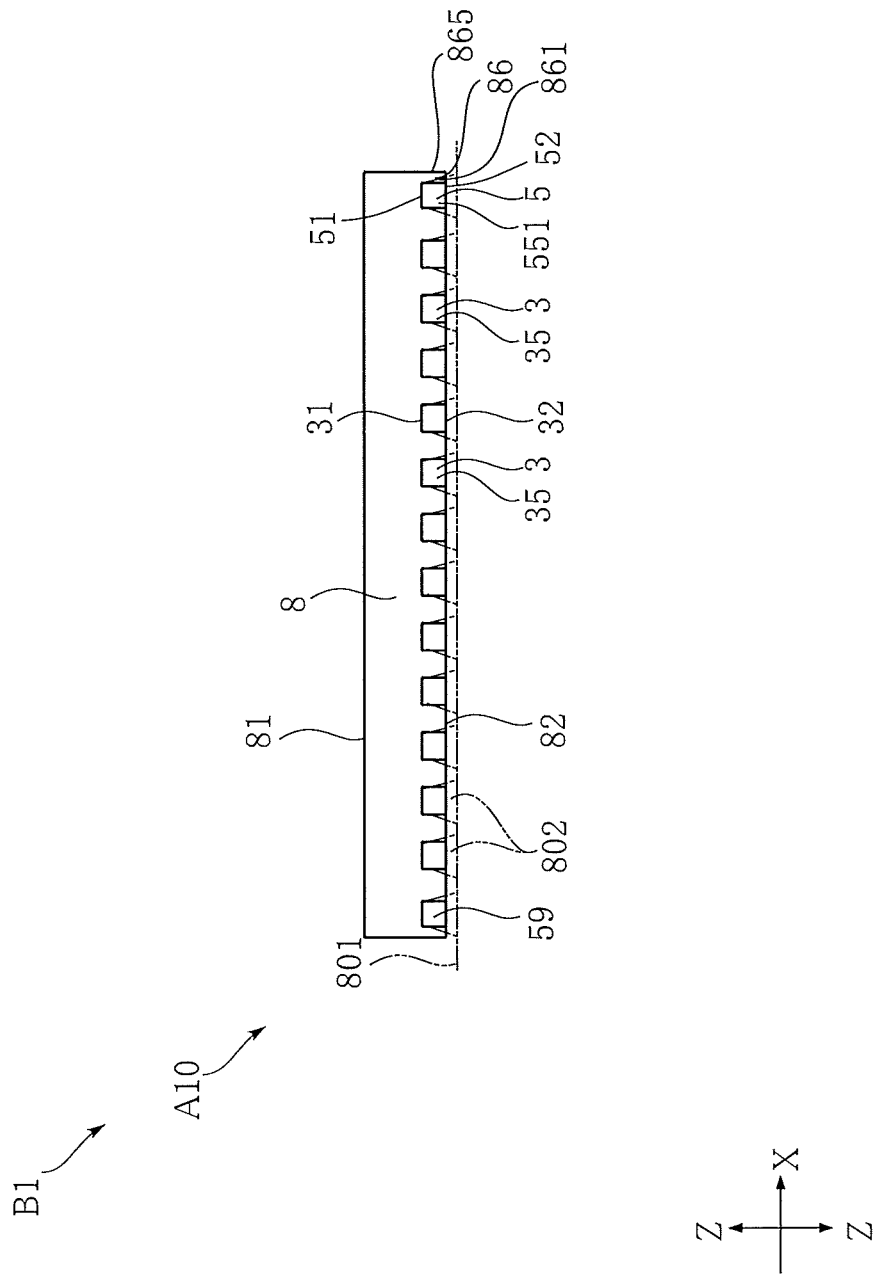
FIG. 21 is a right side view of a mounting structure including the electronic device of the first embodiment.
Figure 22:
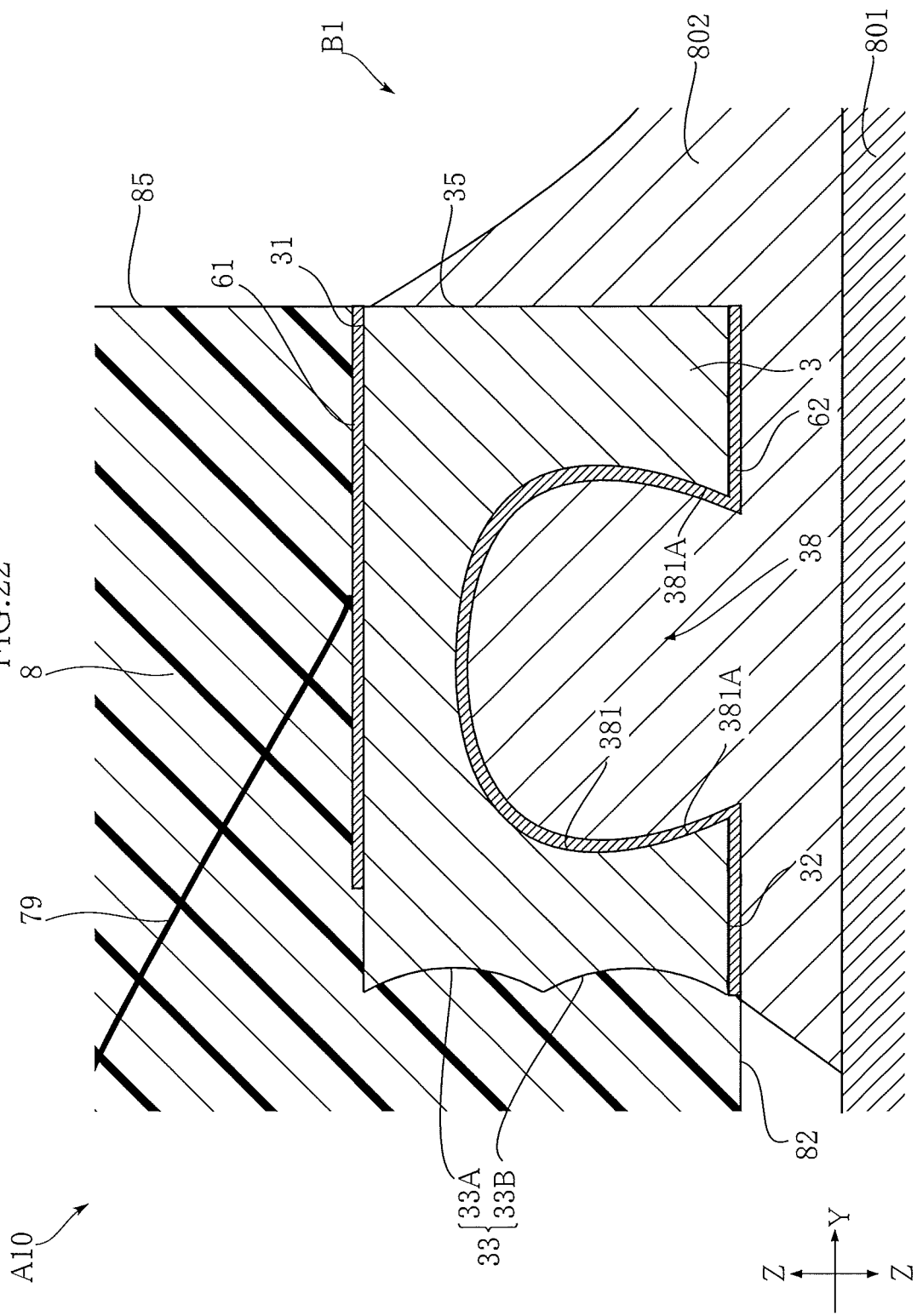
FIG. 22 is a partial cross-sectional view of the mounting structure (corresponds to FIG. 14).
Figure 23:
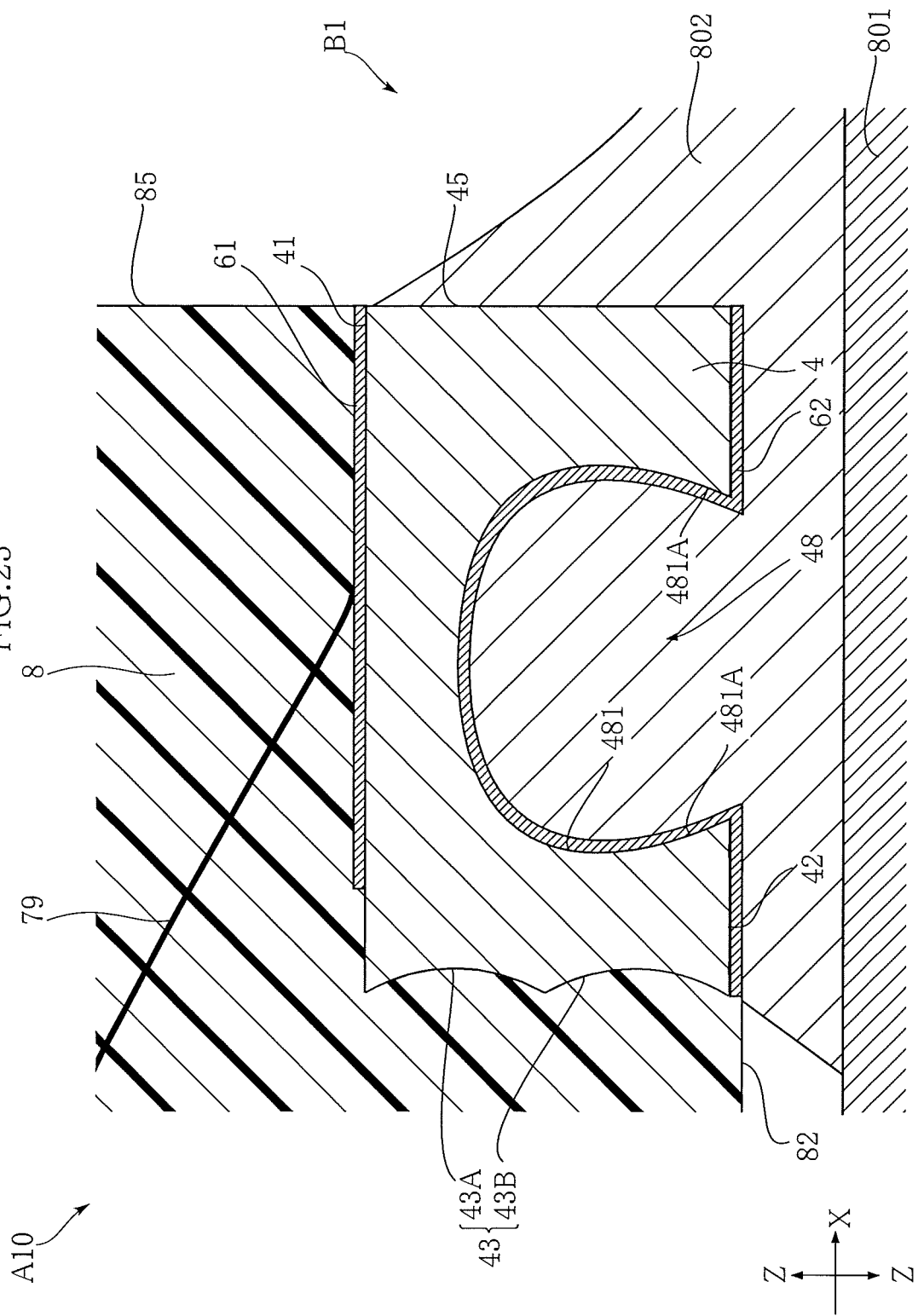
FIG. 23 is a partial cross-sectional view of the mounting structure (corresponds to FIG. 15).
Figure 24:
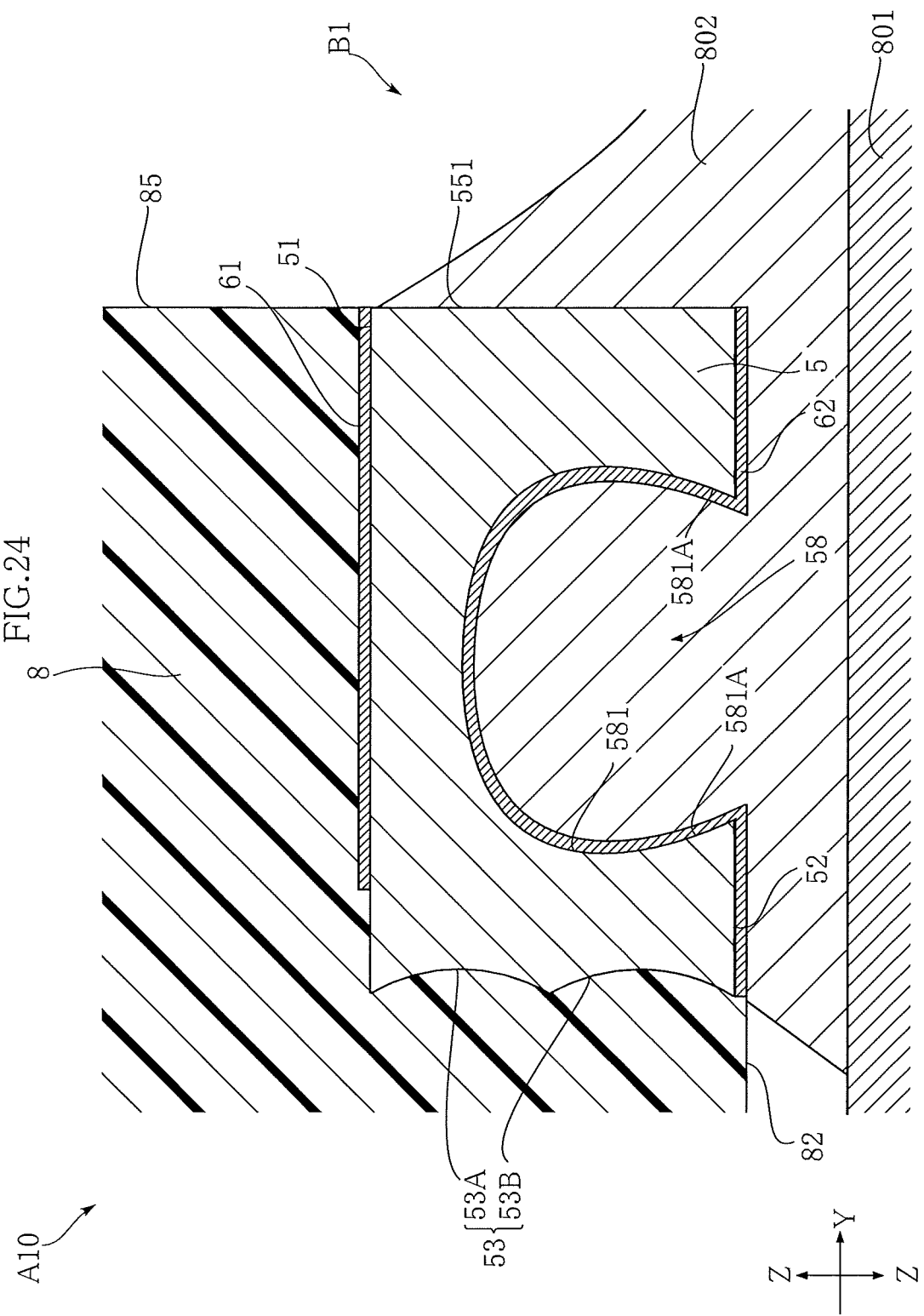
FIG. 24 is a partial cross-sectional view of the mounting structure (corresponds to FIG. 16).
Figure 25:
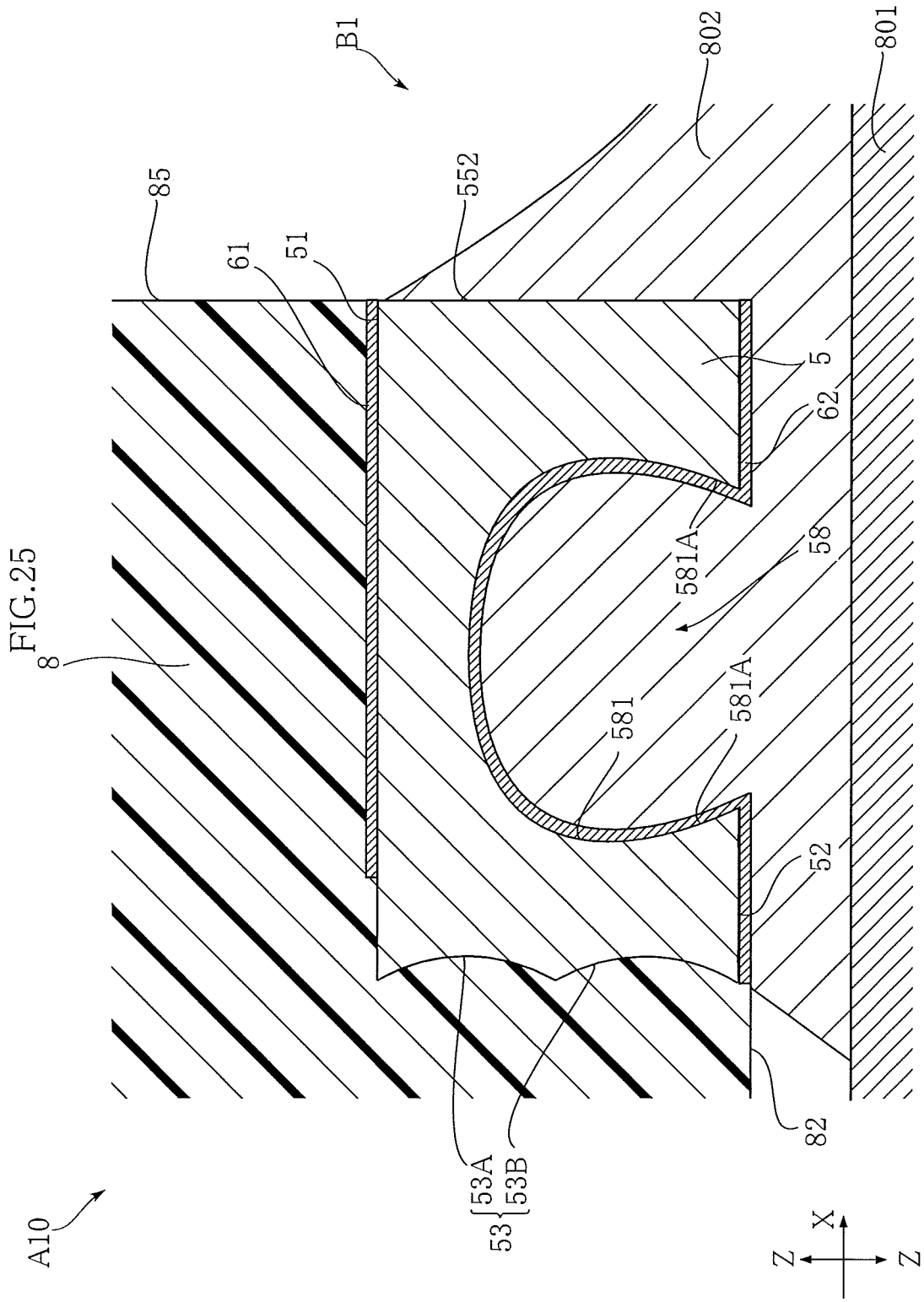
FIG. 25 is a partial cross-sectional view of the mounting structure (corresponds to FIG. 17).
Figure 26:
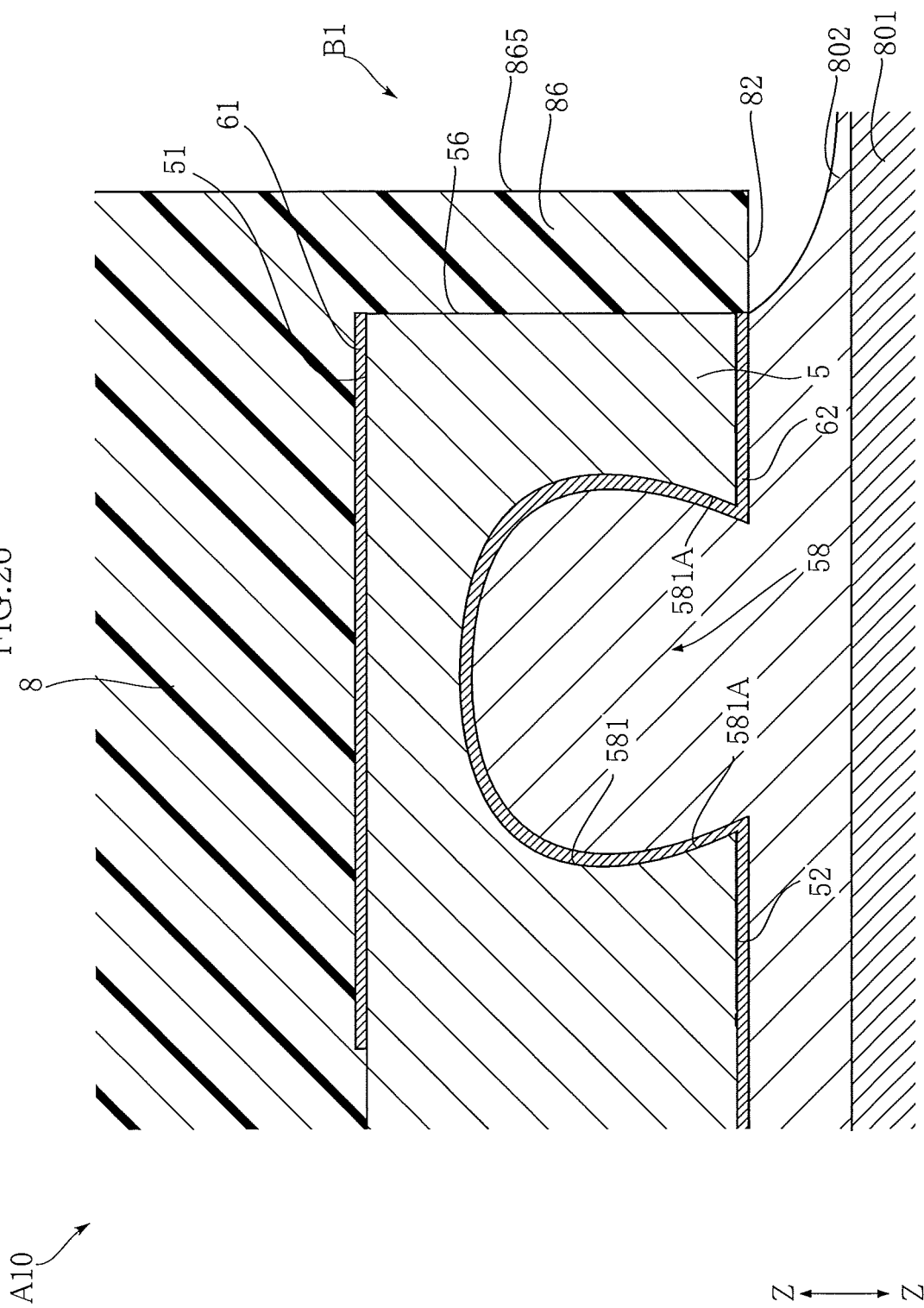
FIG. 26 is a partial cross-sectional view of the mounting structure (corresponds to FIG. 18).

FIG. 21 is a right side view of a mounting structure B1 that includes the electronic device of the first embodiment. FIGS. 22 to 26 are partial cross-sectional views of the mounting structure B1. FIGS. 22 to 26 respectively correspond to FIGS. 14 to 18.

The mounting structure B1 is provided with the electronic device A10, a circuit board 801, and a solder layer 802. The solder layer 802 is interposed between the circuit board 801 and the plurality of first sub-electrodes 3, between the circuit board 801 and the plurality of second sub-electrodes 4, and between the circuit board 801 and the dummy electrode 5. In the present embodiment, the first sub-electrode recessed part 38, the second sub-electrode recessed part 48 and the dummy electrode recessed part 58 are filled with the solder layer 802. The solder layer 802 also contacts the back surface plating layer 62.

Next, the operation and effects of the present embodiment will be described.

In the present embodiment, the electronic device A10 is provided with the dummy electrode 5. The dummy electrode 5 is located further in the first direction X than any of the plurality of first sub-electrodes 3, and is located further in the second direction Y than any of the plurality of second sub-electrodes 4. According to such a configuration, the dummy electrode 5 is joined to the circuit board 801 via the solder layer 802. Distribution of thermal stress generated in the solder layer 802 that is interposed between the electronic device A10 and the circuit board 801 is thereby attained, making it possible to reduce thermal stress generated in the solder layer 802 that is interposed between each of the first sub-electrodes 3 and the circuit board 801 and between each of the second sub-electrodes 4 and the circuit board 801. Accordingly, cracks occurring in the solder layer 802 that is interposed between each of the first sub-electrodes 3 and the circuit board 801 and between each of the second sub-electrodes 4 and the circuit board 801 can be prevented.

In the present embodiment, the dummy electrode 5 is insulated from all of the plurality of first sub-electrodes 3 and the plurality of second sub-electrodes 4.

According to such a configuration, even if a crack occurs in the solder layer 802 that is interposed between the dummy electrode 5 and the circuit board 801, the electrical connection between each of the first sub-electrodes 3 and the circuit board 801 and the electrical connection between each of the second sub-electrodes 4 and the circuit board 801 are secured. Thus, according to the present embodiment, malfunctioning of the electronic device A10 can be prevented from occurring.

In the present embodiment, the dummy electrode 5 has the erect sloping surface 56. The erect sloping surface 56 stands erect from the dummy electrode back surface 52, and slopes relative to the dummy electrode first outer surface 551 and the dummy electrode second outer surface 552. The erect sloping surface 56 faces outside the sealing resin 8, as seen in the thickness direction Z of the electronic element 1. The sealing resin 8 has the resin corner part 86 covering the erect sloping surface 56. In such a configuration, the dummy electrode 5 does not constitute the corner of the electronic device A10. Metal burrs can thereby be prevented from being generated on the corner of the electronic device A10 when the sealing resin 8 and the like are diced by the dicing blade.

In the present embodiment, the dummy electrode recessed part 58 that is recessed from the dummy electrode back surface 52 is formed in the dummy electrode 5. According to such a configuration, the dummy electrode 5 can be prevented from exfoliating from the solder layer 802, by filling the dummy electrode recessed part 58 with the solder layer 802.

In the present embodiment, the inner surface 581 of the dummy electrode recessed part 58 has the tip region 581A that is connected to the dummy electrode back surface 52. The tip region 581A of the inner surface 581 of the dummy electrode recessed part 58 slopes in the thickness direction Z of the electronic element 1, such that the area of a cross-section along a plane that is orthogonal to the thickness direction Z of the electronic element 1 gradually increases as the distance from the dummy electrode back surface 52 increases. According to such a configuration, the solder layer 802 is unlikely to come out of the dummy electrode recessed part 58. Therefore, the dummy electrode 5 can be more effectively prevented from exfoliating from the solder layer 802.

In the present embodiment, the first sub-electrode recessed part 38 that is recessed from the first sub-electrode back surface 32 is formed in the first sub-electrodes 3. According to such a configuration, the first sub-electrode 3 can be prevented from exfoliating from the solder layer 802, by filling the first sub-electrode recessed part 38 with the solder layer 802.

In the present embodiment, the inner surface 381 of the first sub-electrode recessed part 38 has the tip region 381A that is connected to the first sub-electrode back surface 32. The tip region 381A of the inner surface 381 of the first sub-electrode recessed part 38 slopes in the thickness direction Z of the electronic element 1, such that the area of a cross-section along a plane that is orthogonal to the thickness direction Z of the electronic element 1 gradually increases as the distance from the first sub-electrode back surface 32 increases. According to such a configuration, the solder layer 802 is unlikely to come out of the first sub-electrode recessed part 38. Therefore, the first sub-electrodes 3 can be more effectively prevented from exfoliating from the solder layer 802.

In the present embodiment, the second sub-electrode recessed part 48 that is recessed from the second sub-electrode back surface 42 is formed in the second sub-electrodes 4. According to such a configuration, the second sub-electrodes 4 can be prevented from exfoliating from the solder layer 802, by filling the second sub-electrode recessed part 48 with the solder layer 802.

In the present embodiment, the inner surface 481 of the second sub-electrode recessed part 48 has the tip region 481A that is connected to the second sub-electrode back surface 42. The tip region 481A of the inner surface 481 of the second sub-electrode recessed part 48 slopes in the thickness direction Z of the electronic element 1, such that the area of a cross-section along a plane that is orthogonal to the thickness direction Z of the electronic element 1 gradually increases as the distance from the second sub-electrode back surface 42 increases. According to such a configuration, the solder layer 802 is unlikely to come out of the second sub-electrode recessed part 48. Therefore, the second sub-electrodes 4 can be more effectively prevented from exfoliating from the solder layer 802.

When the electronic device A10 is in use, the electronic element 1, the main electrode 2, the joining layer 71, and the sealing resin 8 thermally expand and contract repeatedly. The crack 89 could thereby possibly be generated in the sealing resin 8. The inventors found that the crack 89 often occurred starting from somewhere on the main electrode 2. In the present embodiment, the main electrode back surface 22 has a region that protrudes outside of the main electrode surface 21, as seen in the thickness direction Z of the electronic element 1. According to such a configuration, in the case where the crack 89 is generated starting from somewhere on the main electrode 2 and spreads toward the resin back surface 82, the crack 89 is prevented from spreading by the main electrode lateral surface 23. The crack 89 can thereby be prevented from being exposed to the outside of the sealing resin 8. As a result, deterioration in the appearance of the electronic device A10 can be prevented, and moisture outside the sealing resin 8 can be prevented from reaching the main electrode 2 through the crack 89.

The inventors found that the crack 89 was, in particular, often generated starting from the boundary between the main electrode lateral surface 23 and the main electrode surface 21 (i.e., end part of the main electrode surface 21). In the present embodiment, the end part on the main electrode back surface 22 side of the recessed portion 231 of the main electrode lateral surface 23 is located outside of the main electrode surface 21, as seen in the thickness direction Z of the electronic element 1. According to such a configuration, even if the crack 89 is generated and spreads toward the resin back surface 82 side, the crack 89 is prevented from spreading by the inner surface of the recessed portion 231. The crack 89 can thereby be prevented from being exposed to the outside of the sealing resin 8. As a result, deterioration in the appearance of the electronic device A10 can be prevented, and moisture outside the sealing resin 8 can prevent from reaching the main electrode 2 through the crack 89.

In the present embodiment, the area of the electronic element 1 as seen in the thickness direction Z occupies 80 percent or more of the area of the main electrode surface 21. The crack 89 thus tends to be generated in the case where the area of the electronic element 1 as seen in the thickness direction Z is comparatively large relative to the main electrode front surface 21. Therefore, a configuration that can prevent the crack 89 from being exposed to the outside of the sealing resin 8 is particularly preferred for the configuration of the present embodiment in which the area of the electronic element 1 as seen in the thickness direction Z is comparatively large relative to the main electrode front surface 21.

A first modification of the first embodiment will be described with reference to FIG. 27.

Figure 27:
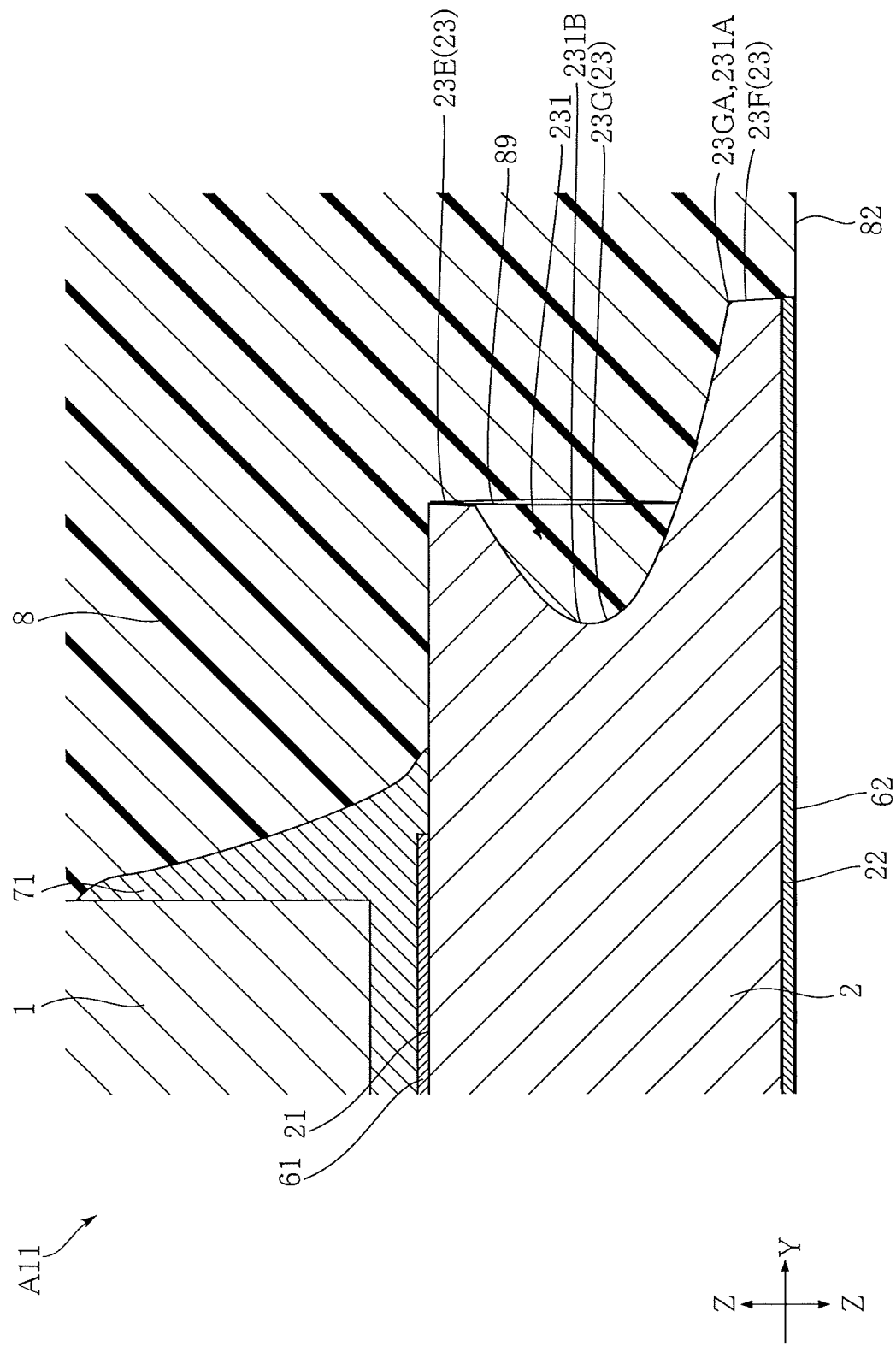
FIG. 27 is a cross-sectional view of an electronic device according to a first modification of the first embodiment.

FIG. 27 is a cross-sectional view of the electronic device A11 according to the first modification of the first embodiment.

Note that, in the following description, the same reference signs are given to configuration that is the same as or similar to that discussed previously, and description thereof will be omitted as appropriate.

An electronic device A11 of the present modification differs from the foregoing electronic device A10 in that the main electrode lateral surface 23 has a main upper portion 23E, a main lower portion 23F, and a main intermediate portion 23G.

The main upper portion 23E is located more on the main electrode front surface 21 side than the main lower portion 23F in the thickness direction Z.

The main upper portion 23E slopes in the thickness direction Z, so as to form an acute angle with the main electrode front surface 21. The main lower portion 23F slopes in the thickness direction Z, so as to form an acute angle with the main electrode back surface 22. The main lower portion 23F is entirely located outside of the main electrode surface 21, as seen in the thickness direction Z.

The main intermediate portion 23G is located between the main upper portion 23E and the main lower portion 23F in the thickness direction Z. The main intermediate portion 23G has a recessed shape that is recessed toward the center of the main electrode 2. That is, in the present modification, the main intermediate portion 23G constitutes the recessed portion 231. An end part 23GA on the main electrode back surface 22 side of the main intermediate portion 23G is located outside of the main electrode surface 21, as seen in the thickness direction Z of the electronic element 1. To form the main intermediate portion 23G, an etching solution can, for example, be injected to the main electrode 2 in a direction that slopes relative to the main electrode front surface 21, when forming the main electrode 2.

Operation and effects similar to the operation and effects discussed in relation to the electronic device A10 are also achieved by such a configuration.

A second modification of the first embodiment will be described with reference to FIG. 28.

Figure 28:
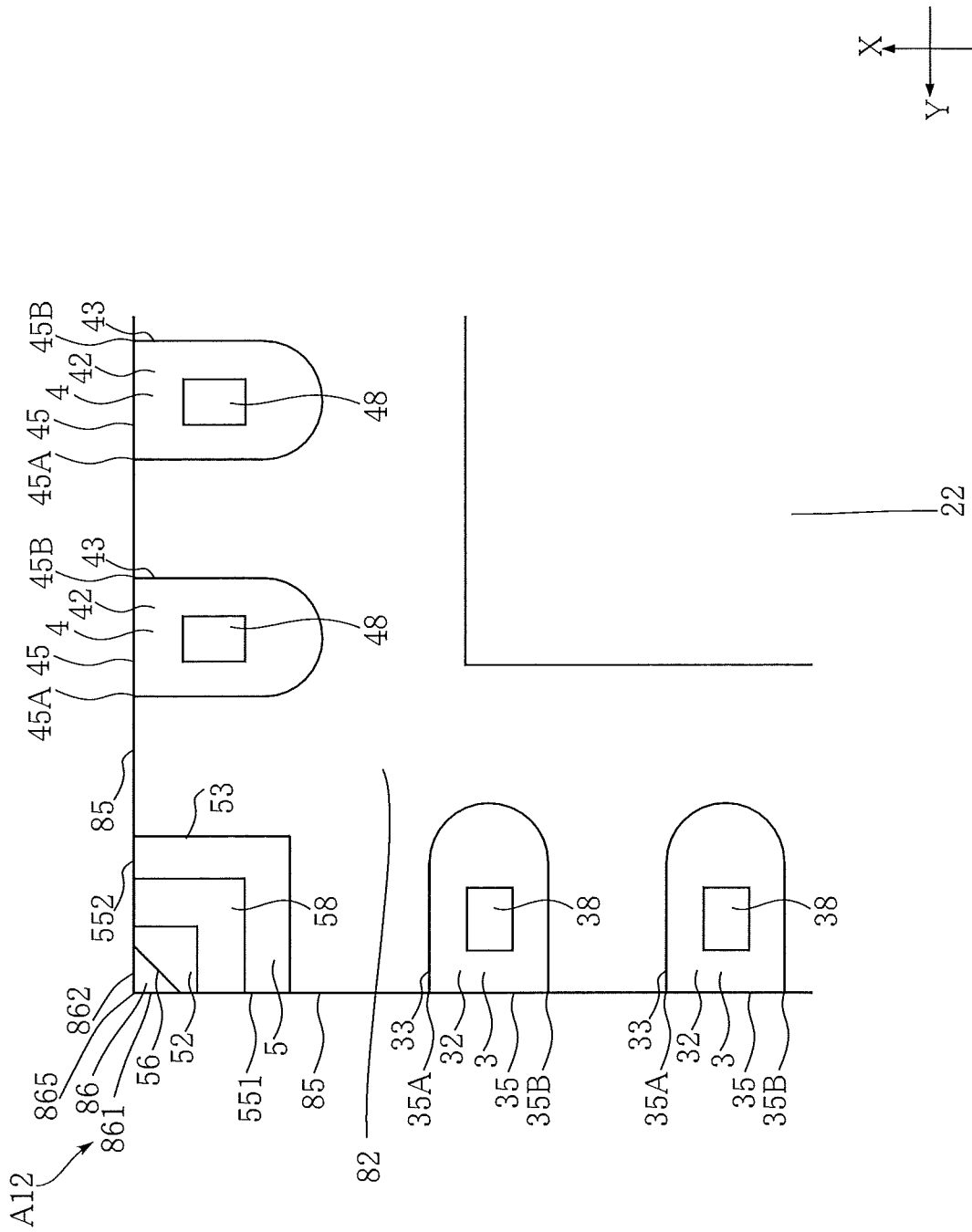
FIG. 28 is a bottom view of an electronic device according to a second modification of the first embodiment.

FIG. 28 is a bottom view of an electronic device A12 according to the second modification of the first embodiment.

The electronic device A12 of the present modification differs from the foregoing electronic device A10 in the shape of the dummy electrode recessed part 58 of the dummy electrode 5.

The dummy electrode recessed part 58 is also formed in the dummy electrode 5 in the present modification. The dummy electrode recessed part 58 is recessed from the dummy electrode back surface 52. The depth of the dummy electrode recessed part 58 is, for example, ⅓ to ⅔ of the size of the dummy electrode 5 in the thickness direction Z of the electronic element 1. The area of the opening of the dummy electrode recessed part 58 in the dummy electrode back surface 52 is, for example, ⅓ to ¾ of the area of the dummy electrode back surface 52. In the present modification, the dummy electrode recessed part 58 is open in the first direction X and the second direction Y. Thus, the dummy electrode recessed part 58 takes on an L shape, as seen in the thickness direction Z of the dummy electrode recessed part 58. Description other than about the dummy electrode recessed part 58 will be omitted in the present modification, because the description of the electronic device A10 can be applied.

Operation and effects similar to the operation and effects discussed in relation to the electronic device A10 are also achieved by such a configuration.

Figure 30:
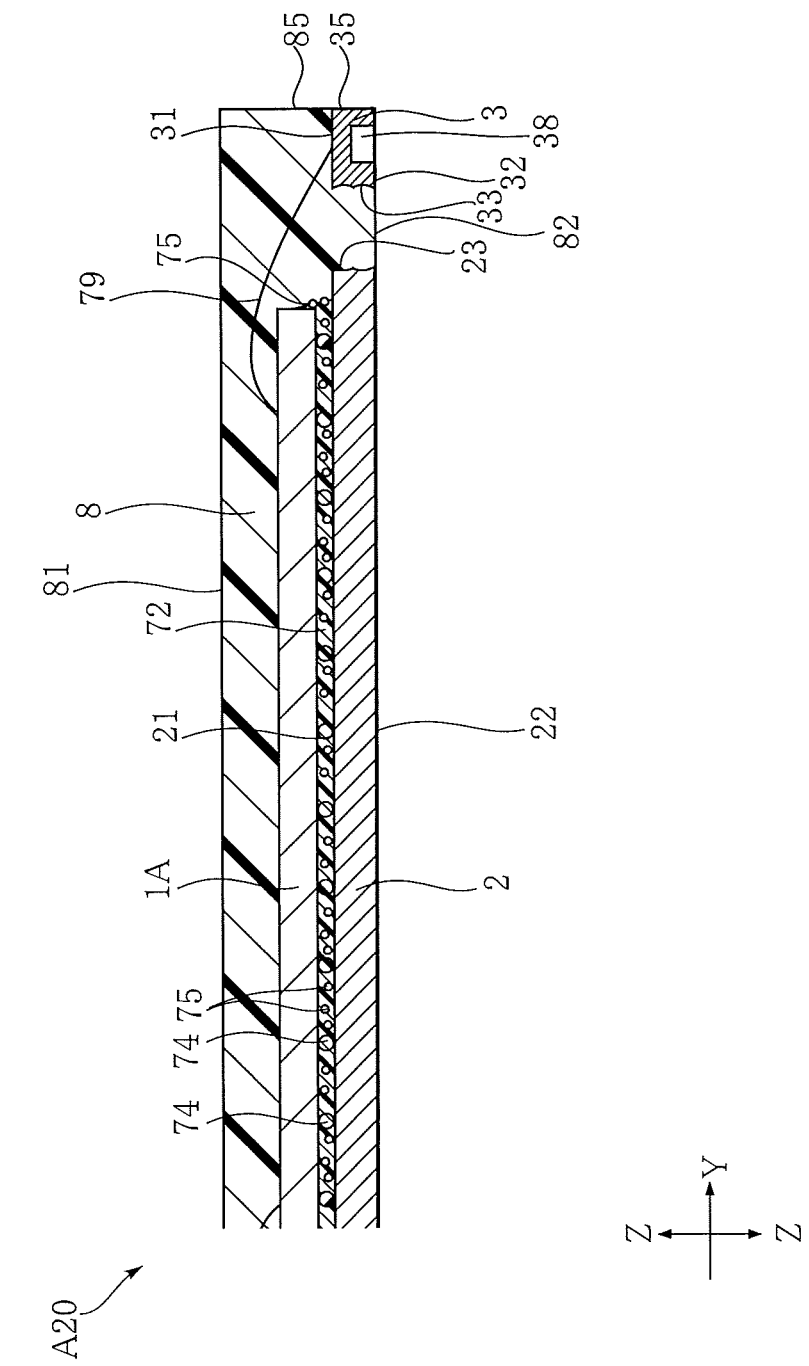
FIG. 30 is a partial cross-sectional view along a line XXX-XXX in FIG. 29.
Figure 31:
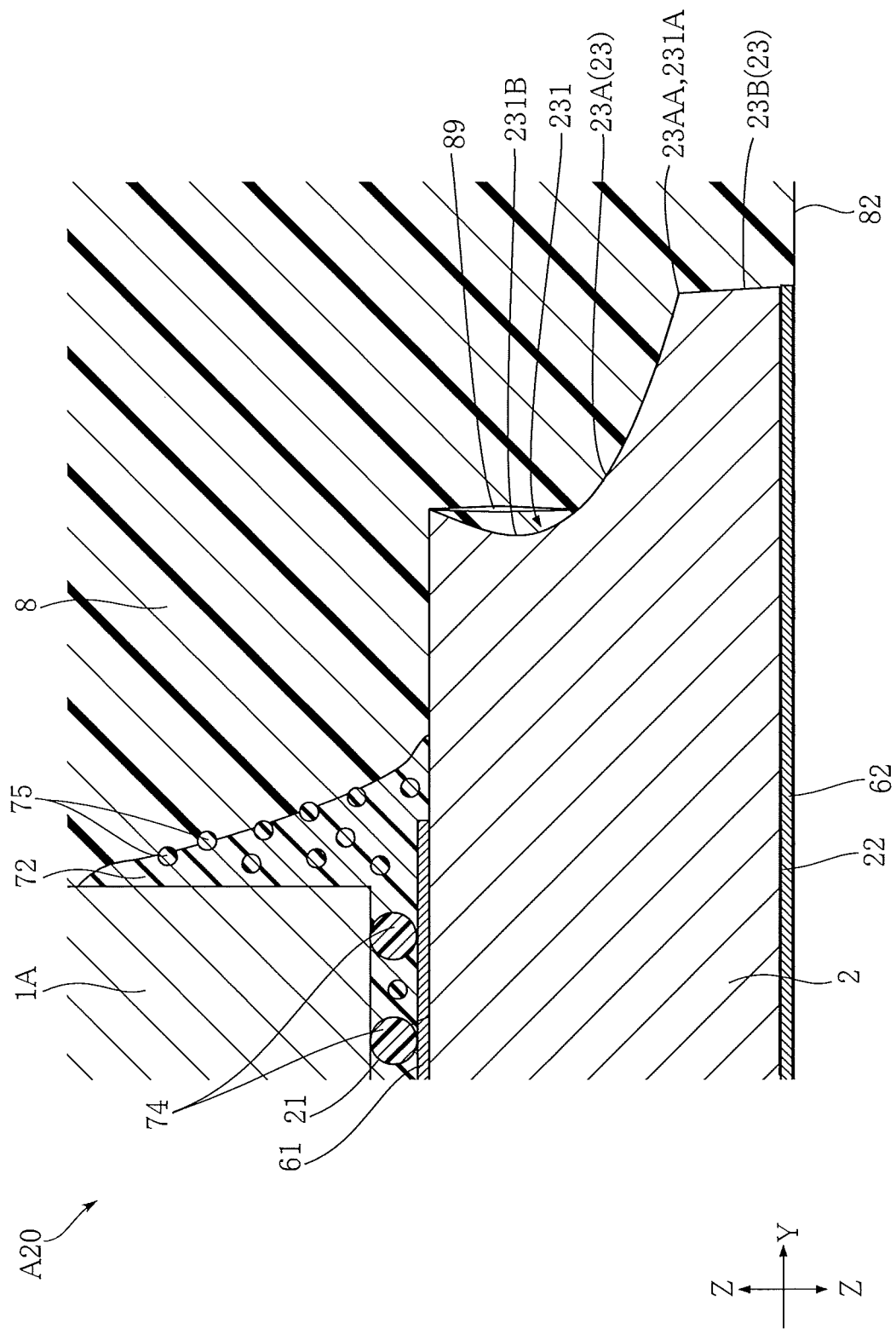
FIG. 31 is an enlarged partial view of a right side area in FIG. 30.

A second embodiment will be described with reference to FIGS. 29 to 31.

Figure 29:
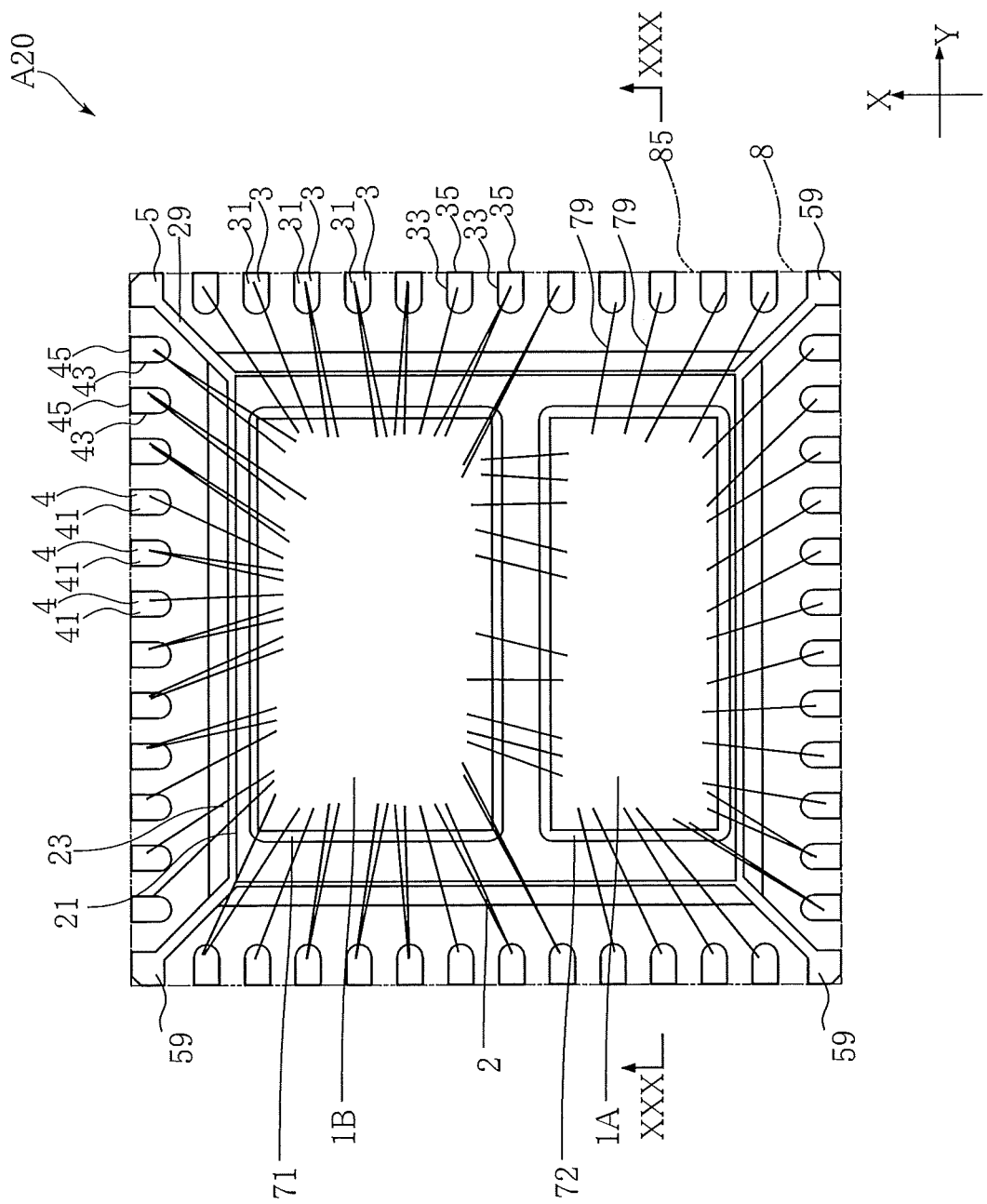
FIG. 29 is a plan view of an electronic device of a second embodiment.

FIG. 29 is a plan view of the electronic device A20 of the second embodiment. FIG. 30 is a partial cross-sectional view along a line XXX-XXX in FIG. 29. FIG. 31 is an enlarged partial view of a right side area in FIG. 30.

An electronic device A20 is provided with a first electronic element 1A, a second electronic element 1B, a main electrode 2, a plurality of first sub-electrodes 3, a plurality of second sub-electrodes 4, a dummy electrode 5, a front surface plating layer 61, a back surface plating layer 62, a joining layer 71, a joining part 72, a plurality of spacers 74, a plurality of fillers 75, a plurality of wires 79, and a sealing resin 8.

The electronic device A20 differs from the foregoing electronic device A10 with regard to the first electronic element 1A, the second electronic element 1B, the joining layer 71, the joining part 72, the plurality of spacers 74, the plurality of fillers 75, and the plurality of wires 79. Therefore, description of the other constituent elements including the main electrode 2, the plurality of first sub-electrodes 3, the plurality of second sub-electrodes 4, the dummy electrode 5, the front surface plating layer 61, the back surface plating layer 62 and the sealing resin 8 will be omitted in the present embodiment, because the description of the electronic device A10 can be applied.

In the present embodiment, the first electronic element 1A and the second electronic element 1B are semiconductor elements. The first electronic element 1A and the second electronic element 1B take on a rectangular shape, as seen in the thickness direction Z of the first electronic element 1A and the second electronic element 1B. The first electronic element 1A and the second electronic element 1B are disposed on the main electrode 2. Specifically, the first electronic element 1A and the second electronic element 1B are disposed on the main electrode front surface 21.

The joining layer 71 is interposed between the second electronic element 1B and the main electrode 2. The joining layer 71 is for joining the second electronic element 1B to the main electrode 2. The joining layer 71 directly contacts the second electronic element 1B and the front surface plating layer 61. The joining layer 71 contacts an area, of the main electrode surface 21, exposed from the front surface plating layer 61. In the present embodiment, the joining layer 71 is made of a conductive material. The joining layer 71 derives from a silver paste. The material constituting the joining layer 71 is Ag, for example. The joining layer 71 has a region that protrudes outside of the second electronic element 1B, as seen in the thickness direction Z.

The joining part 72 is interposed between the first electronic element 1A and the main electrode 2. The joining part 72 is for joining the first electronic element 1A to the main electrode 2. The joining part 72 directly contacts the first electronic element 1A and the front surface plating layer 61. The joining part 72 contacts an area, of the main electrode surface 21, exposed from the front surface plating layer 61. In the present embodiment, the joining part 72 consists of an insulating material. The joining part 72 has a region that protrudes outside of the first electronic element 1A, as seen in the thickness direction Z.

The plurality of spacers 74 have insulating properties and are mixed in the joining part 72. The plurality of spacers 74 each directly contact the first electronic element 1A. In the present embodiment, the plurality of spacers 74 each directly contact the front surface plating layer 61. The plurality of spacers 74 all have a spherical shape. The diameter of each of the plurality of spacers 74 is, for example, 5 to 15 µm. The material constituting the plurality of spacers 74 is a divinylbenzene polymer. The plurality of spacers 74 are dispersed, as seen in the thickness direction Z of the electronic element 1. The plurality of spacers 74 number ten or more, for example.

The plurality of fillers 75 have insulating properties and are mixed in the joining part 72. The volume of each of the plurality of fillers 75 is less than the volume of each of the plurality of spacers 74. The plurality of fillers 75 all have a spherical shape. The diameter of each of the plurality of fillers 75 is 1 to 3 µm. The material constituting the plurality of fillers 75 is, for example, $SiO_2$, an organic material, or a mixed material of an organic material and a non-organic material. The plurality of fillers 75 are dispersed, as seen in the thickness direction Z of the first electronic element 1A. The plurality of fillers 75 number ten or more, for example. As shown in FIG. 31, a portion of the plurality of fillers 75 are exposed from the joining part 72 and contact the sealing resin 8.

The plurality of wires 79 are each bonded to the first electronic element 1A or the second electronic element 1B. Any of the plurality of wires 79 is bonded to any of the plurality of first sub-electrodes 3 or any of the plurality of second sub-electrodes 4. In the present embodiment, the plurality of wires 79 are each bonded to any of the plurality of first sub-electrodes 3 or any of the plurality of second sub-electrodes 4 via the front surface plating layer 61. Any of the plurality of wires 79 is bonded to the first electronic element 1A and the second electronic element 1B. The plurality of wires 79 are not bonded to the dummy electrode 5.

Figure 32:
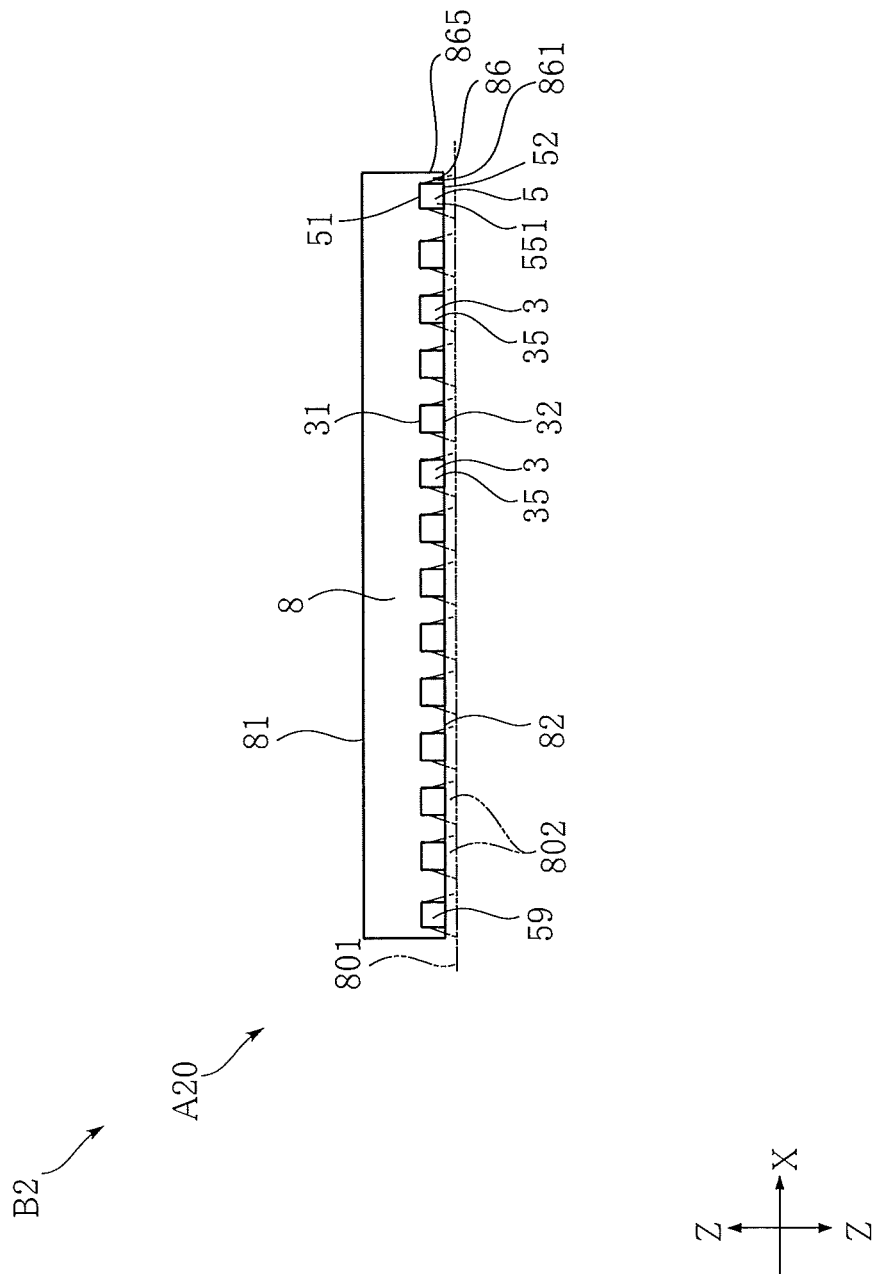
FIG. 32 is a right side view of a mounting structure including the electronic device of the second embodiment.

FIG. 32 is a right side view of a mounting structure B2 including the electronic device of the second embodiment.

The mounting structure B2 is provided with the electronic device A20, a circuit board 801, and a solder layer 802. The solder layer 802 is interposed between the circuit board 801 and the plurality of first sub-electrodes 3, between the circuit board 801 and the plurality of second sub-electrodes 4, and between the circuit board 801 and the dummy electrode 5. In the present embodiment, the first sub-electrode recessed part 38, the second sub-electrode recessed part 48 and the dummy electrode recessed part 58 are filled with the solder layer 802. The solder layer 802 also contacts the back surface plating layer 62.

According to the present embodiment, the following operation and effects are achieved, in addition to the operation and effects described in the first embodiment.

In the present embodiment, the plurality of insulating spacers 74 are mixed in the joining part 72. According to such a configuration, the plurality of spacers 74 define the distance by which the first electronic element 1A is separated from the main electrode 2. Accordingly, the first electronic element 1A can be prevented from contacting the main electrode 2, by the first electronic element 1A sloping relative to the main electrode 2. A fault involving the first electronic element 1A becoming electrically connected to the main electrode 2 can thereby be prevented.

In the present embodiment, a portion of the plurality of fillers 75 are exposed from the joining part 72 and contact the sealing resin 8. According to such a configuration, an uneven surface can be formed by the surface of the joining part 72 and the plurality of fillers 75. The uneven surface readily adheres to the sealing resin 8. Accordingly, even if the sealing resin 8 and the joining part 72 thermally expand and contract repeatedly when the electronic device A20 is in use, cracks are unlikely to occur in the sealing resin 8. Also, according to a configuration in which fillers 75 are exposed from the joining part 72, the joining part 72 is unlikely to expand outwardly. Therefore, the second electronic element 1B can be disposed in closer proximity to the first electronic element 1A. Accordingly, miniaturization of the electronic device A20 as seen in plan view (as seen in the thickness direction Z) can be attained.

The configuration of the present embodiment may be combined with the configuration of each modification of the first embodiment.

A first modification of the second embodiment will be described with reference to FIG. 33.

Figure 33:
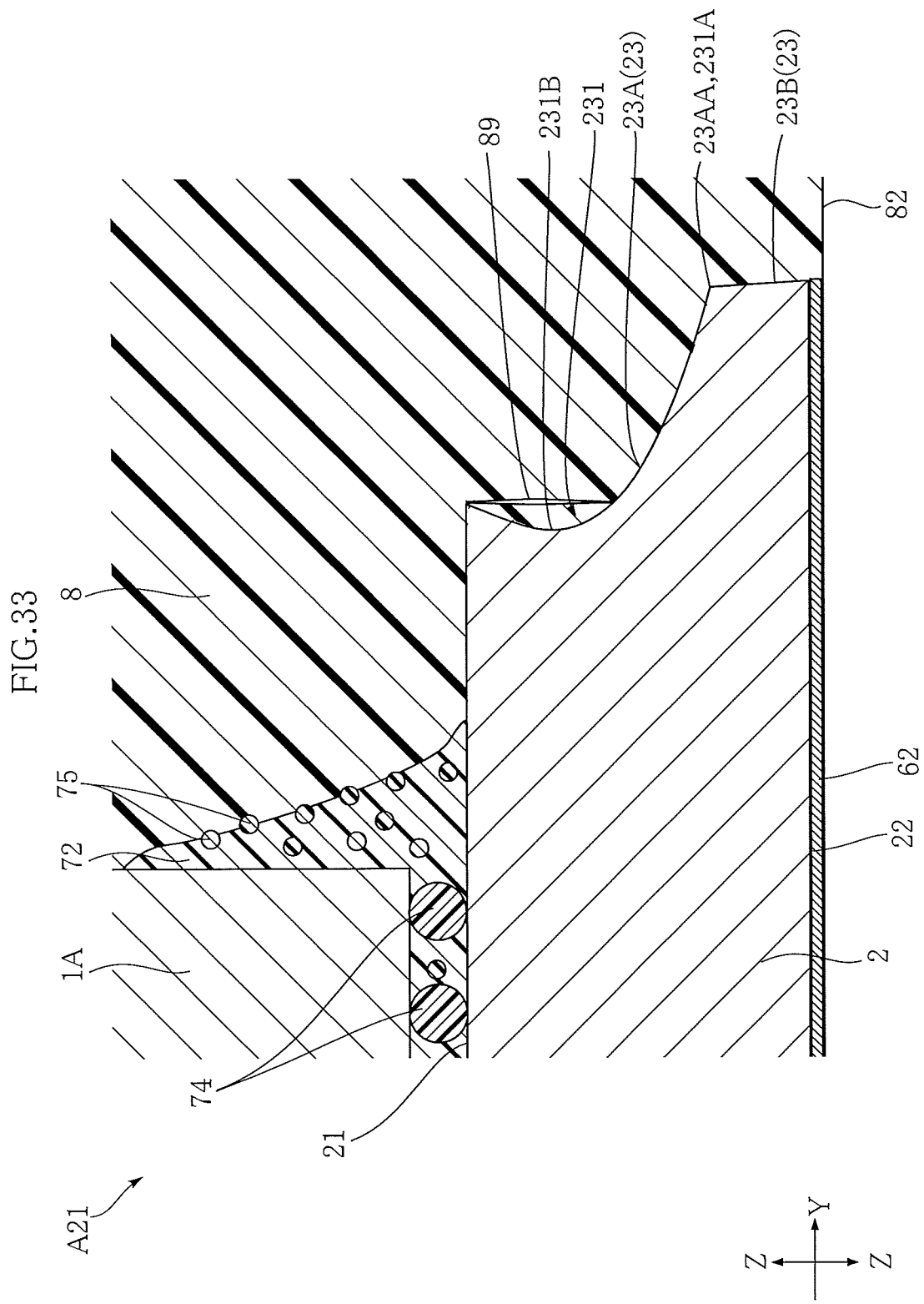
FIG. 33 is a cross-sectional view of an electronic device according to a first modification of the second embodiment.

FIG. 33 is a cross-sectional view of the electronic device A21 according to the first modification of the second embodiment.

An electronic device A21 of the present modification differs from the foregoing electronic device A20 in that the front surface plating layer 61 is not provided. In the present modification, the plurality of spacers 74 each directly contact the main electrode front surface 21.

Operation and effects similar to the operation and effects discussed in relation to the electronic device A20 are also achieved by such a configuration.

The configuration of the present modification may be combined with the configuration of each modification of the first embodiment.

A third embodiment will be described with reference to FIGS. 38 to 43.

Figure 34:
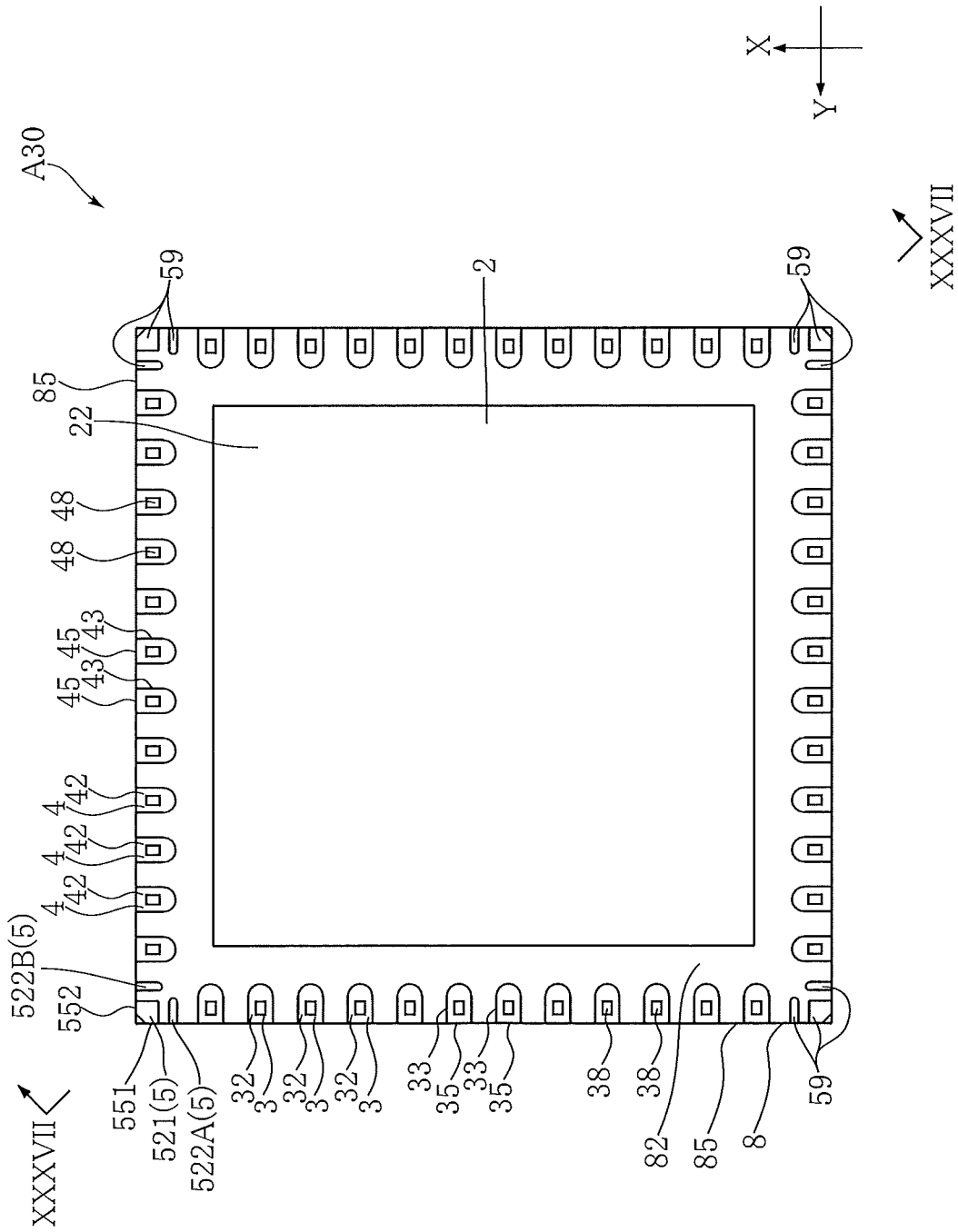
FIG. 34 is a bottom view of an electronic device of a third embodiment.
Figure 35:
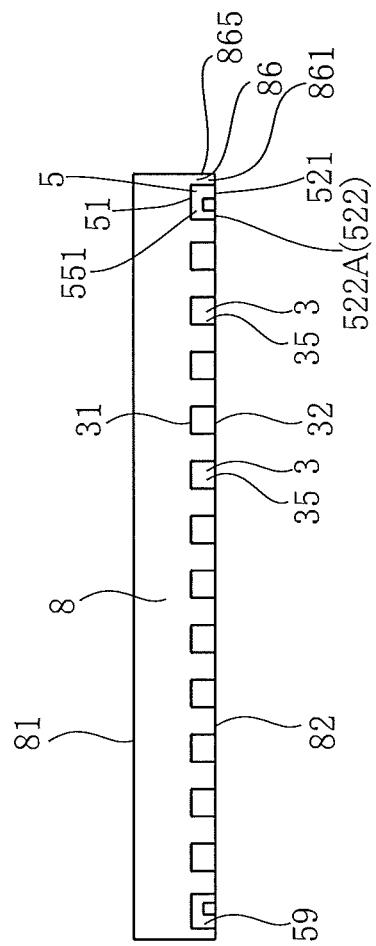
FIG. 35 is a right side view of the electronic device shown in FIG. 34.
Figure 36:
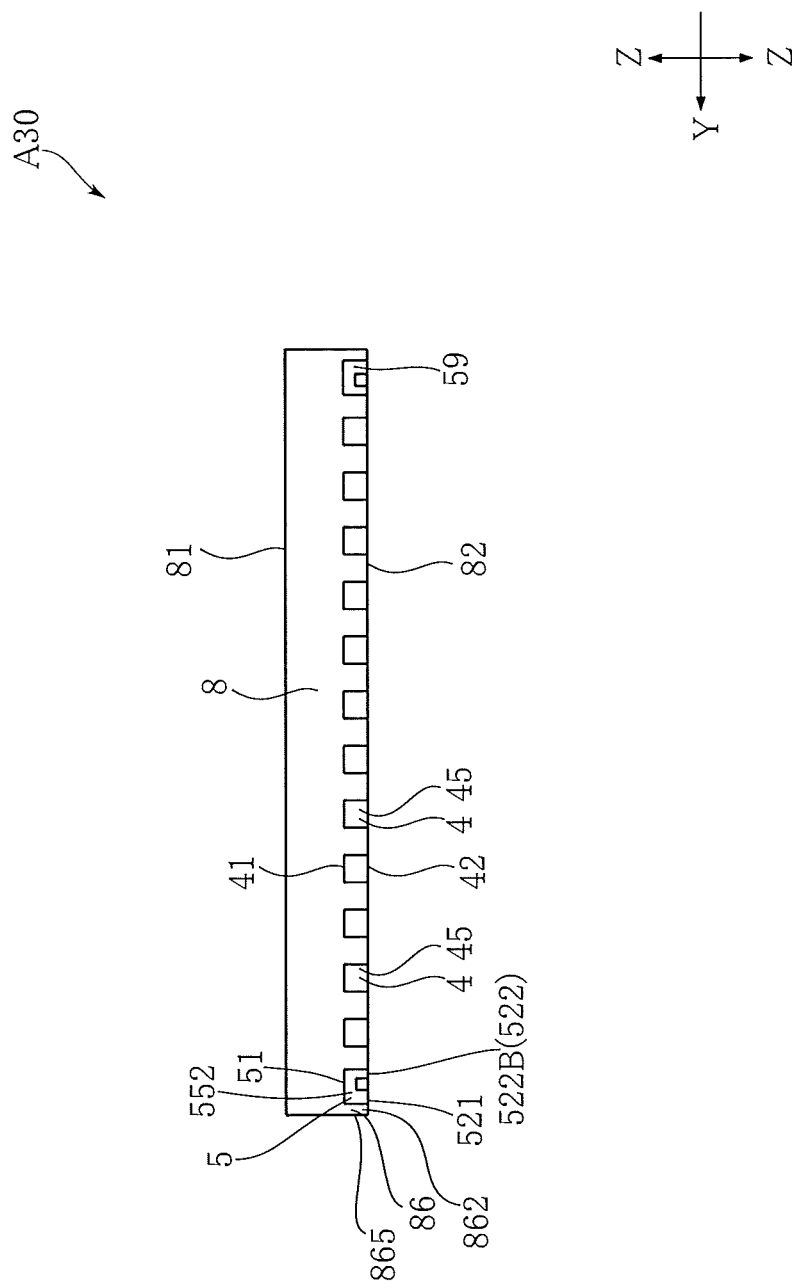
FIG. 36 is a rear view of the electronic device shown in FIG. 34.
Figure 37:
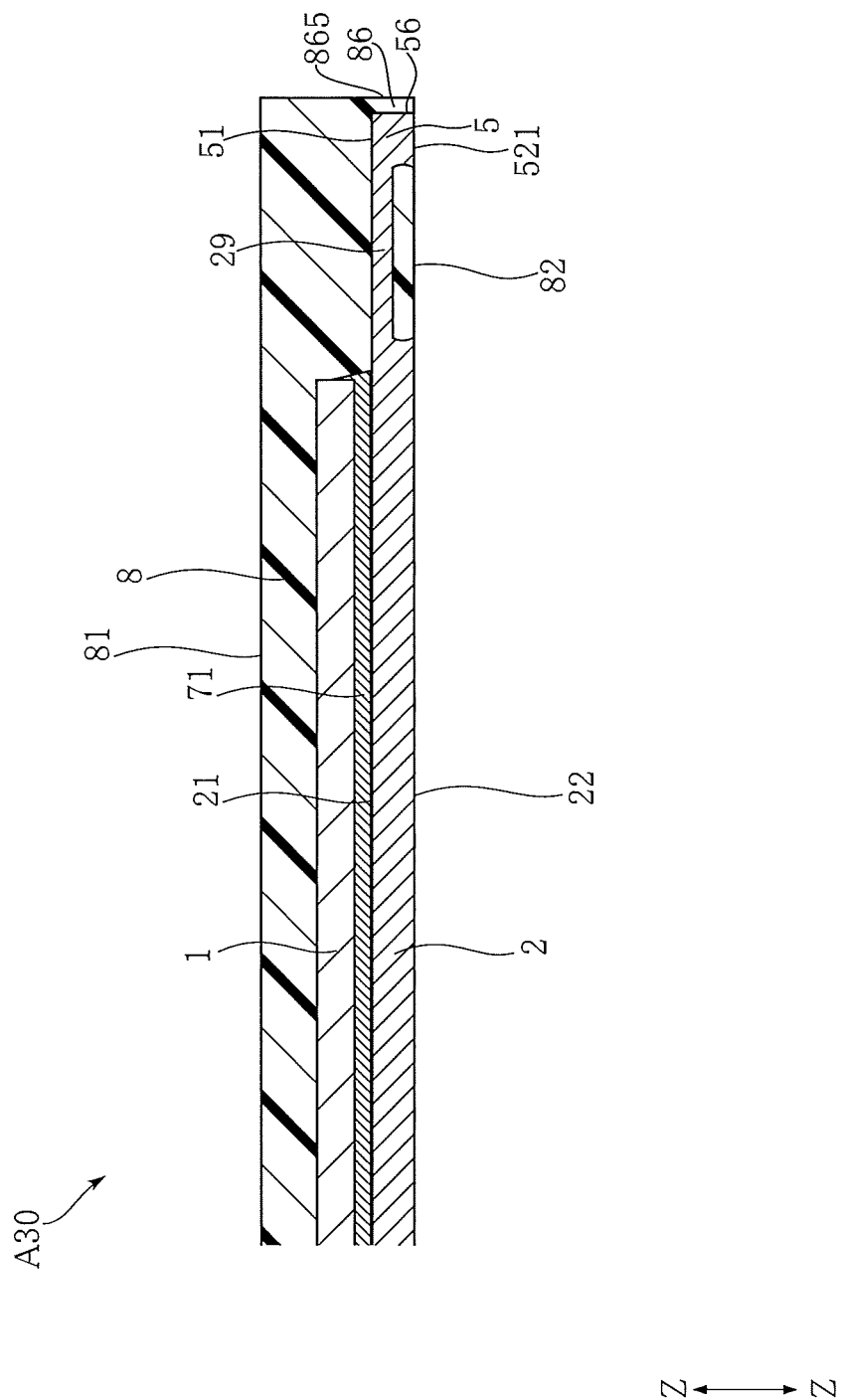
FIG. 37 is a partial cross-sectional view along a line XXXVII-XXXVII in FIG. 34.
Figure 38:
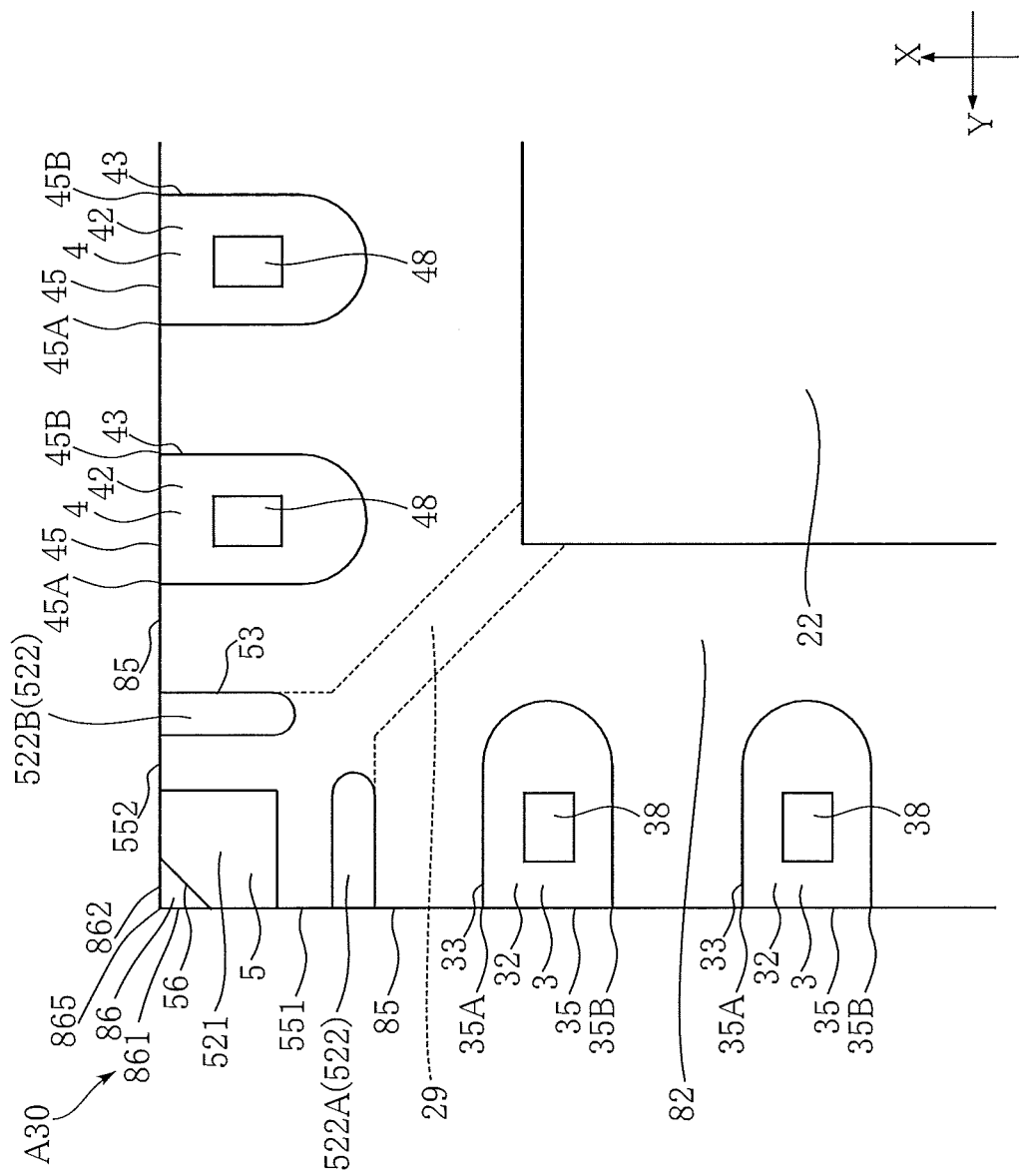
FIG. 38 is an enlarged partial view of an upper left area in FIG. 34.
Figure 39:
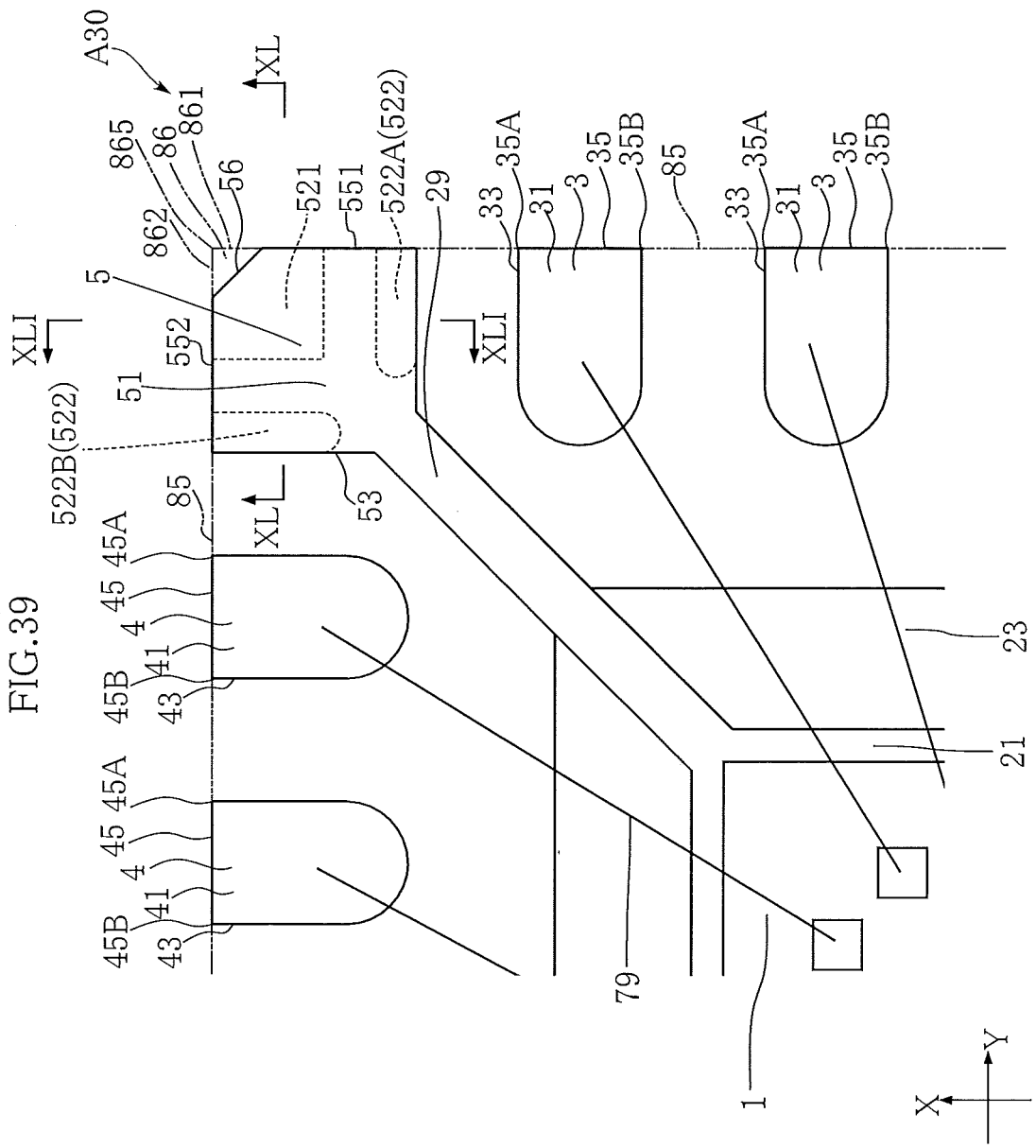
FIG. 39 is a partial enlarged plan view of the electronic device shown in FIG. 34 that corresponds to the opposite side of FIG. 38 (sealing resin is omitted).
Figure 40:
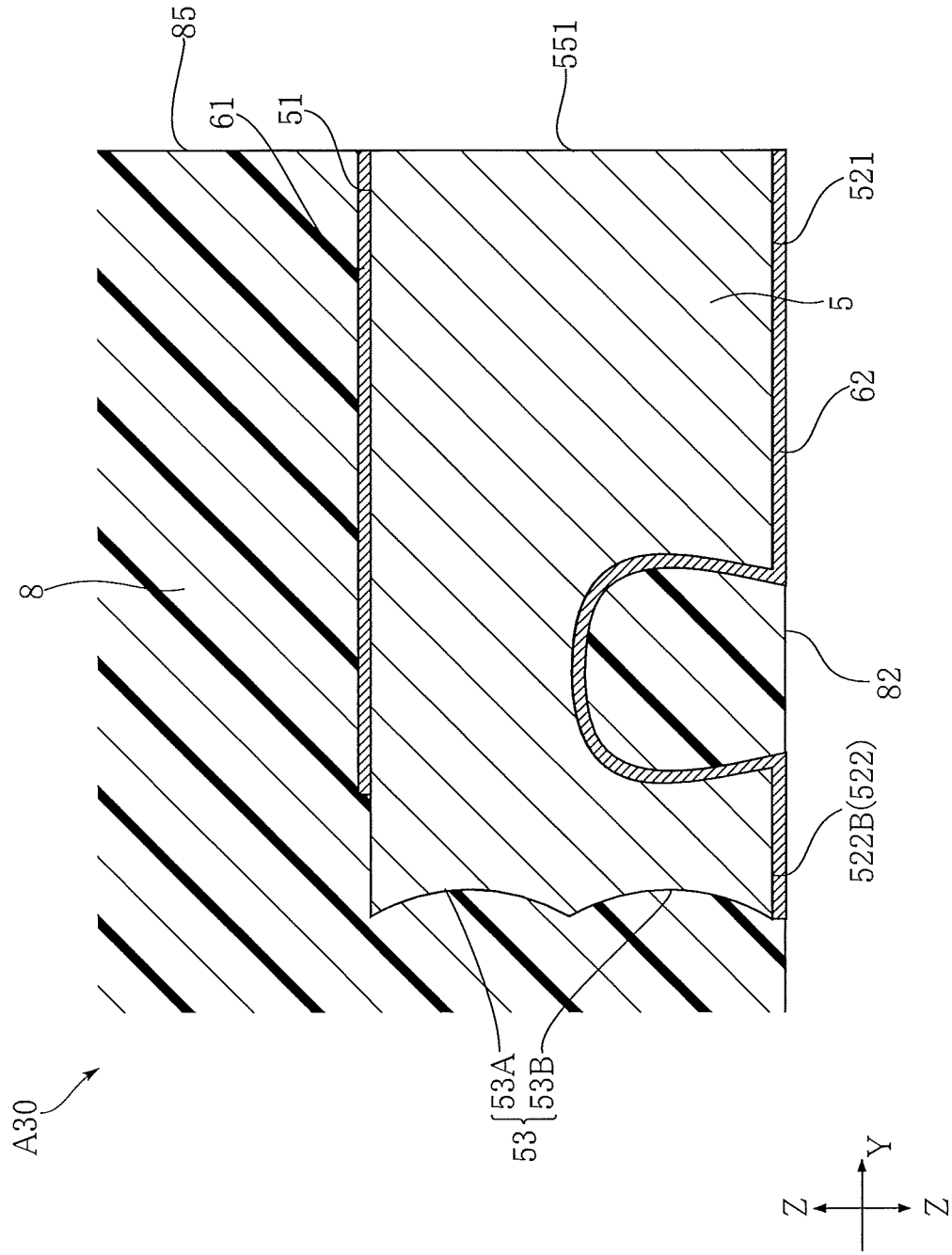
FIG. 40 is a partial cross-sectional view along a line XL-XL in FIG. 39.
Figure 41:
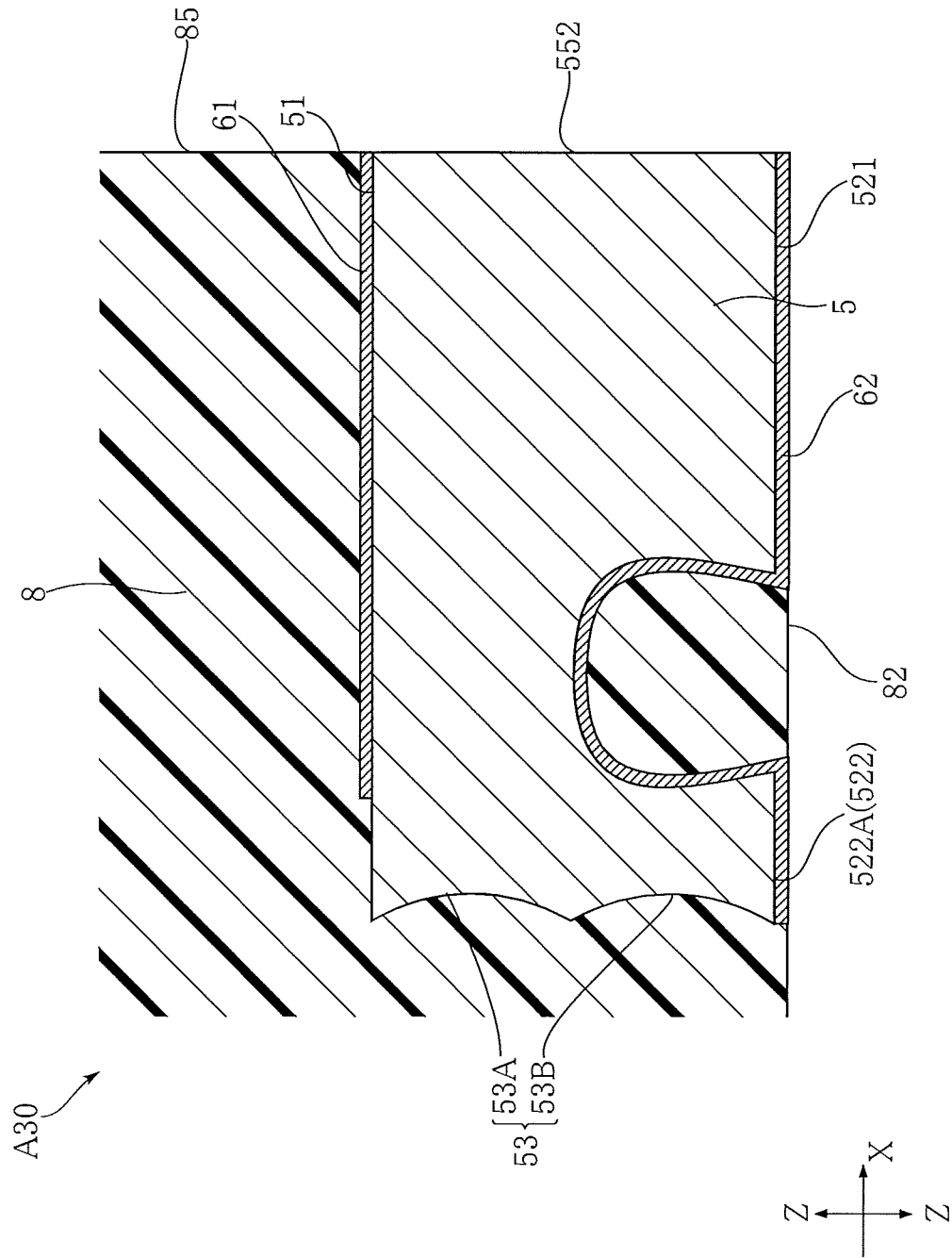
FIG. 41 is a partial cross-sectional view along a line XLI-XLI in FIG. 39.

FIG. 34 is a bottom view of an electronic device A30 of the third embodiment. FIG. 35 is a right side view of the electronic device A30. FIG. 36 is a rear view of the electronic device A30. FIG. 37 is a partial cross-sectional view along a line XXXVII-XXXVII in FIG. 34. FIG. 38 is an enlarged partial view of an upper left area in FIG. 34. FIG. 39 is a partial enlarged plan view of the electronic device A30 that corresponds to the opposite side of FIG. 38. FIG. 40 is a partial cross-sectional view along a line XL-XL in FIG. 39. FIG. 41 is a partial cross-sectional view along a line XLI-XLI in FIG. 39. Note that FIG. 39 omits the sealing resin 8, and the resin lateral surface 85 and the resin corner part 86 are respectively illustrated by virtual lines (two-dot chain lines).

The electronic device A30 is provided with an electronic element 1, a main electrode 2, a plurality of first sub-electrodes 3, a plurality of second sub-electrodes 4, a dummy electrode 5, a front surface plating layer 61, a back surface plating layer 62, a joining layer 71, a plurality of wires 79, and a sealing resin 8.

The electronic device A30 of the present embodiment differs from the foregoing electronic device A10 and electronic device A20 in the shape of the dummy electrode 5. Therefore, in the present embodiment, matters concerning the dummy electrode 5 will be described, and description of other matters will be omitted in the present embodiment because the description of the electronic device A10 can be applied.

Dummy electrodes 5 including three additional dummy electrodes 59 are respectively disposed at the four corners of the sealing resin 8. The dummy electrodes 5 each have a dummy electrode front surface 51, a dummy electrode main back surface 521, a dummy electrode sub-back surface 522, a dummy electrode lateral surface 53, a dummy electrode first outer surface 551, a dummy electrode second outer surface 552, and an erect sloping surface 56. In the present embodiment, the dummy electrodes 5 are insulated from all of the plurality of first sub-electrodes 3 and the plurality of second sub-electrodes 4.

As shown in FIGS. 34 and 38, the dummy electrode main back surface 521 and the dummy electrode sub-back surface 522 are both exposed from a resin back surface 82 of the sealing resin 8. In the present embodiment, the dummy electrode sub-back surface 522 includes a dummy electrode first sub-back surface 522A that is located in the first direction X and a dummy electrode second sub-back surface 522B that is located in the second direction Y. The dummy electrode first sub-back surface 522A has a band-like shape extending in the second direction Y. The dummy electrode second sub-back surface 522B has a band-like shape extending in the first direction X. Also, in the present embodiment, the dummy electrode main back surface 521 and the dummy electrode sub-back surface 522 are exposed in a state of being spaced from each other on the resin back surface 82. More specifically, as shown in FIG. 38, the dummy electrode main back surface 521 and the dummy electrode first sub-back surface 522A are exposed from the resin back surface 82 in a state of being spaced from each other in the first direction X. The dummy electrode main back surface 521 and the dummy electrode second sub-back surface 522B are exposed from the resin back surface 82 in a state of being spaced from each other in the second direction Y. As shown in FIGS. 40 and 41, the dummy electrode main back surface 521, the dummy electrode first sub-back surface 522A and the dummy electrode second sub-back surface 522B are all flat.

As shown in FIG. 37, the dummy electrode 5 is coupled to an end part of an extended part 29 that extends outside the main electrode 2 from the main electrode 2. The dummy electrode main back surface 521 and the dummy electrode sub-back surface 522 are, similarly to the extended part 29, formed by a portion remaining as a result of partially etching only a lower half cross-section in the thickness direction Z of a lead frame. Here, as shown in FIGS. 40 and 41, a cavity part of the dummy electrode 5 that is located between the dummy electrode main back surface 521 and the dummy electrode sub-back surface 522 in the first direction X or the second direction Y is filled with the sealing resin 8.

The dummy electrode front surface 51 faces in the opposite direction to the dummy electrode main back surface 521 and the dummy electrode sub-back surface 522. As shown in FIG. 39, the shape of the dummy electrode front surface 51 is substantially the same as the dummy electrode front surface 51 of the electronic device A10. Also, as shown in FIGS. 40 and 41, the dummy electrode front surface 51 is flat. The dummy electrode front surface 51 is entirely covered by the sealing resin 8.

As shown in FIGS. 35, 38 and 39, the dummy electrode first outer surface 551 faces in the second direction Y. The dummy electrode first outer surface 551 connects the dummy electrode front surface 51 to the dummy electrode main back surface 521, and the dummy electrode front surface 51 to the dummy electrode first sub-back surface 522A. The dummy electrode first outer surface 551 is exposed from the resin lateral surface 85 of the sealing resin 8.

As shown in FIGS. 36, 38 and 39, the dummy electrode second outer surface 552 faces in the first direction X. The dummy electrode second outer surface 552 connects the dummy electrode front surface 51 to the dummy electrode main back surface 521, and the dummy electrode front surface 51 to the dummy electrode second sub-back surface 522B. The dummy electrode second outer surface 552 is exposed from the resin lateral surface 85 of the sealing resin 8.

As shown in FIGS. 37 and 38, the erect sloping surface 56 stands erect from the dummy electrode main back surface 521, and slopes relative to the dummy electrode first outer surface 551 and the dummy electrode second outer surface 552. The erect sloping surface 56 is connected to the dummy electrode first outer surface 551 and the dummy electrode second outer surface 552. The erect sloping surface 56 faces outside the sealing resin 8, as seen in the thickness direction Z of the electronic element 1. A resin corner part 86 of the sealing resin 8 that covers the erect sloping surface 56 is formed on the outside thereof. The shape of the resin corner part 86 is substantially the same as the resin corner part 86 of the electronic device A10.

As shown in FIGS. 40 and 41, the dummy electrode lateral surface 53 connects the dummy electrode front surface 51 to the dummy electrode first sub-back surface 522A or the dummy electrode front surface 51 to the dummy electrode second sub-back surface 522B. The dummy electrode lateral surface 53 is entirely covered by the sealing resin 8. The dummy electrode lateral surface 53 includes the dummy upper portion 53A and the dummy lower portion 53B. The dummy upper portion 53A and the dummy lower portion 53B are similar to the dummy upper portion 53A and the dummy lower portion 53B of the electronic device A10, and thus description thereof will be omitted here.

As shown in FIGS. 40 and 41, the back surface plating layer 62 has a region formed on the dummy electrode main back surface 521 and the dummy electrode sub-back surface 522. The back surface plating layer 62 is made of Sn, for example. Here, the back surface plating layer 62 also has a region formed on the inner surface of the cavity part of the dummy electrode 5 that is located between the dummy electrode main back surface 521 and the dummy electrode sub-back surface 522 in the first direction X or the second direction Y. Note that illustration of the back surface plating layer 62 is omitted in figures other than FIGS. 40 and 41.

Figure 42:
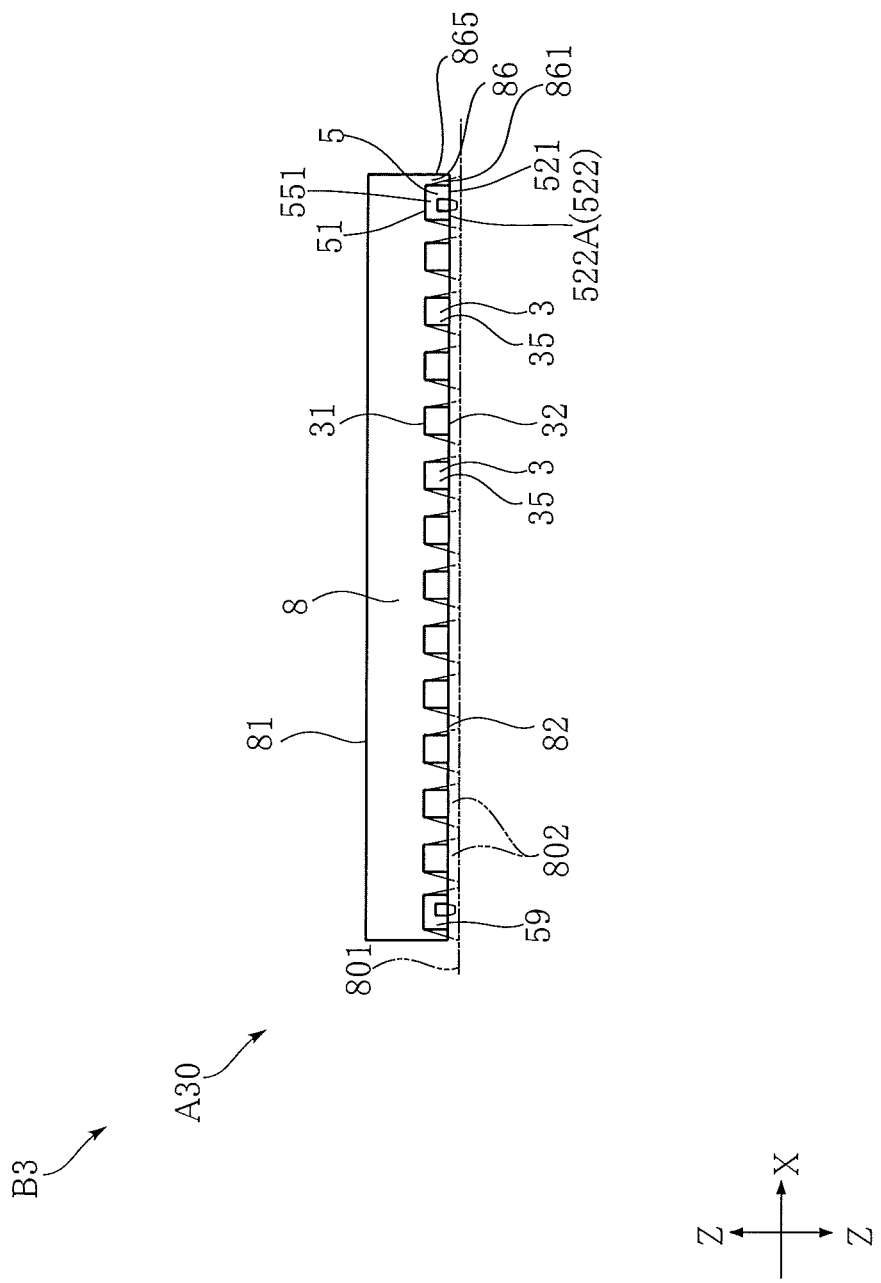
FIG. 42 is a right side view of a mounting structure including the electronic device of the third embodiment.
Figure 43:
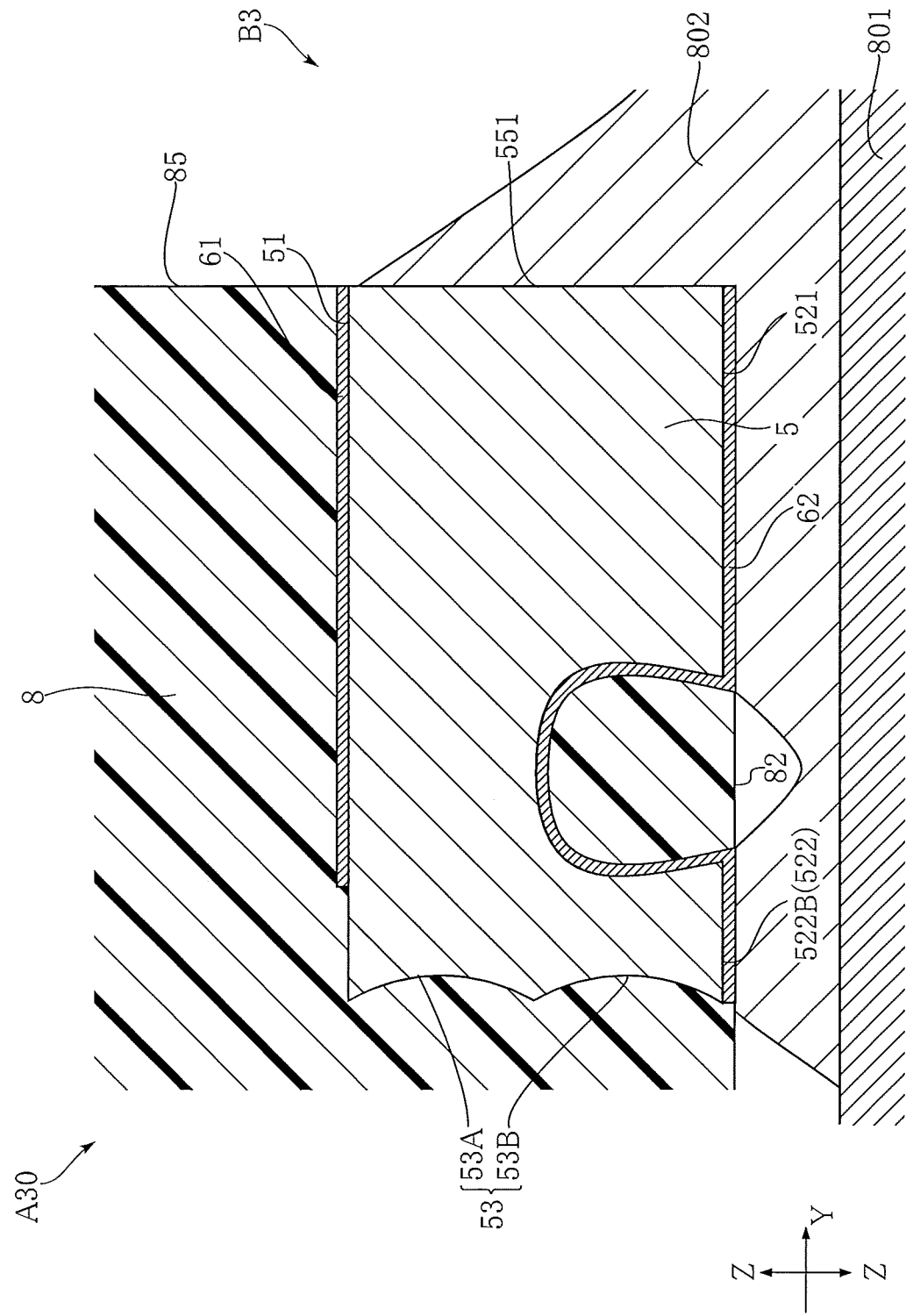
FIG. 43 is a partial cross-sectional view of the mounting structure (corresponds to FIG. 40).

FIG. 42 is a right side view of a mounting structure B3 including the electronic device of the third embodiment. FIG. 43 is a partial cross-sectional view of the mounting structure B3. FIG. 43 corresponds to FIG. 40.

The mounting structure B3 is provided with the electronic device A30, a circuit board 801, and a solder layer 802. The solder layer 802 is interposed between the circuit board 801 and the plurality of first sub-electrodes 3, between the circuit board 801 and the plurality of second sub-electrodes 4, and between the circuit board 801 and the dummy electrode 5. In the present embodiment, the solder layer 802 is interposed between the dummy electrode main back surface 521 and the circuit board 801 and between the dummy electrode sub-back surface 522 and the circuit board 801. Here, as shown in FIG. 43, the solder layer 802 does not adhere to the resin back surface 82 of the sealing resin 8 that is located between the dummy electrode main back surface 521 and the dummy electrode second sub-back surface 522B in the second direction Y. Similarly, the solder layer 802 does not adhere to the resin back surface 82 that is located between the dummy electrode main back surface 521 and the dummy electrode second sub-back surface 522B in the first direction X (illustration omitted). Note that the first sub-electrode recessed part 38 and the second sub-electrode recessed part 48 are also respectively filled with the solder layer 802 in the present embodiment, similarly to the electronic device A10. The solder layer 802 also contacts the back surface plating layer 62.

According to the present embodiment, the following operation and effects are achieved, in addition to the operation and effects described in the first embodiment.

In the present embodiment, the dummy electrode main back surface 521 and the dummy electrode sub-back surface 522 are exposed in a state of being spaced from each other on the resin back surface 82 of the sealing resin 8. Here, the inventors revealed that thermal stress generated in the solder layer 802 due to the temperature cycle when the electronic device A30 is in use is mostly concentrated in the solder layer 802 that is interposed between the dummy electrodes 5 that are located at the four corners of the sealing resin 8 and the circuit board 801. In the present embodiment, the dummy electrode main back surface 521 is located at the outermost edge of the four corners. The dummy electrode first sub-back surface 522A is located in the first direction X and the dummy electrode second sub-back surface 522B is located in the second direction Y, adjacent to the dummy electrode main back surface 521. According to such a configuration, thermal stress generated in the solder layer 802 that is interposed between the dummy electrode first sub-back surface 522A and the circuit board 801 or the dummy electrode second sub-back surface 522B and the circuit board 801 is reduced to less than thermal stress generated in the solder layer 802 that is interposed between the dummy electrode back surface 52 of the electronic device A10 and the circuit board 801. Therefore, even if a crack occurs in the solder layer 802 that is interposed between the dummy electrode main back surface 521 and the circuit board 801, the crack can be prevented from spreading by the solder layer 802 that is interposed between the dummy electrode first sub-back surface 522A and the circuit board 801 or the dummy electrode second sub-back surface 522B and the circuit board 801. Accordingly, cracks can be more effectively prevented from occurring in the solder layer 802 that is interposed between each of the first sub-electrodes 3 and the circuit board 801 or each of the second sub-electrodes 4 and the circuit board 801.

The configuration of the present embodiment may be combined with the configuration of each modification of the first embodiment or the second embodiment.

A first modification of the third embodiment will be described with reference to FIGS. 44 to 48.

Figure 44:
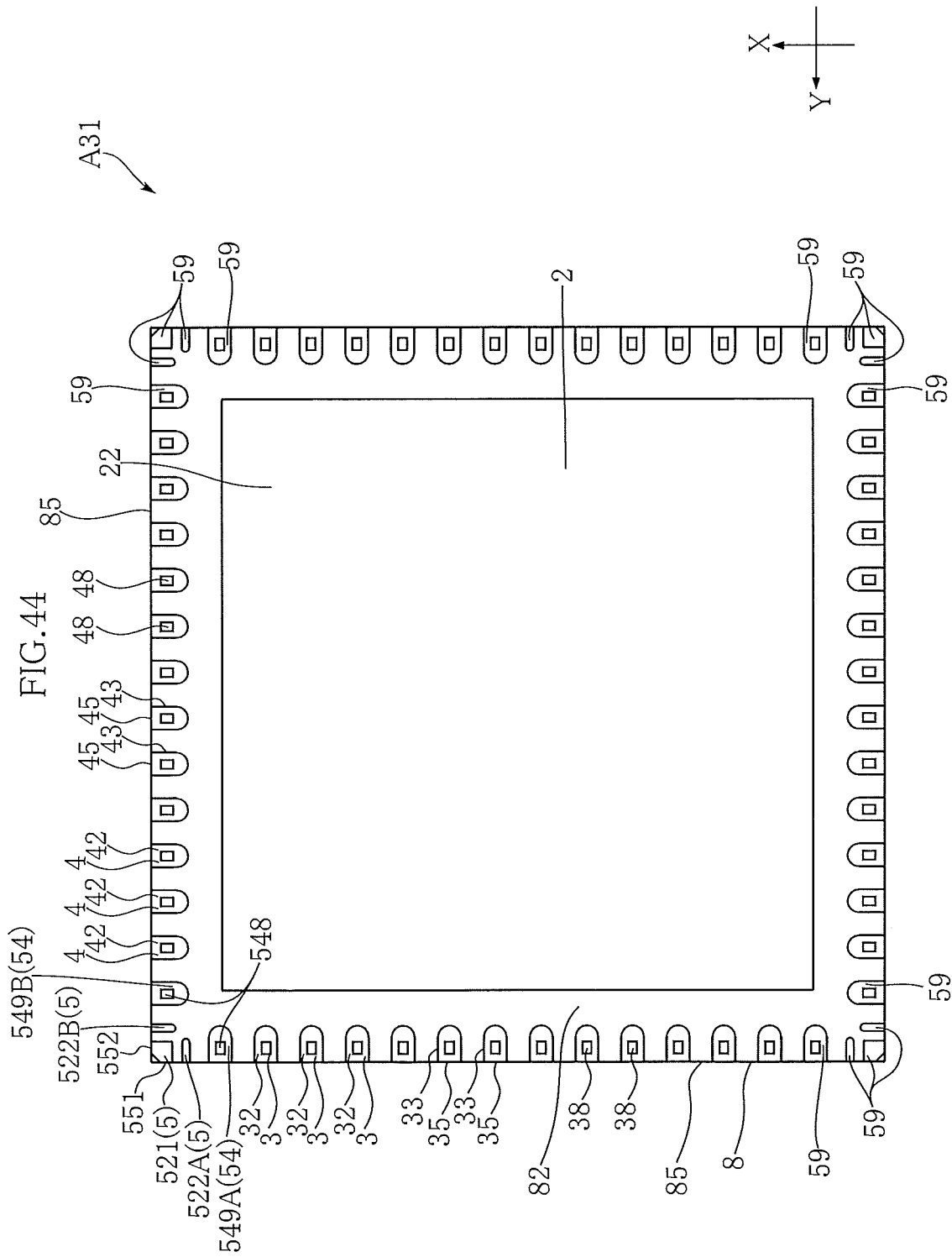
FIG. 44 is a bottom view of an electronic device according to a first modification of the third embodiment.
Figure 45:
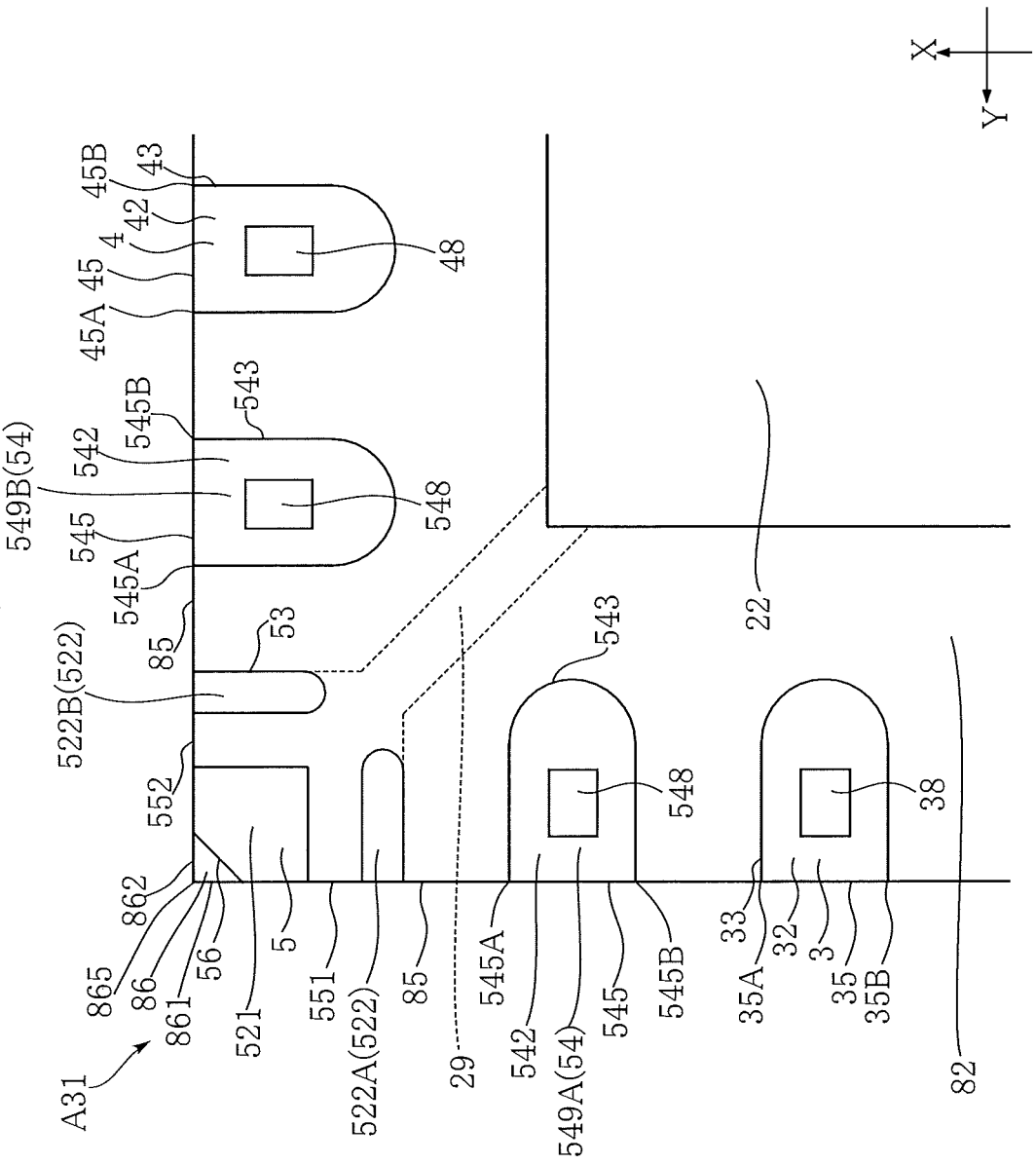
FIG. 45 is an enlarged partial view of an upper left area in FIG. 44.
Figure 46:
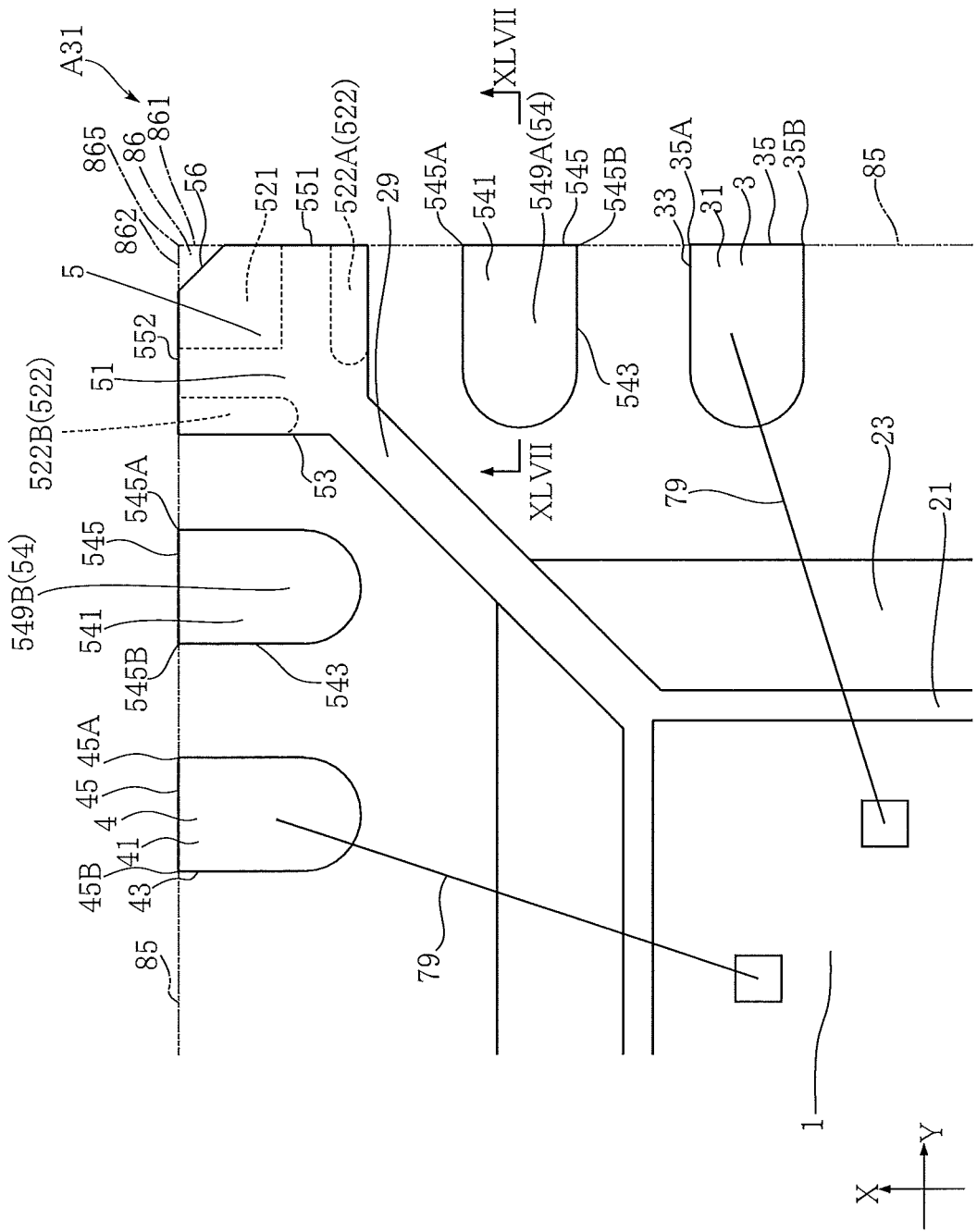
FIG. 46 is a partial enlarged plan view of the electronic device shown in FIG. 44 that corresponds to the opposite side of FIG. 45 (sealing resin is omitted).

FIG. 44 is a bottom view of an electronic device A31 according to the first modification of the third embodiment. FIG. 45 is an enlarged partial view of an upper left area in FIG. 44. FIG. 46 is a partial enlarged plan view of the electronic device A31 that corresponds to the opposite side of FIG. 45. FIG. 47 is a partial cross-sectional view along a line XLVII-XLVII in FIG. 46. Note that FIG. 46 omits the sealing resin 8, and the resin lateral surface 85 and the resin corner part 86 are respectively illustrated with virtual lines (two-dot chain lines).

The electronic device A31 of the present modification differs from the foregoing electronic device A30 in that an independent dummy electrode 54 is further provided.

The independent dummy electrode 54 shown in FIGS. 44, 45 and 46 is not coupled to the dummy electrode 5. Also, the independent dummy electrode 54 is insulated from all of the plurality of first sub-electrodes 3, the plurality of second sub-electrodes 4 and the dummy electrodes 5 including the additional dummy electrodes 59. In the present modification, the independent dummy electrode 54 includes a first independent dummy electrode 549A that is disposed in the first direction X and is located between the plurality of first sub-electrodes 3 and the dummy electrode 5, and a second independent dummy electrode 549B that is disposed in the second direction Y and is located between the plurality of second sub-electrodes 4 and the dummy electrode 5. The independent dummy electrode 54 is made of a conductive material. The independent dummy electrode 54 is formed by patterning such as etching or the like being performed on a metal plate made of Cu, for example.

As shown in FIG. 44, only in the present modification do the three additional dummy electrodes 59 other than dummy electrode 5 that is disposed in one of the four corners of the sealing resin 8 indicate assemblies that are constituted by the dummy electrode 5, the first independent dummy electrode 549A, and the second independent dummy electrode 549B.

In the present modification, the shape of the first independent dummy electrode 549A and the first sub-electrodes 3 are respectively the same as the shape of the second independent dummy electrode 549B and the second sub-electrodes 4. Note that the independent dummy electrode 54 can also take any shape other than the shape in the present modification. As shown in FIG. 47, the independent dummy electrode 54 has an independent dummy electrode front surface 541, an independent dummy electrode back surface 542, an independent dummy electrode lateral surface 543, and an independent dummy electrode outer surface 545.

The independent dummy electrode front surface 541 faces in one thickness direction Z. In the present modification, the independent dummy electrode front surface 541 is a portion corresponding to a first sub-electrode front surface 31 of the first sub-electrode 3 or a second sub-electrode front surface 41 of the second sub-electrodes 4. The independent dummy electrode front surface 541 is flat. The independent dummy electrode front surface 541 is entirely covered by the sealing resin 8.

The independent dummy electrode back surface 542 faces in the other thickness direction Z. In the present modification, the independent dummy electrode back surface 542 is a portion corresponding to a first sub-electrode back surface 32 of the first sub-electrode 3 or a second sub-electrode back surface 42 of the second sub-electrodes 4. The independent dummy electrode back surface 542 faces in the opposite direction to the independent dummy electrode front surface 541. The independent dummy electrode back surface 542 is flat. The independent dummy electrode back surface 542 is exposed from the resin back surface 82 of the sealing resin 8.

The independent dummy electrode outer surface 545 faces in the first direction X or the second direction Y. In the present modification, the independent dummy electrode outer surface 545 is a portion corresponding to a first sub-electrode outer surface 35 of the first sub-electrodes 3 or a second sub-electrode outer surface 45 of the second sub-electrodes 4. Also, in the present modification, the independent dummy electrode outer surface 545 is exposed from the resin lateral surface 85 of the sealing resin 8. Accordingly, the first independent dummy electrode 549A and the second independent dummy electrode 549B are both exposed from the resin lateral surface 85.

The independent dummy electrode lateral surface 543 connects the independent dummy electrode front surface 541 to the independent dummy electrode back surface 542. In the present modification, the independent dummy electrode lateral surface 543 is a portion corresponding to a first sub-electrode lateral surface 33 of the first sub-electrodes 3 or a second sub-electrode lateral surface 43 of the second sub-electrodes 4. The independent dummy electrode lateral surface 543 stands erect from the independent dummy electrode back surface 542. The second sub-electrode lateral surface 43 is covered by the sealing resin 8. As shown in FIGS. 45 and 46, the dummy electrode lateral surface 53 connects an end part 545A of the independent dummy electrode outer surface 545 to an end part 545B of the independent dummy electrode outer surface 545. The independent dummy electrode lateral surface 543 includes an independent dummy upper portion 543A and an independent dummy lower portion 543B. The independent dummy upper portion 543A and the independent dummy lower portion 543B are similar to the first sub-upper portion 33A and the first sub-lower portion 33B of the first sub-electrodes 3 or the second sub-upper portion 43A and the second sub-lower portion 43B of the second sub-electrodes 4, and thus description thereof will be omitted here.

An independent dummy electrode recessed part 548 is formed in each of the independent dummy electrode 54. In the present modification, the independent dummy electrode recessed part 548 is a portion corresponding to the first sub-electrode recessed part 38 of the first sub-electrodes or the second sub-electrode recessed part 48 of the second sub-electrodes 4. The independent dummy electrode recessed part 548 is recessed from the independent dummy electrode back surface 542. The outline of the opening of the independent dummy electrode recessed part 548 has a shape that fits inside the outer edge of the independent dummy electrode back surface 542. In the present modification, the outline of the opening of the independent dummy electrode recessed part 548 has a rectangular shape. The outline of the opening of the independent dummy electrode recessed part 548 may have a different shape from the present modification, such as a circular shape or a polygonal shape.

An inner surface 548A of the independent dummy electrode recessed part 548 has a tip region 548B that is connected to the independent dummy electrode back surface 542. The tip region 548B of the inner surface 548A of the independent dummy electrode recessed part 548 slopes in the thickness direction Z of the electronic element 1, such that the area of a cross-section along a plane that is orthogonal to the thickness direction Z of the electronic element 1 gradually increases as the distance from the independent dummy electrode back surface 542 increases. The independent dummy electrode recessed part 548 thereby has a shape in which the opening narrows.

As shown in FIG. 47, the back surface plating layer 62 has a region formed on the independent dummy electrode back surface 542. The back surface plating layer 62 is made of Sn, for example. In the present modification, the back surface plating layer 62 is further formed on the inner surface 548A of the independent dummy electrode recessed part 548. Note that illustration of the back surface plating layer 62 is omitted in figures other than FIG. 47.

As shown in FIG. 46, in the present modification, the plurality of wires 79 are not bonded to either the first independent dummy electrode 549A or the second independent dummy electrode 549B.

FIG. 48 is a partial cross-sectional view of a mounting structure B31 including the electronic device according to the first modification of the third embodiment. FIG. 48 corresponds to FIG. 47.

The mounting structure B31 is provided with the electronic device A31, a circuit board 801, and a solder layer 802. The solder layer 802 is interposed between the circuit board 801 and the plurality of first sub-electrodes 3, between the circuit board 801 and the plurality of second sub-electrodes 4, between the circuit board 801 and the dummy electrode 5, and between the circuit board 801 and the independent dummy electrode 54. In the present modification, the first sub-electrode recessed part 38, the second sub-electrode recessed part 48 and the independent dummy electrode recessed part 548 are filled with the solder layer 802. The solder layer 802 also contacts the back surface plating layer 62.

According to the present modification, the following operation and effects are achieved, in addition to the operation and effects described in the third embodiment.

In the present modification, the independent dummy electrode 54 that is not coupled to the dummy electrode 5 is further provided. The independent dummy electrode 54 is disposed between the dummy electrode 5 and the plurality of first sub-electrodes 3 or the dummy electrode and the plurality of second sub-electrodes 4, in the four corners of the sealing resin 8 of the electronic device A31. Therefore, the plurality of first sub-electrode 3 are arrayed in a state of being sandwiched on both sides by the first independent dummy electrodes 549A in the first direction X. Similarly, the plurality of second sub-electrodes 4 are disposed in a state of being sandwiched on both sides by the second independent dummy electrodes 549B in the second direction Y. According to such a configuration, thermal stress generated in the solder layer 802 that is interposed between each of the first sub-electrodes 3 and the circuit board 801 and each of the second sub-electrodes 4 and the circuit board 801 can be further reduced by the independent dummy electrodes 54. Accordingly, the effect of preventing cracks in the solder layer 802 that is interposed between the first sub-electrodes 3 and the circuit board 801 and in the solder layer 802 that is interposed between the second sub-electrodes 4 and the circuit board 801 can be further enhanced compared with the electronic device A30.

In the present modification, the independent dummy electrode recessed part 548 that is recessed from the independent dummy electrode back surface 542 is formed in the independent dummy electrode 54. According to such a configuration, the independent dummy electrode 54 can be prevented from exfoliating from the solder layer 802 by filling the independent dummy electrode recessed part 548 with the solder layer 802.

In the present modification, the inner surface 548A of the independent dummy electrode recessed part 548 has the tip region 548B that is connected to the independent dummy electrode back surface 542. The tip region 548B of the inner surface 548A of the independent dummy electrode recessed part 548 slopes in the thickness direction Z of the electronic element 1, such that the area of a cross-section along a plane that is orthogonal to the thickness direction Z of the electronic element 1 gradually increases as the distance from the independent dummy electrode back surface 542 increases. According to such a configuration, the solder layer 802 is unlikely to come out from the independent dummy electrode recessed part 548. Thus, the independent dummy electrode 54 can be more effectively prevented from exfoliating from the solder layer 802.

The configuration of the present modification may be combined with the configuration of each modification of the first embodiment or the second embodiment.

The present invention is not limited to the foregoing embodiments. Various design modifications can be made to the specific configurations of the respective parts of the present invention. The configuration of the foregoing embodiments and modifications can be combined with each other.

Configurations of the present invention and variations thereof are enumerated below as Appendixes.

APPENDIXES

1A. An electronic device including:
  an electronic element;
  a main electrode on which the electronic element is disposed; and
  a sealing resin covering the electronic element and the main electrode,
  wherein the main electrode has a main electrode front surface on which the electronic element is disposed and a main electrode back surface facing in an opposite direction to the main electrode front surface,
  the main electrode back surface is exposed from the sealing resin, and
  the main electrode back surface has a region that protrudes outside of the main electrode front surface, as seen in a thickness direction of the electronic element.
2A. The electronic device according to Appendix 1A, wherein the main electrode back surface protrudes outside of the main electrode front surface, around an entire periphery of the main electrode, as seen in the thickness direction of the electronic element.
3A. The electronic device according to Appendix 1A or 2A, wherein the main electrode has a main electrode lateral surface connecting the main electrode front surface to the main electrode back surface, and the main electrode lateral surface has a recessed portion that is recessed toward a center of the main electrode.
4A. The electronic device according to Appendix 3A, wherein an end part on the main electrode back surface side of the recessed portion is located outside of the main electrode front surface, as seen in the thickness direction of the electronic element.
5A. The electronic device according to Appendix 3A or 4A, wherein the recessed portion has a region that is located more on a center side of the main electrode than is an end of the main electrode front surface, as seen in the thickness direction.
6A. The electronic device according to any of Appendixes 3A to 5A, wherein the recessed portion is formed around the entire periphery of the main electrode.
7A. The electronic device according to Appendix 3A, wherein a value of surface roughness of the main electrode lateral surface is greater than a value of surface roughness of the main electrode back surface.
8A. The electronic device according to Appendix 7A, wherein a surface area per unit area of the main electrode lateral surface is 1.5 to 2.5 times a surface area per unit area of the main electrode back surface.
9A. The electronic device according to any of Appendixes 3A to 8A, wherein the main electrode lateral surface includes a main upper portion and a main lower portion, and the main upper portion is located more on the main electrode front surface side than the main lower portion in the thickness direction.
10A. The electronic device according to any of Appendixes 3A to 9A, wherein a crack extending in the thickness direction is formed in the sealing resin, the main electrode lateral surface is located more on the main electrode back surface side than an end of the crack on the main electrode back surface side, and the end of the crack on the main electrode back surface side contacts the main electrode lateral surface.
11A. The electronic device according to Appendix 10A, wherein the crack extends starting from an end of the main electrode front surface.
12A. The electronic device according to Appendix 9A, wherein the main upper portion has a recessed shape that is recessed toward the center of the main electrode.
13A. The electronic device according to Appendix 12A, wherein an end part on the main electrode back surface side of the main upper portion is located outside of the main electrode front surface, as seen in the thickness direction of the electronic element.
14A. The electronic device according to Appendix 12A or 13A, wherein the main lower portion slopes in the thickness direction, so as to form an acute angle with the main electrode back surface.
15A. The electronic device according to any of Appendixes 12A to 14A, wherein a size of the main lower portion in the thickness direction is less than a size of the main upper portion in the thickness direction.
16A. The electronic device according to Appendix 9A, wherein the main electrode lateral surface includes a main intermediate portion, the main intermediate portion is located between the main upper portion and the main lower portion in the thickness direction, and the main intermediate portion has a recessed shape that is recessed toward the center of the main electrode.
17A. The electronic device according to Appendix 16A, wherein an end part on the main electrode back surface side of the main intermediate portion is located outside of the main electrode front surface, as seen in the thickness direction of the electronic element.
18A. The electronic device according to Appendix 16A or 17A, wherein the main upper portion slopes in the thickness direction, so as to form an acute angle with the main electrode front surface, and the main lower portion slopes in the thickness direction, so as to form an acute angle with the main electrode back surface.
19A. The electronic device according to any of Appendixes 1A to 18A, wherein the main electrode back surface is flat.

20A. The electronic device according to any of Appendixes 1A to 19A, wherein an area of the electronic element as seen in the thickness direction occupies 80 percent or more of an area of the main electrode surface.

21A. The electronic device according to any of Appendixes 1A to 20A, further including an extended part extending outside the main electrode from the main electrode, as seen in the thickness direction, and a thickness of the extended part is less than the main electrode.

22A. The electronic device according to Appendix 21A, wherein, when the extended part is viewed from the main electrode, the extended part is entirely peripherally surrounded by the sealing resin.

23A. The electronic device according to any of Appendixes 1A to 22A, further including a back surface plating layer, wherein the back surface plating layer has a region formed on the main electrode back surface.

24A. The electronic device according to Appendix 23A, wherein the back surface plating layer is made of Sn.

25A. The electronic device according to any of Appendixes 1A to 24A, further including a front surface plating layer, wherein the front surface plating layer has a region formed on the main electrode front surface.

26A. The electronic device according to Appendix 25A, wherein the front surface plating layer is made of Ag.

27A. The electronic device according to Appendix 1A, further including a plurality of first sub-electrodes arrayed in a first direction and a plurality of second sub-electrodes arrayed in a second direction that is orthogonal to the first direction.

28A. The electronic device according to Appendix 27A, wherein the sealing resin has a resin lateral surface, the plurality of first sub-electrodes are each exposed from the resin lateral surface and have a first sub-electrode outer surface facing in the second direction, and the first sub-electrode outer surface is flush with a region, of the resin lateral surface, facing in the second direction.

29A. The electronic device according to Appendix 28A, wherein a linear mark is formed on the first sub-electrode outer surface.

30A. The electronic device according to Appendix 28A, wherein the plurality of first sub-electrodes each have a first sub-electrode back surface that is exposed from the sealing resin.

31A. The electronic device according to Appendix 30A, wherein the first sub-electrode back surface is flat.

32A. The electronic device according to Appendix 30A or 31A, wherein the plurality of first sub-electrodes each have a first sub-electrode lateral surface that stands erect from the first sub-electrode back surface, the first sub-electrode lateral surface is covered by the sealing resin, and the first sub-electrode lateral surface connects an end part of the first sub-electrode outer surface in the first direction to an end part of the first sub-electrode outer surface on an opposite side to the first direction.

33A. The electronic device according to Appendix 32A, wherein the first sub-electrode lateral surface has a sub-upper portion and a sub-lower portion, and the sub-upper portion of the first sub-electrode lateral surface and the sub-lower portion of the first sub-electrode lateral surface each have a recessed shape that is recessed toward the center of the first sub-electrode.

34A. The electronic device according to any of Appendixes 30A to 33A, wherein the plurality of first sub-electrodes each have a first sub-electrode front surface facing in an opposite direction to the first sub-electrode back surface, and the first sub-electrode front surface is covered by the sealing resin.

35A. The electronic device according to Appendix 27A, further including a plurality of wires, wherein the plurality of wires are each bonded to the electronic element, and the plurality of wires are each bonded to any of the plurality of first sub-electrodes or any of the plurality of second sub-electrodes.

36A. The electronic device according to any of Appendixes 1A to 35A, further including a joining layer interposed between the electronic element and the main electrode.

37A. The electronic device according to Appendix 36A, wherein the joining layer is made of a conductive material.

38A. The electronic device according to Appendix 37A, wherein the joining layer is made of Ag.

39A. The electronic device according to any of Appendixes 36A to 38A, wherein the joining layer has a region that protrudes outside of the electronic element, as seen in the thickness direction.

40A. A mounting structure of an electronic device, including the electronic device according to Appendix 27A, a circuit board, and a solder layer interposed between the circuit board and the plurality of first sub-electrodes and between the circuit board and the plurality of second sub-electrodes.

1B. An electronic device comprising:
  an electronic element;
  a main electrode on which the electronic element is disposed;
  an insulating joining part interposed between the electronic element and the main electrode;
  a plurality of insulating spacers mixed in the joining part; and
  a sealing resin covering the electronic element and the main electrode.

2B. The electronic device according to Appendix 1B, wherein the plurality of spacers each directly contact the electronic element.

3B. The electronic device according to Appendix 1B or 2B, wherein the plurality of spacers each directly contact the main electrode.

4B. The electronic device according to Appendix 1B or 2B, further including a front surface plating layer, wherein the front surface plating layer has a region formed on the main electrode, and the plurality of spacers each directly contact the front surface plating layer.

5B. The electronic device according to any of Appendixes 1B to 4B, wherein the plurality of spacers all have a spherical shape.

6B. The electronic device according to Appendix 5B, wherein a diameter of each of the plurality of spacers is 5 to 15 μm.

7B. The electronic device according to any of Appendixes 1B to 6B, wherein the plurality of spacers are made of a divinylbenzene polymer.

8B. The electronic device according to any of Appendixes 1B to 7B, wherein the plurality of spacers are dispersed, as seen in the thickness direction of the electronic element.

9B. The electronic device according to any of Appendixes 1B to 8B, wherein the plurality of spacers number ten or more.

10B. The electronic device according to any of Appendixes 1B to 9B, further including a plurality of insulating fillers mixed in the joining part.

11B. The electronic device according to Appendix 10B, wherein a volume of each of the plurality of fillers is less than a volume of each of the plurality of spacers.

12B. The electronic device according to Appendix 11B, wherein the plurality of fillers all have a spherical shape.

13B. The electronic device according to Appendix 12B, wherein a diameter of each of the plurality of fillers is 1 to 3 μm.

14B. The electronic device according to any of Appendixes 10B to 13B, wherein the plurality of fillers are made of $SiO_2$, an organic material, or a mixed material of an organic material and a non-organic material.

15B. The electronic device according to any of Appendixes 10B to 14B, wherein the plurality of fillers are dispersed, as seen in the thickness direction of the electronic element.

16B. The electronic device according to any of Appendixes 10B to 15B, wherein the plurality of fillers number ten or more.

17B. The electronic device according to any of Appendixes 10B to 16B, wherein a portion of the plurality of fillers are exposed from the joining part and contact the sealing resin.

18B. The electronic device according to Appendix 1B, wherein the main electrode has a main electrode front surface on which the electronic element is disposed and a main electrode back surface facing in an opposite direction to the main electrode front surface, and the main electrode back surface is exposed from the sealing resin.

19B. The electronic device according to any of Appendixs 1B to 18B, further including a second electronic element, where the electronic element is taken as a first electronic element, wherein the second electronic element is disposed on the main electrode.

20B. The electronic device according to Appendix 19B, further including a joining layer interposed between the second electronic element and the main electrode.

21B. The electronic device according to Appendix 20B, wherein the joining layer is made of a conductive material.

22B. The electronic device according to Appendix 21B, wherein the joining layer is made of Ag.

23B. The electronic device according to any of Appendixes 19B to 22B, further including a plurality of first sub-electrodes arrayed in a first direction and a plurality of second sub-electrodes arrayed in a second direction that is orthogonal to the first direction.

24B. The electronic device according to Appendix 23B, wherein the sealing resin has a resin lateral surface, the plurality of first sub-electrodes are each exposed from the resin lateral surface and have a first sub-electrode outer surface facing in the second direction, and the first sub-electrode outer surface is flush with a region, of the resin lateral surface, facing in the second direction.

25B. The electronic device according to Appendix 24B, wherein a linear mark is formed on the first sub-electrode outer surface.

26B. The electronic device according to Appendix 24B, wherein the plurality of first sub-electrodes each have a first sub-electrode back surface that is exposed from the sealing resin.

27B. The electronic device according to Appendix 26B, wherein the first sub-electrode back surface is flat.

28B. The electronic device according to Appendix 26B or 27B, wherein the plurality of first sub-electrodes each have a first sub-electrode lateral surface that stands erect from the first sub-electrode back surface, the first sub-electrode lateral surface is covered by the sealing resin, and the first sub-electrode lateral surface connects an end part of the first sub-electrode outer surface in the first direction to an end part of the first sub-electrode outer surface on an opposite side to the first direction.

29B. The electronic device according to Appendix 28B, wherein the first sub-electrode lateral surface has a sub-upper portion and a sub-lower portion, and the sub-upper portion of the first sub-electrode lateral surface and the sub-lower portion of the first sub-electrode lateral surface each have a recessed shape that is recessed toward the center of the first sub-electrode.

30B. The electronic device according to any of Appendixes 26B to 29B, wherein the plurality of first sub-electrodes each have a first sub-electrode front surface facing in an opposite direction to the first sub-electrode back surface, and the first sub-electrode front surface is covered by the sealing resin.

31B. The electronic device according to Appendix 23B, further includes a plurality of wires, any of the plurality of wires is bonded to the first electronic element or the second electronic element, and any of the plurality of wires is bonded to any of the plurality of first sub-electrodes or any of the plurality of second sub-electrodes.

32B. A mounting structure of an electronic device including the electronic device according to Appendix 23B, a circuit board, and a solder layer interposed between the circuit board and the plurality of first sub-electrodes and between the circuit board and the plurality of second sub-electrodes.

The invention claimed is:

1. An electronic device comprising:
   a main electrode having a front surface and a back surface that are spaced apart from each other in a thickness direction;
   an electronic element supported by the front surface of the main electrode; and
   a sealing resin covering the electronic element and the main electrode,
   wherein the back surface of the main electrode is exposed from the sealing resin, and
   the back surface of the main electrode includes a region that protrudes outside of the front surface of the main electrode as seen in the thickness direction.

2. The electronic device according to claim 1, wherein the back surface of the main electrode protrudes outside of the front surface of the main electrode, as seen in the thickness direction, around an entire periphery of the main electrode.

3. The electronic device according to claim 1, wherein the main electrode has a lateral surface connecting the front surface of the main electrode to the back surface of the main electrode, and the lateral surface of the main electrode has a recessed portion that is recessed toward a center of the main electrode.

4. The electronic device according to claim 3, wherein the recessed portion has an end part closer to the back surface of the main electrode than to the front surface thereof, said end part being located outside of the front surface of the main electrode as seen in the thickness direction.

5. The electronic device according to claim 3, wherein the recessed portion includes a region located closer to the center of the main electrode than is an end of the front surface of the main electrode as seen in the thickness direction.

6. The electronic device according to claim 3, wherein the recessed portion is formed around an entire periphery of the main electrode.

7. The electronic device according to claim 3, wherein the lateral surface of the main electrode is greater in surface roughness than the back surface of the main electrode.

8. The electronic device according to claim 7, wherein a surface area per unit region of the lateral surface of the main electrode is 1.5 to 2.5 times a surface area per unit region of the back surface of the main electrode.

9. The electronic device according to claim 3, wherein the lateral surface of the main electrode includes an upper portion and a lower portion, and the upper portion is located closer to the front surface of the main electrode than is the lower portion thereof in the thickness direction.

10. The electronic device according to claim 9, wherein the upper portion has a recessed shape that is recessed toward the center of the main electrode.

11. The electronic device according to claim 10, wherein the upper portion has an end that is closer to the back surface of the main electrode than to the front surface of the main electrode, and the end of the upper portion is located outside of the front surface of the main electrode as seen in the thickness direction.

12. The electronic device according to claim 10, wherein the lower portion slopes relative to the thickness direction so as to form an acute angle with the back surface of the main electrode.

13. The electronic device according to claim 10, wherein the lower portion is smaller in size measured in the thickness direction than the upper portion.

14. The electronic device according to claim 9, wherein the lateral surface of the main electrode includes an intermediate portion located between the upper portion and the lower portion in the thickness direction, and the intermediate portion has a recessed shape that is recessed toward the center of the main electrode.

15. The electronic device according to claim 14, wherein the intermediate portion has an end closer to the back surface of the main electrode than to the front surface of the main electrode, and the end of the intermediate portion is located outside of the front surface of the main electrode as seen in the thickness direction.

16. The electronic device according to claim 14, wherein the upper portion slopes relative to the thickness direction so as to form an acute angle with the front surface of the main electrode, and the lower portion slopes relative to the thickness direction so as to form an acute angle with the back surface of the main electrode.

17. The electronic device according to claim 3, wherein the sealing resin is formed with a crack having a first end and a second end that are spaced apart from each other in the thickness direction, the first end is closer to the back surface of the main electrode than is the second end, and the first end is in contact with the lateral surface of the main electrode.

18. The electronic device according to claim 17, wherein the second end of the crack is at an end of the front surface of the main electrode.

19. The electronic device according to claim 1, wherein the back surface of the main electrode is flat.

20. The electronic device according to claim 1, wherein the electronic element, as seen in the thickness direction, occupies at least 80 percent in area of the front surface of the main electrode.

21. The electronic device according to claim 1, further comprising an extended part extending outward from the main electrode, and the extended part is smaller in thickness than the main electrode.

22. The electronic device according to claim 21, wherein the extended part is entirely surrounded by the sealing resin as seen in a cross-sectional view of the extended part in the thickness direction.

23. The electronic device according to claim 1, further comprising a plating layer having a region formed on the back surface of the main electrode.

24. The electronic device according to claim 23, wherein the plating layer is made of Sn.

25. The electronic device according to claim 1, further comprising a plating layer having a region formed on the front surface of the main electrode.

26. The electronic device according to claim 25, wherein the plating layer is made of Ag.

27. The electronic device according to claim 1, further comprising first sub-electrodes and second sub-electrodes, wherein the first sub-electrodes are arranged along a first direction perpendicular to the thickness direction, and the second sub-electrodes are arranged along a second direction perpendicular to the thickness direction and the first direction.

28. The electronic device according to claim 27, wherein the sealing resin has a lateral surface, and each of the first sub-electrodes has an outer surface that faces in the second direction and is flush with the lateral surface of the sealing resin.

29. The electronic device according to claim 28, wherein each of the first sub-electrodes has a back surface that is exposed from the sealing resin.

30. The electronic device according to claim 29, wherein the back surface of each of the first sub-electrodes is flat.

31. The electronic device according to claim 29, wherein each of the first sub-electrodes has a lateral surface standing erect from the back surface of said each of the first sub-electrodes and being covered by the sealing resin, and the lateral surface connects a first end and a second end of the outer surface of said each of the first sub-electrodes to each other,
the first end and the second end of the outer surface being opposite to each other in the first direction.

32. The electronic device according to claim 31, wherein the lateral surface of each of the first sub-electrodes includes a sub-upper portion and a sub-lower portion each of which has a recessed shape that is recessed toward a center of the first sub-electrode.

33. The electronic device according to claim 29, wherein each of the first sub-electrodes has a front surface that is opposite to the back surface of said each of the first sub-electrodes and covered by the sealing resin.

34. The electronic device according to claim 27, wherein the outer surface of each of the first sub-electrodes is formed with a linear mark.

35. The electronic device according to claim 27, further comprising wires each having a first end and a second end, wherein the first end of each wire is bonded to the electronic element, and the second end of said each wire is bonded to one of the first sub-electrodes or one of the second sub-electrodes.

36. A mounting structure comprising:
an electronic device in accordance with claim 27;
a circuit board; and
a solder layer disposed between the circuit board and the first sub-electrodes or the second sub-electrodes.

37. The electronic device according to claim 1, further comprising a joining layer disposed between the electronic element and the main electrode.

38. The electronic device according to claim 37, wherein the joining layer is made of a conductive material.

39. The electronic device according to claim 37, wherein the joining layer comprises Ag.

40. The electronic device according to claim 37, wherein the joining layer includes a region that protrudes outside of the electronic element as seen in the thickness direction.

* * * * *